US012744088B2

(12) United States Patent
Tseng et al.

(10) Patent No.: US 12,744,088 B2
(45) Date of Patent: Sep. 22, 2026

(54) MEMORY DEVICE AND OPERATION METHOD APPLIED FOR DATA SEARCH

(71) Applicant: MACRONIX INTERNATIONAL CO., LTD., Hsinchu (TW)

(72) Inventors: Po-Hao Tseng, Taichung City (TW); Feng-Min Lee, Hsinchu City (TW); Yu-Hsuan Lin, Taichung City (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 209 days.

(21) Appl. No.: 18/750,178

(22) Filed: Jun. 21, 2024

(65) Prior Publication Data

US 2024/0355394 A1 Oct. 24, 2024

Related U.S. Application Data

(63) Continuation-in-part of application No. 17/558,673, filed on Dec. 22, 2021, now abandoned.

(51) Int. Cl.
*G11C 16/10* (2006.01)
*G11C 16/04* (2006.01)
(Continued)

(52) U.S. Cl.
CPC ........ *G11C 16/102* (2013.01); *G11C 16/0483* (2013.01); *G11C 16/08* (2013.01); *G11C 16/24* (2013.01); *G11C 16/26* (2013.01)

(58) Field of Classification Search
CPC ....... G11C 16/102; G11C 16/08; G11C 16/26; G11C 15/046; G11C 16/0483; G11C 16/24
See application file for complete search history.

(56) References Cited

U.S. PATENT DOCUMENTS 5,388,065 A 2/1995 Yoneda
6,317,349 B1 11/2001 Wong
(Continued)

FOREIGN PATENT DOCUMENTS

CN 111341365 A 6/2020
CN 112712843 A 4/2021
(Continued)

*Primary Examiner* — Alexander Sofocleous
*Assistant Examiner* — Joseph Fidelis Stormes
(74) *Attorney, Agent, or Firm* — McClure, Qualey & Rodack, LLP

(57) ABSTRACT

A memory device and associated operation method are provided. The operation method is applied to the memory device to determine whether a search input and in-memory data are matched. The memory device includes a memory array and a control circuit, and the memory array includes M*N memory cells. The operation method includes the following steps. A select voltage is applied to an n-th word line. A pass-through voltage is applied to (N−1) word lines. A first search voltage is applied to an m-th first bit-line, and a second search voltage is applied to an m-th second bit-line. An m-th first sensing current and an m-th second sensing current bit are selectively generated. Then, a sensing circuit in the control circuit generates a sensing circuit output. The sensing circuit output represents whether the m-th first sensing current and the m-th second sensing current are generated.

20 Claims, 26 Drawing Sheets

(51) Int. Cl.

| | |
|---|---|
| ***G11C 16/08*** | (2006.01) |
| ***G11C 16/24*** | (2006.01) |
| ***G11C 16/26*** | (2006.01) |

(56) References Cited

U.S. PATENT DOCUMENTS

| | | | | |
|---|---|---|---|---|
| 6,560,670 | B1 | 5/2003 | Ichiriu | |
| 6,944,038 | B2 * | 9/2005 | de Sandre ............ | G11C 15/046 365/49.17 |
| 7,821,844 | B2 | 10/2010 | Srinivasan | |
| 7,924,589 | B1 | 4/2011 | Srinivasan | |
| 8,169,808 | B2 | 5/2012 | Roohparvar | |
| 9,548,120 | B2 | 1/2017 | Roohparvar | |
| 10,622,064 | B2 | 4/2020 | Taha | |
| 10,847,224 | B1 | 11/2020 | Li et al. | |
| 10,943,655 | B2 | 3/2021 | Lu | |
| 2012/0230116 | A1 * | 9/2012 | Goda ..................... | G11C 16/10 365/185.25 |
| 2018/0241621 | A1 | 8/2018 | Vaishnavi | |
| 2019/0394229 | A1 | 12/2019 | George | |
| 2020/0258587 | A1 * | 8/2020 | Li ........................ | G11C 15/046 |

FOREIGN PATENT DOCUMENTS

| | | | |
|---|---|---|---|
| KR | 1020040092194 | A | 11/2004 |
| TW | 202141480 | A | 11/2021 |

* cited by examiner

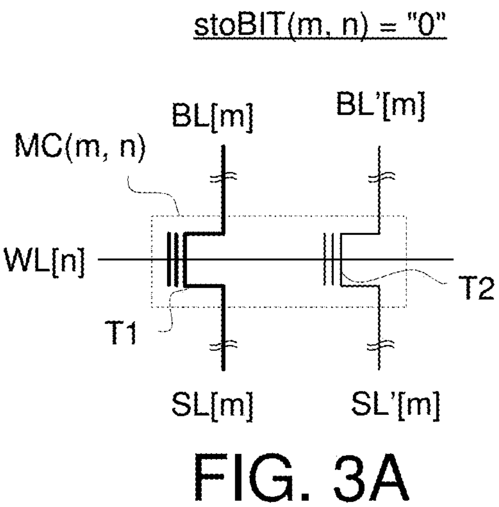
FIG. 3A
stoBIT(m, n) = "1"
BL[m]
BL'[m]
MC(m, n)
WL[n]
T2
T1
SL[m]
SL'[m]
FIG. 3B
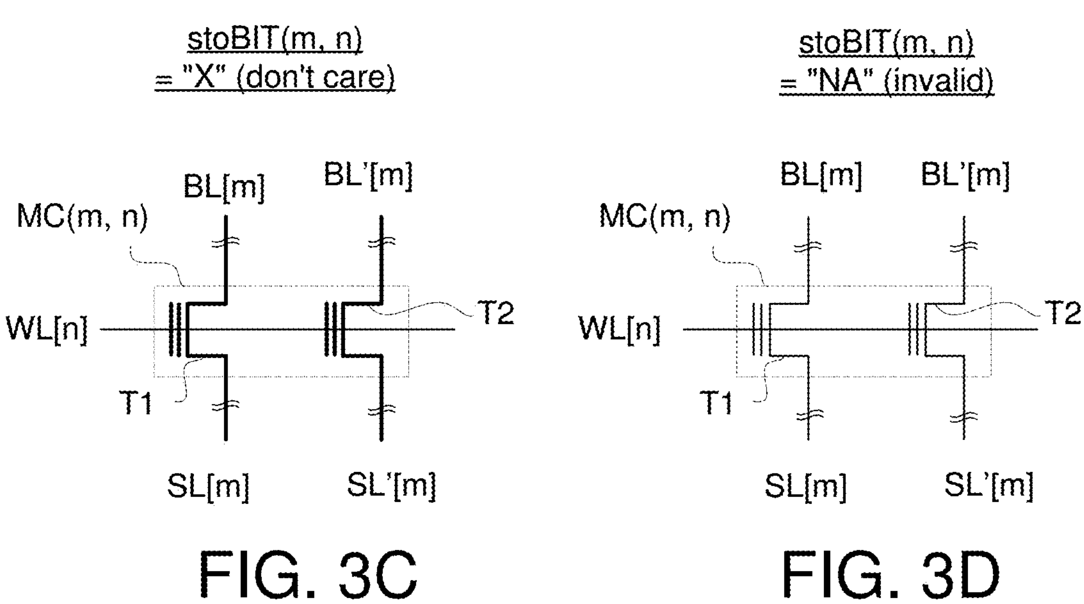
FIG. 3C
FIG. 3D

MEMORY DEVICE AND OPERATION METHOD APPLIED FOR DATA SEARCH

This is a continuation-in-part of U.S. application Ser. No. 17/558,673, filed Dec. 22, 2021 (now abandoned).

TECHNICAL FIELD

The disclosure relates in general to a memory device and an operation method, and more particularly to a memory device and an operation method applied for data search.

BACKGROUND

The traditional operation method for NAND-type ternary content addressable memory (TCAM) uses word lines as search lines. In this way, the allowable length of data is limited by the quantity of the word lines. In the present processing technique of TCAM, the quantity of the word lines is generally much less than the bit-lines. This may cause the conventional operation method for TCAM to have difficulty dealing with the increasing data length. These data could be images with high resolution and floating point values with high precision.

SUMMARY

The disclosure is directed to a ternary content addressable memory device and an operation method thereof.

According to one embodiment, a memory device is provided. The memory device includes a memory array, M first bit-lines, M second bit-lines, M first source lines, M second source lines, N word lines, and a control circuit. The memory array includes M*N memory cells. A memory cell among the M*N memory cells is located at an m-th column and n-th row, and the memory cell includes a first transistor and a second transistor. An m-th first bit-line among the M first bit-lines is electrically connected to a first terminal of the first transistor, and a first search voltage is applied to the m-th first bit-line. An m-th second bit-line among the M second bit-lines is electrically connected to a first terminal of the second transistor, and a second search voltage is applied to the m-th second bit-line. An m-th first source line among the M first source lines is electrically connected to a second terminal of the first transistor, and an m-th first sensing current is selectively generated in response to the first search voltage and a threshold voltage of the first transistor. An m-th second source line among the M second source lines is electrically connected to a second terminal of the second transistor, and an m-th second sensing current is selectively generated in response to the second search voltage and a threshold voltage of the second transistor. Control terminals of the first transistor and the second transistor are electrically connected to an n-th word line among the N word lines, a select voltage is applied to the n-th word line, and a pass-through voltage is applied to other (N−1) word lines among the N word lines. The control circuit is electrically connected to the memory array through the M first bit-lines, the M second bit-lines, the M first source lines, the M second source lines, and the N word lines. The control circuit includes a sensing circuit. The sensing circuit is configured to receive the m-th first sensing current through the m-th first source line, receive the m-th second sensing current through the m-th second source line, and generate a sensing circuit output representing whether the m-th first sensing current and the m-th second sensing current are generated. M, N, m, and n are positive integers, m is smaller than or equivalent to M, and n is smaller than or equivalent to N.

According to another embodiment, an operation method is applied to a memory device. The memory device includes a memory array and a control circuit, and the memory array includes M*N memory cells. The memory array is electrically connected to the control circuit through M first bit-lines, M second bit-lines, M first source lines, M second source lines, and N word lines, and a memory cell among the M*N memory cells comprises a first transistor and a second transistor. The operation method includes the following steps. A select voltage is applied to an n-th word line among the N word lines, wherein control terminals of the first transistor and a second transistor are electrically connected to the n-th word line. A pass-through voltage is applied to other (N−1) word lines among the N word lines. A first search voltage is applied to an m-th first bit-line, wherein an m-th first sensing current is selectively generated in response to the first search voltage and a threshold voltage of the first transistor. A second search voltage is applied to an m-th second bit-line, wherein an m-th second sensing current is selectively generated in response to the second search voltage and a threshold voltage of the second transistor. The m-th first sensing current is received through the m-th first source line and the m-th second sensing current is received through the m-th second source line. A sensing circuit output is generated based on the m-th first sensing current and the m-th second sensing current.

BRIEF DESCRIPTION OF THE DRAWINGS

FIGS. 3A~3D are schematic diagrams illustrating how the threshold voltages V_th1, V_th2 of the transistors T1, T2 in the memory cell MC(m, n) are programmed to represent the m-th in-memory bit stoBIT(m, n).

Figure 12:
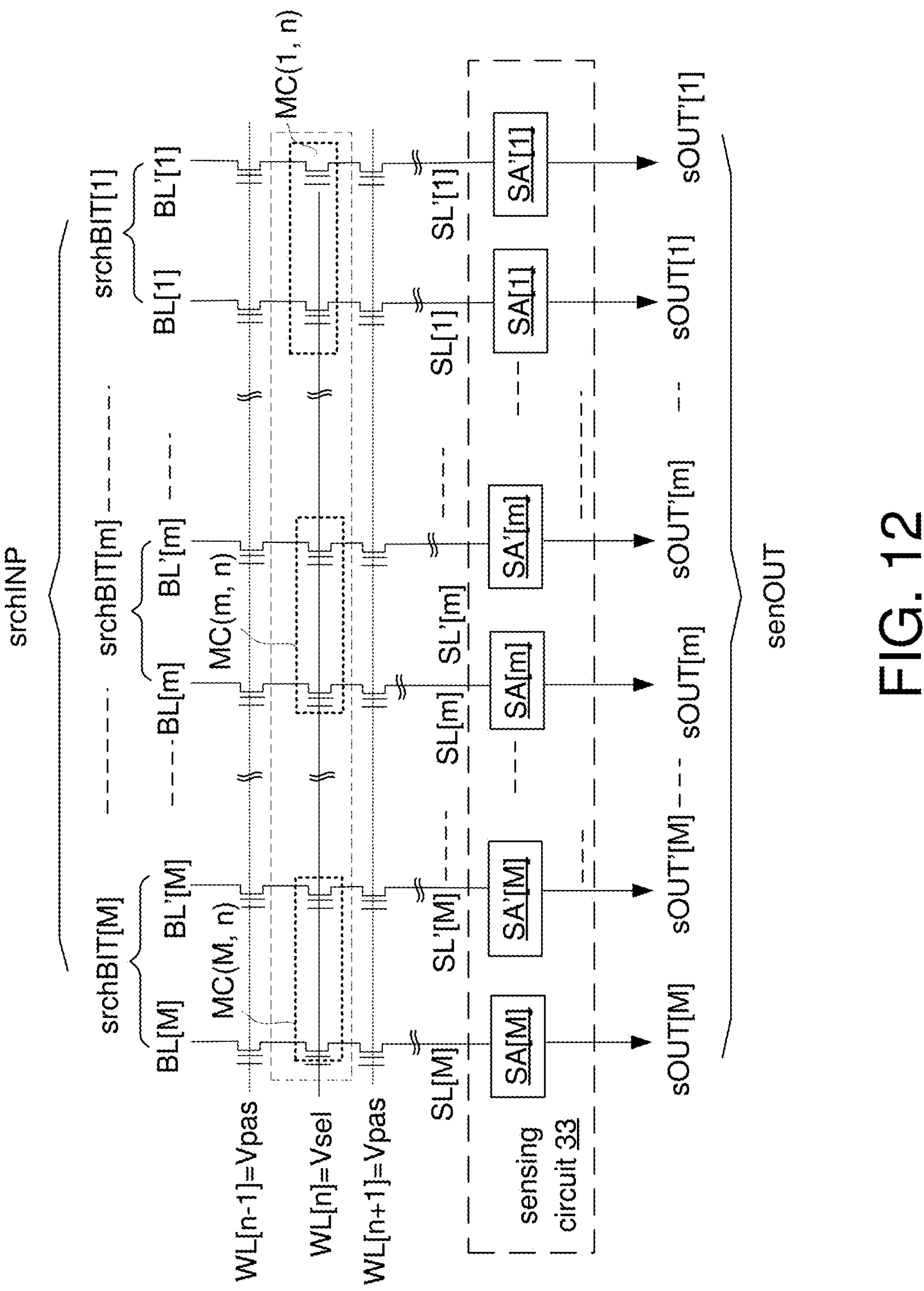

FIG. 12 is a schematic diagram illustrating the sensing circuit according to another embodiment of the present disclosure that includes M first sensing-units SA[1]~SA[M] and M second sensing-units SA'[1]~SA'[M] for converting the selectively generated first sensing current(s) $I_{SL}$[1]~$I_{SL}$[M] and the selectively generated second sensing current(s) $I_{SL'}$[1]~$I_{SL'}$[m] to M first comparison output signals cmpOP[1]~cmpO'P[M] and M second comparison output signals cmpOP[1]~cmpOP'[M].

Figure 13:
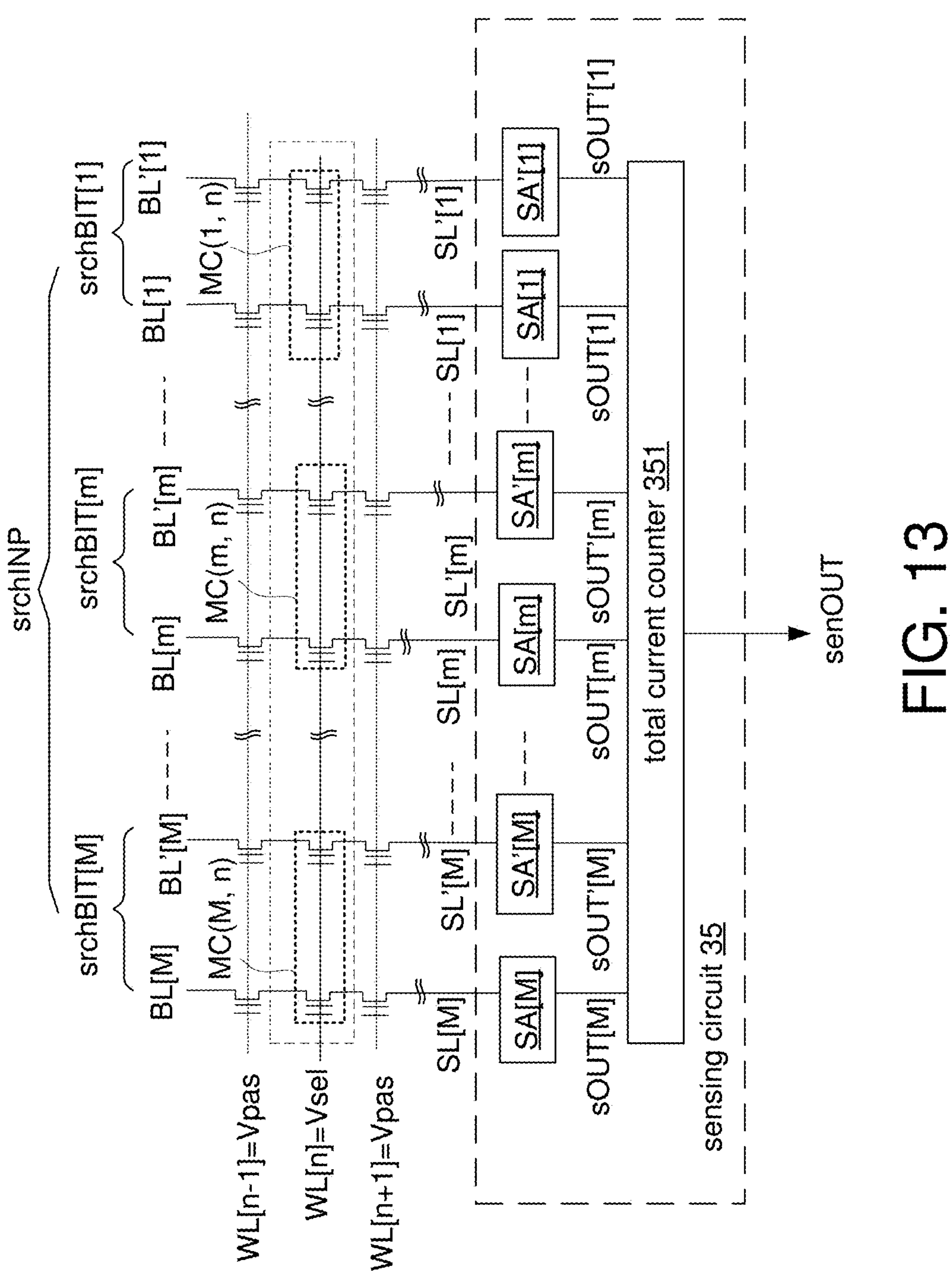

FIG. 13 is a schematic diagram illustrating the sensing circuit according to another embodiment of the present disclosure that includes M first sensing-units SA[1]~SA[M], M second sensing-units SA'[1]~SA'[M], and a current counter dCNT for converting the selectively generated first sensing current(s) $I_{SL}$[1]~$I_{SL}$[M] and the selectively generated second sensing current(s) $I_{SL'}$[1]~$I_{SL'}$[m] to a counting value representing the comparison result cmpRlt_CNT, cmpRLT_CNT[1]~cmpRLT_CNT[K].

Figure 14:
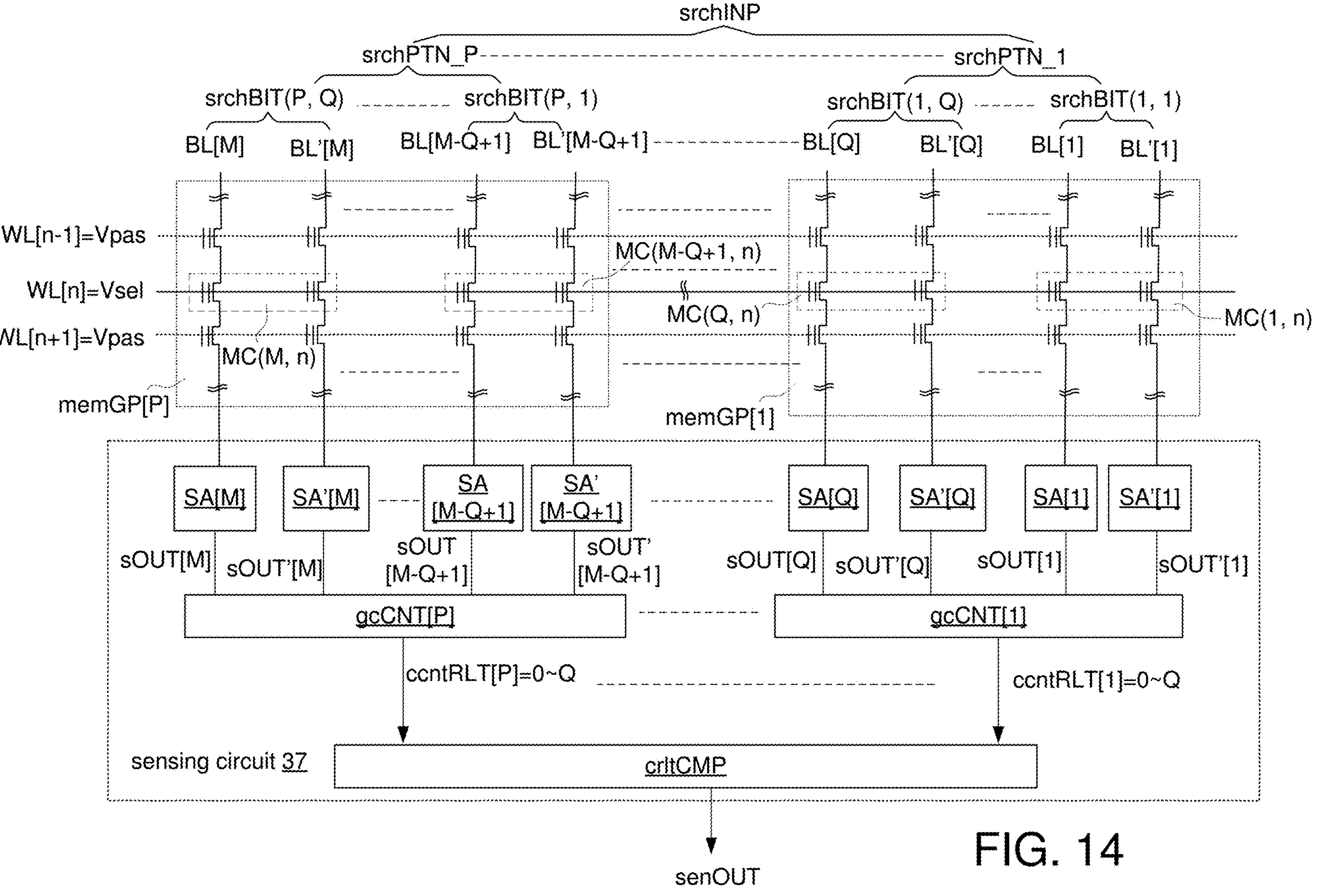

FIG. 14 is a schematic diagram illustrating that the sensing circuit generates P counting outputs simultaneously.

Figure 15:
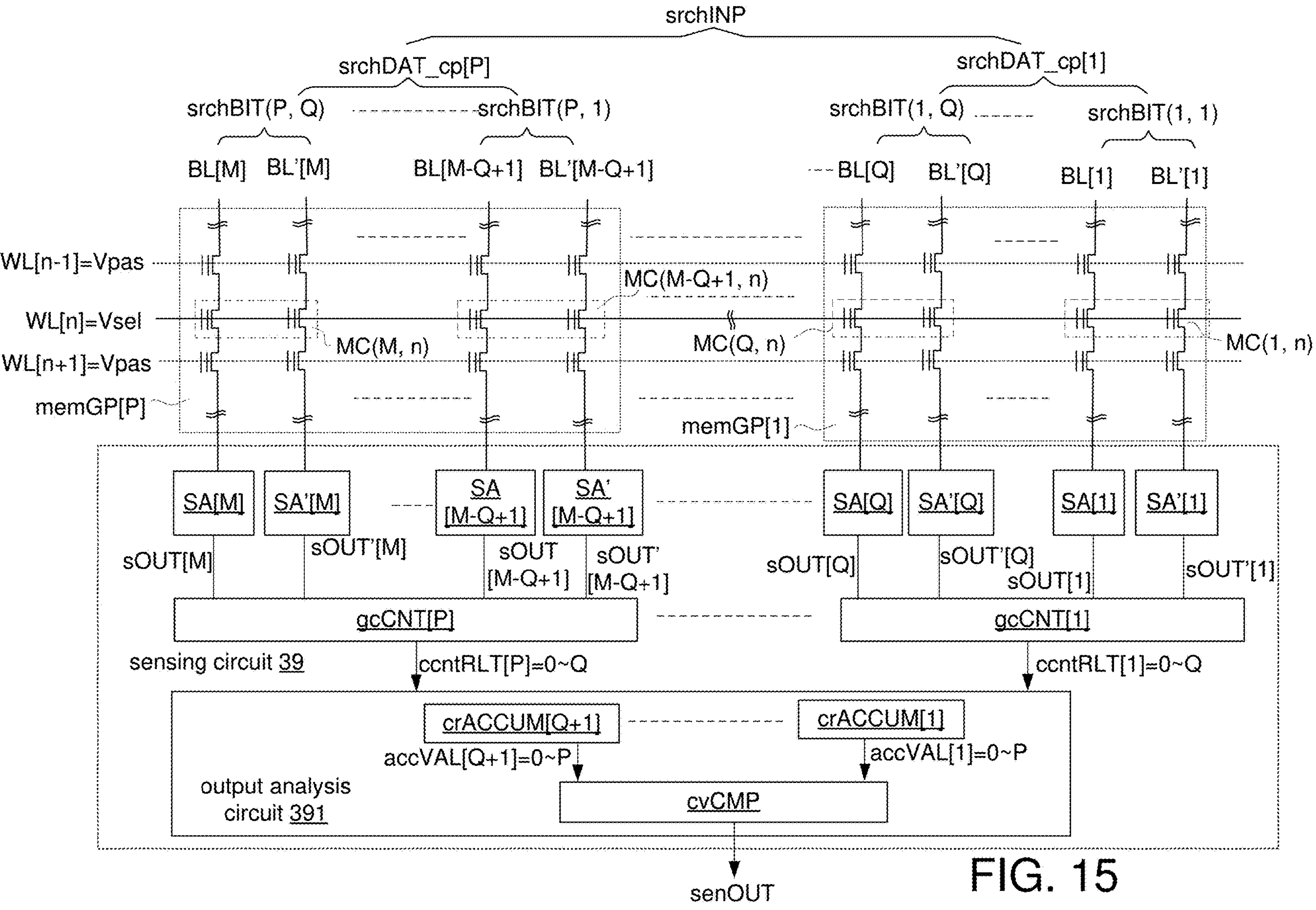

FIG. 15 is a schematic diagram illustrating that the memory device performs P comparisons to P copies of the search data srchDAT_cp1~srchDAT_cpP simultaneously.

Figure 16A:
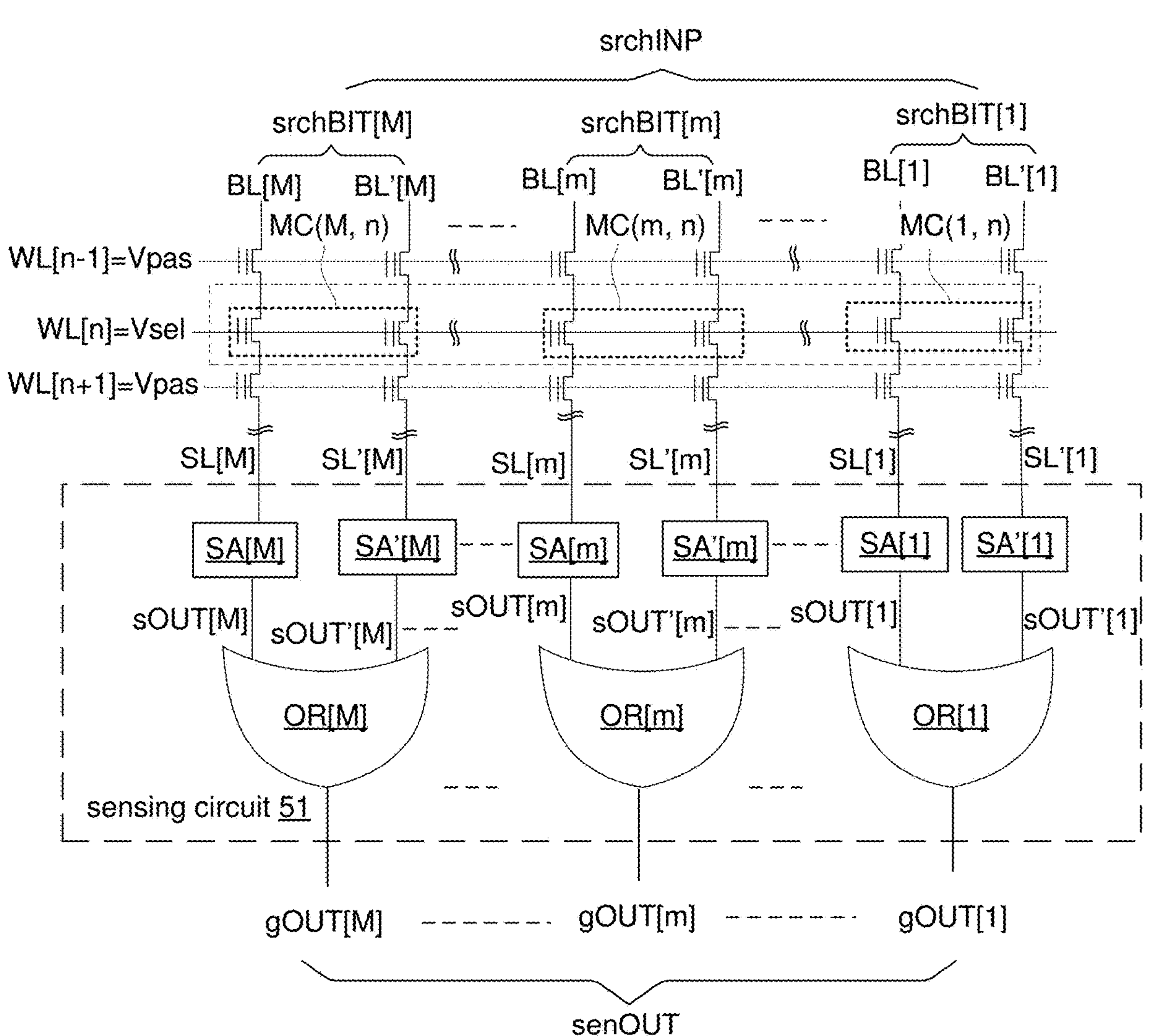
Figure 16B:
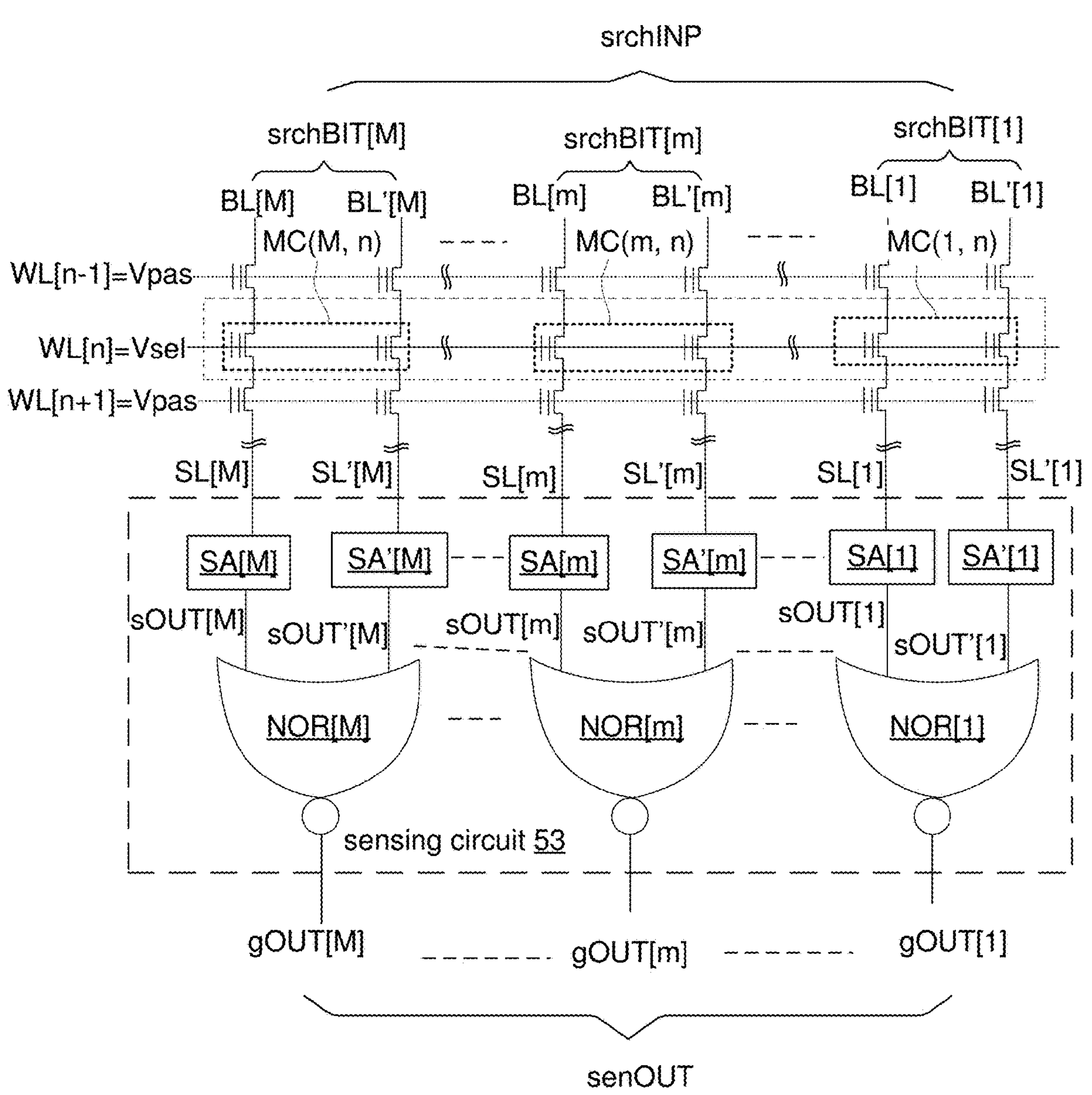

FIGS. 16A and 16B are schematic diagrams illustrating the sensing circuits according to still another embodiment of the present disclosure that includes M*2 sensing-units SA[1]~SA[M], SA'[1]~SA'[M], and M logic gates (OR logic gates OR[1]~OR[M], NOR logic gates NOR[1]~NOR[M]) for converting the selectively generated first sensing current(s) $I_{SL}$[1]~$I_{SL}$[M] and the selectively generated second sensing current(s) $I_{SL'}$[1]~$I_{SL'}$[m] to the comparison result data cpRlt_DAT.

Figure 17:
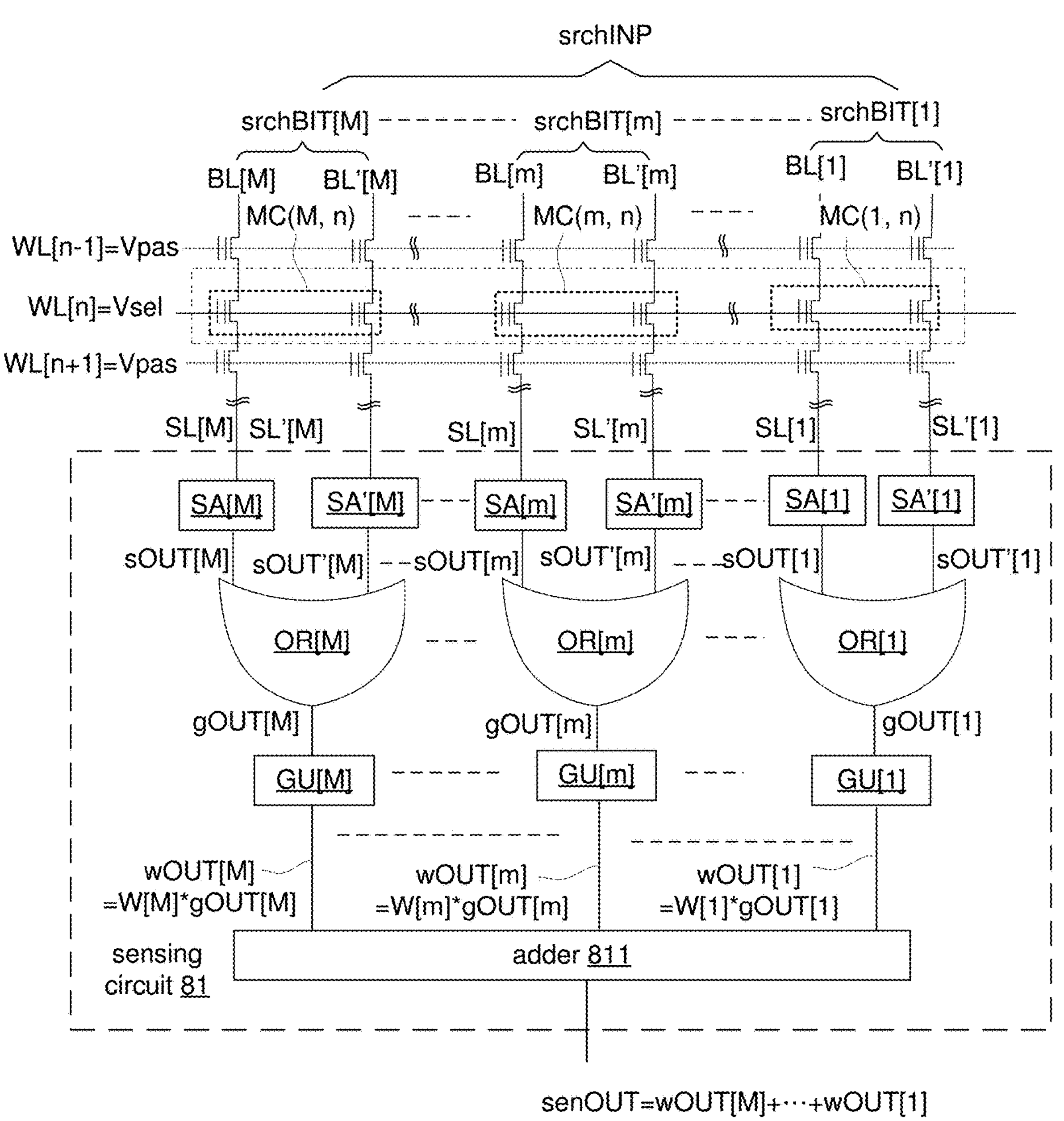

FIG. 17 is a schematic diagram illustrating the sensing circuits according to still another embodiment of the present disclosure that includes M first sensing-units SA[1]~SA[M], M second sensing-units SA'[1]~SA'[M], M logic gates, and M gain units GU[1]~GU[M].

Figure 18:
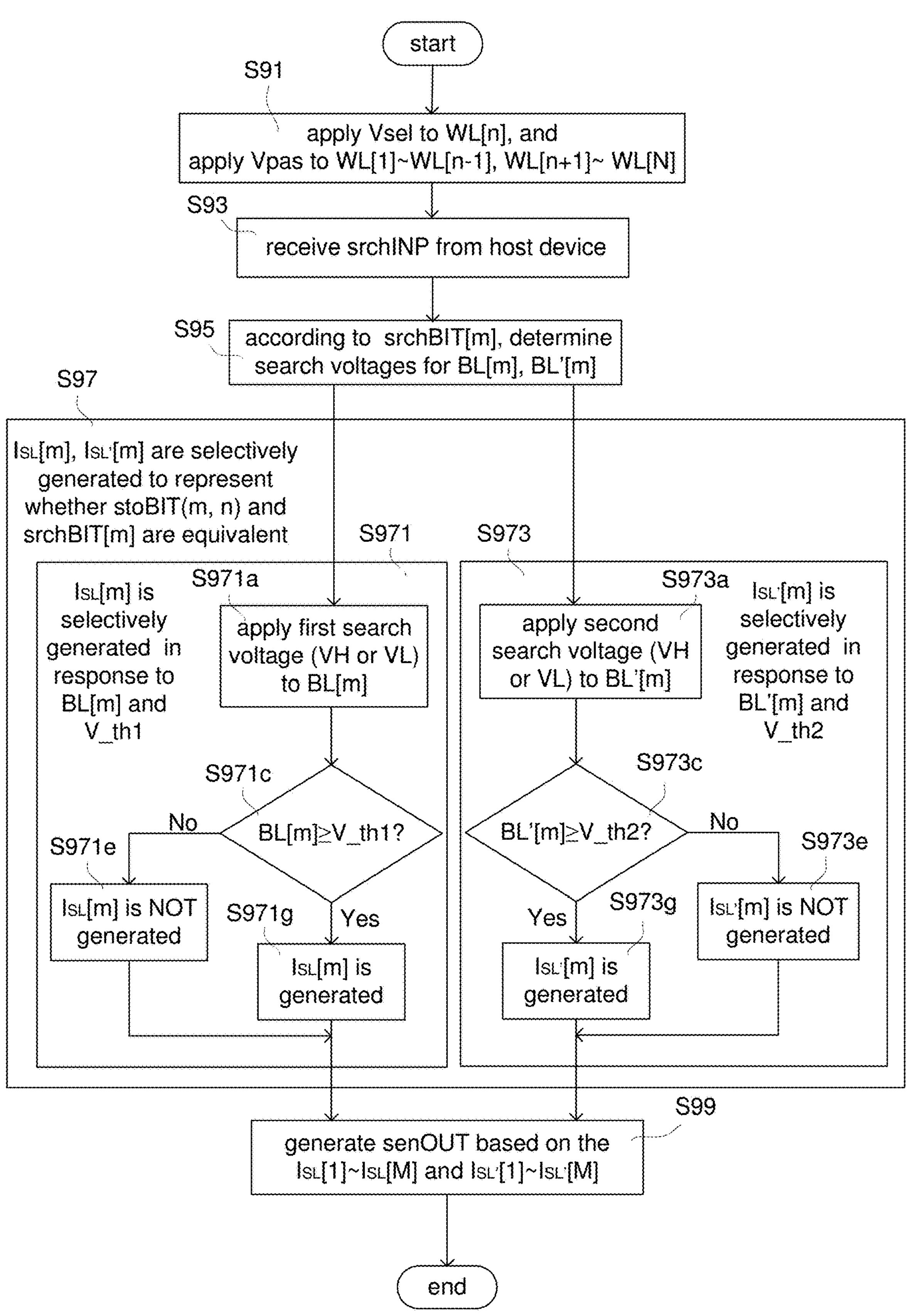

FIG. 18 is a flow diagram illustrating the operation method performed on the memory device according to the embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 1:
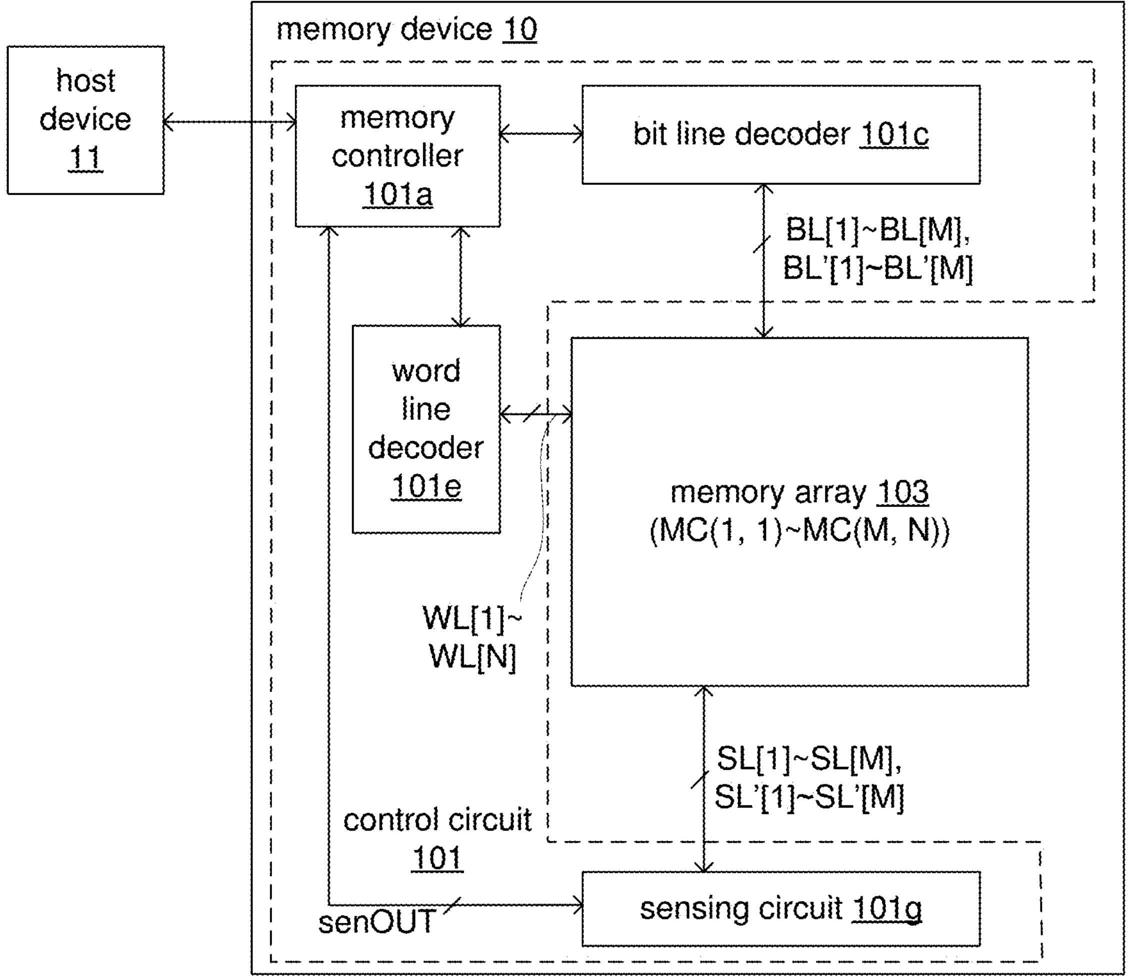
FIG. 1 is a block diagram illustrating a memory device according to an embodiment of the present disclosure.

FIG. 1 is a block diagram illustrating the memory device according to an embodiment of the present disclosure. Memory device 10 performs different operations in response to the command sent from the host device 11. The command can be a read command, a write (programming) command, an erase command, and so forth.

The memory device 10 includes a control circuit 101 and a memory array 103. The memory array 103 can be, for example, a ternary content addressable memory (TCAM) array. In practical applications, the memory array 103 can be implemented with the floating gate memory, SONOS memory, floating dot memory, and different types of emerging memories (FeRAM, ReRAM, PCM, CBRAM, etc). Besides, the structure of the memory array 103 can be a 2D flash structure or a 3D flash structure.

Figure 2:
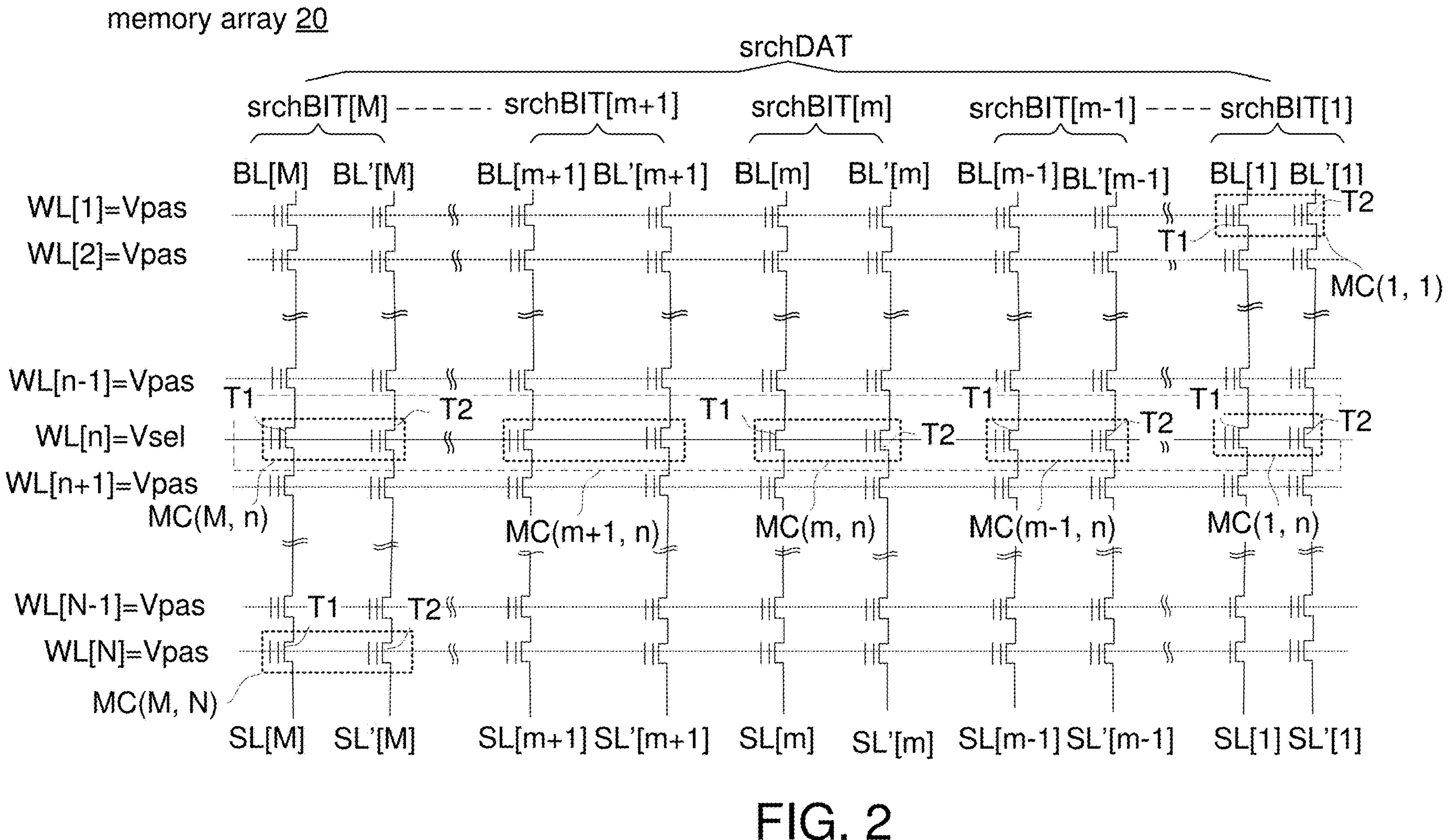
FIG. 2 is a schematic diagram illustrating a memory array according to an embodiment of the present disclosure.

The memory array 103 includes M*N memory cells MC(1, 1)~MC(M, N). The memory cells MC(1, 1)~MC(M, N) are arranged in M columns and N rows. The N memory cells MC(m, 1)~MC(m, N) located at the m-th column are defined as an m-th memory string strgM[m]. The variables M, N are positive integers. Moreover, M is much greater than N. The M memory cells MC(1, n)~MC(M, n) located in the same row (for example, an n-th row) are defined as a page of memory cells. The variable n is a positive integer, and n≤N. The internal design of the memory cells MC(1, 1)~MC(M, N) and their connections are further illustrated in FIG. 2. In FIG. 2, a NAND flash-based memory array is shown.

The control circuit 101 includes a memory controller 101*a*, a bit-line decoder 101*c*, a word line decoder 101*e*, and a sensing circuit 101*g*. The memory controller 101*a* is electrically connected to the host device 11, the bit-line decoder 101*c*, a word line decoder 101*e*, and the sensing circuit 101*g*.

Memory controller 101*a* can be considered a bridge component between the host device 11 and other components in control circuit 101. Detailed illustrations regarding the interactions between the memory controller 101*a* and the host device 11, the bit-line decoder 101*c*, the word line decoder 101*e*, and the sensing circuit 101g are omitted.

The word line decoder 101*e* is electrically connected to the memory array 103 through N word lines WL[1]~WL[N]. The memory controller 101*a* utilizes the word line decoder 101*e* to select the memory cells MC(1, n)~MC(M, n) located on the n-th row. When the memory controller 101*a* accesses the M memory cells MC(1, n)~MC(M, n) located on the n-th row, the n-th word line WL[n] is applied with a select voltage Vsel, and the other (N−1) word lines WL[1]~WL[n−1], WL[n+1]~WL[N] are applied with a pass-through voltage Vpas.

The bit-line decoder 101*c* is electrically connected to the memory array 103 through M first bit-lines BL[1]~BL[M] and M second bit-lines BL'[1]~BL'[M]. The memory controller 101*a* utilizes the bit-line decoder 101*c* to apply different search voltages to the first bit-lines BL[1]~BL[M] and the second bit-lines BL'[1]~BL'[M]. The m-th first bit-line BL[m] and the m-th second bit-line BL'[m] correspond to the m-th bit-position. The sensing circuit 101*g* is electrically connected to the memory array 103 through M first source lines SL [1]~SL [M] and M second source lines SL'[1]~SL'[M]. The m-th first source-line SL [m] and the m-th second source-line SL'[m] correspond to the m-th bit-position.

The memory controller 101*a* applies M first search voltages and M second search voltages, in accordance with a search input srchINP, to the first bit-lines BL[1]~BL[M] and the second bit-lines BL'[1]~BL'[M]. The memory cells MC(1, 1)~MC(M, N) are programmed in advance to store N in-memory data stoDAT[1]~stoDAT[N] in N rows. As the programming is related to the write operation of the memory array, details are omitted.

When the search input srchINP is compared with the in-memory data stoDAT[n] stored at the memory cells MC(1, n)~MC(M, n) located at the n-th row, there might be or might not be the first/second sensing currents $I_{SL}$[1]~$I_{SL}$[M], $I_{SL'}$[1]~$I_{SL'}$[M] generated at the first/second source lines SL [1]~SL [M], SL'[1]~SL'[M]. If the search input srchINP is identical to the in-memory data stoDAT[n], none of the first/second sensing currents $I_{SL}$[1]~$I_{SL}$[M], $I_{SL'}$[1]~$I_{SL'}$ [M] will generate. Otherwise, at least one of the first/second sensing currents $I_{SL}$[1]~$I_{SL}$[M], $I_{SL'}$[1]~$I_{SL'}$[M] generates.

The sensing circuit 101*g* detects whether there is any first/second sensing current $I_{SL}$[1]~$I_{SL}$[M], $I_{SL'}$[1]~$I_{SL'}$[M] generated at the first/second source lines SL [1]~SL [M], SL'[1]~SL'[M] and how many of them. Then, the sensing circuit 101*g* generates a sensing circuit output senOUT based on the current detection result. In practical applications, the sensing circuit 101*g* may detect the first/second sensing currents $I_{SL}[1]$~$I_{SL}[M]$, $I_{SL'}[1]$~$I_{SL'}[M]$ with various approaches.

FIG. 2 is a schematic diagram illustrating a memory array according to an embodiment of the present disclosure. The memory array 20 includes M*N memory cells MC(1, 1)~MC(M, N). The memory cells MC(1, 1)~MC(M, N) are arranged in M columns and N rows. Each of the M columns corresponds to a bit-position (m=1~M).

For the sake of illustrations, the following illustrations about the data match/mismatch comparison are based on a memory cell MC(m, n). Located at the m-th column and the n-th row, the memory cell MC(m, n) can represent any of the memory cells MC(1, 1)~MC(M, N). The variables m and n are positive integers. The variable "m" is smaller than or equivalent to the variable M, and the variable "n" is smaller than or equivalent to the variable N.

The memory cell MC(m, n) includes two adjacent transistors T1, T2. The transistors T1, T2 belonging to the same memory cell MC(m, n) are arranged in the n-th row, and their control terminal (gate terminals) are electrically connected to the same word line WL[n].

The m-th memory string strgM[m] further includes two transistor strings: an m-th first transistor string strgT1 [m] and an m-th second transistor string strgT2 [m]. The m-th first transistor string strgT1 [m] includes N transistors T1 in the N memory cells MC(m, 1)~MC(m, N), and the N transistors T1 in the memory cells MC(m, 1)~MC(m, N) are connected in series. The m-th second transistor string strgT2 [m] includes N transistors T2 in the N memory cells MC(m, 1)~MC(m, N), and the N transistors T2 in the memory cells MC(m, 1)~MC(m, N). In the present application, the transistors T1, T2 are assumed to be NMOS transistors. However, other types of transistors T1, T2 can be adopted with appropriate modifications of the control circuit 101.

The m-th first transistor string strgT1 [m] is electrically connected between the first bit-line BL[m] at the m-th bit-position (that is, the m-th first bit-line BL[m]) and the first source line SL [m] at the m-th bit-position (that is, the m-th first source line SL [m]). The drain terminal of the transistor T1 in the memory cell MC(m, n) is directly/indirectly electrically connected to the m-th first bit-line BL[m], the source terminal of the transistor T1 in the memory cell MC(m, n) is directly/indirectly electrically connected to the m-th first source line SL [m], and the gate terminals of the transistors T1, T2 in the memory cell MC(m, n) are directly electrically connected to the m-th word line WL[m].

The m-th second transistor string strgT2 [m] is electrically connected between the second bit-line BL'[m] at the m-th bit-position (that is, the m-th second bit-line BL'[m]) and the second source line SL'[m] at the m-th bit-position (that is, the m-th second source line SL'[m]). The drain terminal of the transistor T2 in the memory cell MC(m, n) is directly/indirectly electrically connected to the m-th second bit-line BL'[m], the source terminal of the transistor T2 in the memory cell MC(m, n) is directly/indirectly electrically connected to the m-th second source line SL'[m], and the gate terminals of the transistors T1, T2 in the memory cell MC(m, n) are directly electrically connected to the m-th word line WL[m].

During the IMS operation, the M first source lines SL [1]~SL [M] and the M second source lines SL'[1]~SL'[M] are electrically connected to a global common source line (hereinafter, GCSL). The GCSL is equivalent to a ground voltage Vgnd. Thus, a voltage difference (ΔVgs) between the control terminal and the source terminal of the transistors T1, and T2 of the memory cell MC(m, n) is equivalent to the voltage difference between the select voltage Vsel and the ground voltage. That is, ΔVgs=Vsel−Vgnd.

When memory controller 101*a* selects the memory cells MC(1, n)~MC(M, n) located at the n-th row for a read/write/erase/IMS operation, a select voltage Vsel is applied to the n-th word line WL[n], and a pass-through voltage Vpas is applied to the other (N−1) word lines WL[1]~WL[n−1], WL[n+1]~WL[N]. The select voltage Vsel is much lower than the pass-through voltage Vpas.

As the select voltage Vsel and the pass-through voltage Vpas are differently set, the memory cells MC(1, n)~MC(M, n) located at the unselected rows (for example, the 1st~(n−1)-th and the (n+1)-th~N-th row) remain switched. In the following illustrations, the examples focus on the memory cells MC(1, n)~MC(M, n) located at the n-th row only.

To be more specific, when the memory controller 101*a* accesses the memory cell MC(m, n), the transistors T1 of the memory cells MC(m, 1)~MC(m, n−1) are fully switched on so that the search voltage applied to the bit-line BL[m] can be directly conducted to the drain terminal of the transistor T1 of the memory MC(m, n), and the transistors T1 of the memory cells MC(m, n+1)~MC(m, N) are fully switched on so that the signal at the source terminal of the transistor T1 of the memory cell MC(m, n) is directly conducted to the source line SL [m].

Similarly, when the memory controller 101*a* accesses the memory cell MC(m, n), the transistors T2 of the memory cells MC(m, 1)~MC(m, n−1) are fully switched on so that the search voltage applied to the bit-line BL'[m] can be directly conducted to the drain terminal of the transistor T2 of the memory MC(m, n), and the transistors T2 of the memory cells MC(m, n+1)~MC(m, N) are fully switched on so that the signal at the source terminal of the transistor T2 of the memory cell MC(m, n) is directly conducted to the source line SL'[m].

Accordingly, when the transistors T1, T2 of the memory cell MC(m, n) are switched on, the current value of the m-th first sensing current $I_{SL}[m]$ is determined by the search voltage applied to the m-th first bit-line BL[m], and the current value of the m-th second sensing current $I_{SL'}[m]$ is determined by the search voltage applied to the m-th second bit-line BL'[m].

Accordingly, the question regarding whether the transistor T1 of the memory cell MC(m, n) is switched on is related to the comparison result between the select voltage Vsel and the threshold voltage V_th1 of the transistor T1 of the memory cell MC(m, n). When the memory controller 101*a* performs the read operation to the memory cell MC(m, n), the transistor T1 of the memory cell MC(m, n) is switched on, and the m-th first sensing current $I_{SL}[m]$ flowing through the m-th first transistor string strgT1 [m] is determined by the first search voltage (VH or VL) applied to the m-th first bit-line BL[m].

Similarly, the question regarding whether the transistor T2 of the memory cell MC(m, n) is switched on is related to the comparison result between the select voltage Vsel and the threshold voltage V_th2 of the transistor T2 of the memory cell MC(m, n). When the memory controller 101*a* performs the read operation to the memory cell MC(m, n), the transistor T2 of the memory cell MC(m, n) is switched on, and the m-th second sensing current $I_{SL}[m']$ flowing through the m-th second transistor string strgT2 [m] is determined by the second search voltage (VH or VL) applied to the m-th second bit-line BL'[m].

The present application illustrates how control circuit 101 controls memory array 103 to perform the in-memory search (hereinafter, IMS) operation. Details about the implementation of the read operation, the write (programming) operation, and the erase operation applied to the memory device are omitted.

Unlike the conventional read operation, the IMS operation does not directly read the data stored in the memory cells. Instead, another set of data (that is, a search input srchINP) is applied to the memory array 103 and compared with the data stored in the M memory cells MC(1, n)~MC (M, n) arranged on the n-th row (that is, an in-memory data stoDAT[n]).

During the IMS operation, the search input srchINP is represented by the voltages applied to the first bit-lines BL[1]~BL[M] and the second bit-lines BL'[1]~BL'[M] of the M bits. Then, depending on the data match/mismatch between the search input srchINP and the in-memory data stoDAT[n] stored at the n-th row, there might be one or more sensing currents $I_{SL}$[1]~$I_{SL}$[M], $I_{SL'}$[1]~$I_{SL'}$[M] occurring at the source lines SL [1]~SL [M], SL'[1]~SL'[M]. In other words, the IMS operation between the search input srchINP and the in-memory data stoDAT[n] includes M sets of data match/mismatch comparisons. In the M sets of data match/mismatch comparisons, the question regarding whether the M search bits srchBIT(1, n)~srchBIT(M, n) are respectively equivalent to the M in-memory bits stoBIT(1, n)~stoBIT(M, n) is answered by detection of the sensing currents $I_{SL}$[1]~$I_{SL}$[M], $I_{SL'}$[1]~$I_{SL'}$[M].

According to the embodiment of the present disclosure, the amount of the generated sensing currents $I_{SL}$[1]~$I_{SL}$[M], $I_{SL'}$[1]~$I_{SL'}$[M] reflects the data match/mismatch between the search input srchINP and the in-memory data stoDAT[n] stored at the n-th row. More details illustrating how the number of generated sensing currents $I_{SL}$[1]~$I_{SL}$[M], $I_{SL'}$[1]~$I_{SL'}$[M] is utilized to determine the data match/mismatch between the search input srchINP and the in-memory data stoDAT[n] stored at the n-th row are described in FIGS. 3-5.

In the specification, the m-th bit of the in-memory data stoDAT[n] is defined as the m-th in-memory bit stoBIT(m, n). Please refer to FIGS. 3A~3D. The threshold voltages V_th1, V_th2 of the transistors T1, T2 of the memory cell MC(m, n) jointly form 4 different combinations for representing the m-th in-memory bit stoBIT(m, n) as one of "binary 0", "binary 1", "don't care", or "not available (NA)". In addition, the first search voltage applied to the m-th first bit-line BL[m] and the second search voltage applied to the m-th second bit-line BL'[m] jointly form 4 different combinations for representing the m-th search bit srchBIT(m, n) (see FIGS. 4A~4D) as one of "binary 0", "binary 1", "wildcard (*)", or "not available (NA)".

FIGS. 3A~3D are schematic diagrams illustrating how the threshold voltages V_th1, V_th2 of the transistors T1, T2 in the memory cell MC(m, n) are programmed to represent the in-memory bit stoDAT(m, n). In FIGS. 3A~3D, thick lines are utilized to represent that the transistor T1, T2 has a high threshold voltage VTH, and thin lines are utilized to represent that the transistor T1, T2 has a low threshold voltage VTL. Table 1 summarizes the data stored at the in-memory bit stoBIT(m, n) in accordance with various settings of the threshold voltages V_th1, V_th2 of the transistors T1, T2.

TABLE 1

| drawing | threshold voltage V_th1 of transistor T1 | threshold voltage V_th2 of transistor T2 | in-memory bit stoBIT(m, n) |
|---|---|---|---|
| FIG. 3A | VTH | VTL | binary 0 |
| FIG. 3B | VTL | VTH | binary 1 |
| FIG. 3C | VTH | VTH | "X" (don't care) |
| FIG. 3D | VTL | VTL | "NA" (invalid) |

FIGS. 4A~4D are schematic diagrams illustrating how the first search voltage is applied to the m-th first bit-line BL[m] and how the second search voltage is applied to the m-th second bit-line BL'[m] to represent the m-th search bit srchBIT[m]. In FIGS. 4A~4D, solid lines are utilized to represent that the m-th first bit-line BL[m] or the m-th second bit BL'[m] is applied with a high search voltage VH, and dotted lines are utilized to represent that the m-th first bit-line BL[m] or the m-th second bit-line BL'[m] is applied with a low search voltage VL. Table 2 summarizes how the memory controller 101*a* selects the first search voltage applied to the m-th first bit-line BL[m] and the second search voltage applied to the m-th bit-line BL'[m] according to the m-th search bit srchBIT[m].

TABLE 2

Figure 4A:
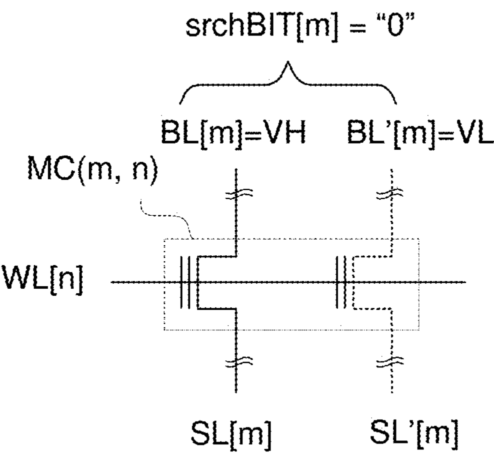
FIGS. 4A~4D are schematic diagrams illustrating how the first search voltage is applied to the m-th first bit-line BL[m] and how the second search voltage of applied to the m-th second bit-line BL'[m] to represent the m-th search bit srchBIT[m].
Figure 4B:
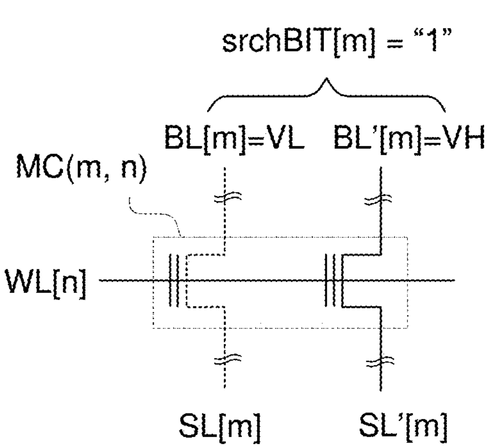
Figure 4C:
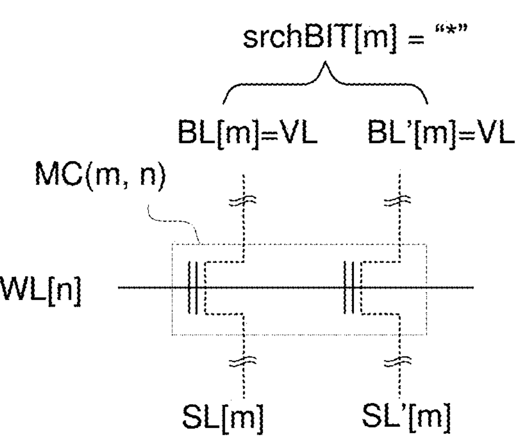
Figure 4D:
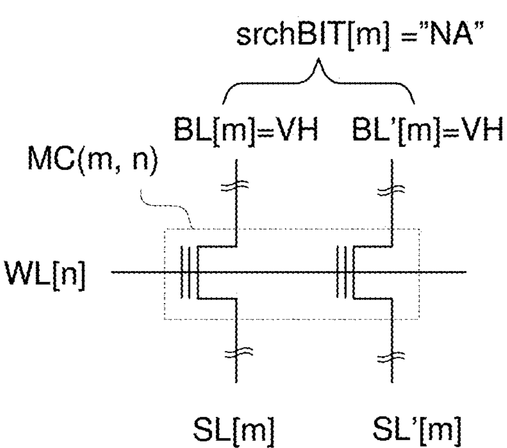

| drawing | first search voltage applied to BL'[m] | second search voltage applied to BL'[m] | search bit srchBIT[m] |
|---|---|---|---|
| FIG. 4A | VH | VL | binary 0 |
| FIG. 4B | VL | VH | binary 1 |
| FIG. 4C | VL | VL | "*"(wildcard bit) |
| FIG. 4D | VH | VH | "NA" (invalid) |

According to the embodiment of the present disclosure, the high threshold voltage VTH is greater than the high search voltage VH (VTH>VH), the high search voltage VH is greater than the low threshold voltage VTL (VH>VTL), and the low threshold voltage VTL is greater than the low search voltage VL (VTL>VL). That is, VTH>VH>VTL>VL. Moreover, the low search voltage value VL is equivalent to 0V (VL=0V).

In the m-th first transistor string strgT1 [m], the transistors T1 of the memory cells MC(m, 1~(n−1)), MC(m, (n+1)~N)) remain switched on as their control terminals receive the pass-through voltage Vpas. Thus, the transistors T1 of the memory cells MC(m, 1~(n−1)) conduct the first search voltage (VH or VL) from the m-th first bit-line BL[m] to the drain terminal of the transistor T1 of the memory cell MC(m, n), and the transistors T1 of the memory cells MC(m, (n+1)~N)) connect the source terminal of the transistor T1 of the memory cell MC(m, n) to the m-th first source line SL [m].

In the m-th second transistor string strgT2 [m], the transistors T2 of the memory cells MC(m, 1~(n−1)), MC(m, (n+1)~N)) remain switched on as their control terminals receive the pass-through voltage Vpas. Thus, the transistors T2 of the memory cells MC(m, 1~(n−1)) conduct the second search voltage (VH or VL) from the m-th second bit-line BL'[m] to the drain terminal of the transistor T2 of the memory cell MC(m, n), and the transistors T2 of the memory cells MC(m, (n+1)~N)) connect the source terminal of the transistor T1 of the memory cell MC(m, n) to the m-th second source line SL'[m].

The first search voltage (VH or VL) applied to the m-th first bit-line BL[m] is like a bias driving voltage of the m-th first transistor string strgT1 [m], and the second search voltage (VH or VL) applied to the m-th second bit-line BL'[m] is like a bias driving voltage of the m-th second transistor string strgT2 [m]. If the first search voltage (VH or VL) applied to the m-th first bit-line BL[m] is greater than the threshold voltage V_th1 of the transistor T1 in memory cell MC(m, n), the first search voltage drives the m-th first transistor string strgT1 [m], and the m-th first sensing current $I_{SL}$[m] will occur. Similarly, if the second search voltage (VH or VL) applied to the m-th second bit-line BL'[m] is greater than the threshold voltage V_th2 of the transistor T2 in memory cell MC(m, n), the second search voltage drives the m-th second transistor string strgT2 [m], and the m-th second sensing current $I_{SL'}$[m] will occur.

Table 3 summarizes the various combinations of the first search voltage applied to the m-th first bit-line BL[m], the second search voltage applied to the m-th second bit-line BL'[m], the threshold voltage V_th1 of the transistors T1 in the memory cell MC(m, n), and the threshold voltage V_th2 of the transistors T2 in the memory cell MC(m, n).

TABLE 3

| generation of $I_{SL}$[m], $I_{SL'}$[m] | | first search voltage applied to BL[m] VH | first search voltage applied to BL[m] VL | second search voltage applied to BL'[m] VH | second search voltage applied to BL'[m] VL |
|---|---|---|---|---|---|
| threshold voltage V_th1 of transistor T1 in MC(m, n) | VTH | $I_{SL}$[m] is NOT generated | $I_{SL}$[m] is NOT generated | — | — |
| | VTL | $I_{SL}$[m] is generated | $I_{SL}$[m] is NOT generated | — | — |
| threshold voltage V_th2 of transistor T2 in MC(m, n) | VTH | — | — | $I_{SL'}$[m] is NOT generated | $I_{SL'}$[m] is NOT generated |
| | VTL | — | — | $I_{SL'}$[m] is generated | $I_{SL'}$[m] is NOT generated |

It can be concluded from Table 3 that the m-th first sensing current $I_{SL}$[m] does not occur if the threshold voltage V_th1 of the transistor T1 is equivalent to the high threshold voltage VTH (V_th1=VTH), and the m-th second sensing current $I_{SL'}$[m] does not occur if the threshold voltage V_th2 of the transistor T2 is equivalent to the high threshold voltage VTH (V_th2=VTH). In other words, the m-th first sensing current $I_{SL}$[m] will not generate if the threshold voltage V_th1 of the transistor T1 is equivalent to the high threshold voltage VTH and the m-th second sensing current $I_{SL'}$[m] will not generate if the threshold voltage V_th2 of the transistor T2 is equivalent to the high threshold voltage VTH. This is because the first/second search voltage (VH, VL) applied to the m-th first/second bit-lines BL[m], BL'[m] is always lower than the high threshold voltage VTH (VL<VH<VTH).

On the other hand, the m-th first sensing current $I_{SL}$[m] may or may not generate if the threshold voltage of the transistor T1 is equivalent to the low threshold voltage VTL (V_th1=VTL), and the m-th second sensing current $I_{SL'}$[m] may or may not generate if the threshold voltage of the transistor T2 is equivalent to the low threshold voltage VTL (Vth_2=VTL).

In a case where the threshold voltage V_th1 of the transistor T1 is equivalent to the low threshold voltage VTL (V_th1=VTL) and the first search voltage applied to the m-th first bit-line BL[m] is equivalent to the high search voltage VH (BL[m]=VH), the m-th first sensing current $I_{SL}$[m] generates. Similarly, in a case where the threshold voltages V_th2 of the transistor T2 is equivalent to the low threshold voltage VTL (V_th2=VTL) and the second search voltages applied to the m-th second bit-line BL'[m] is equivalent to the high search voltage VH (BL'[m]=VH), the m-th second sensing current $I_{SL'}$[m] generates.

In a case where the threshold voltages V_th1 of the transistor T1 is equivalent to the low threshold voltage VTL (V_th1=VTL) and the first search voltage applied to the m-th first bit-line BL[m] is equivalent to the low search voltage VL (BL[m]=VL), the m-th first sensing current $I_{SL}$[m] does not generate. Similarly, in a case where the threshold voltages V_th2 of the transistor T2 is equivalent to the low threshold voltage VTL (V_th2=VTL) and the second search voltage applied to the m-th second bit-line BL'[m] is equivalent to the low search voltage VL (BL'[m]=VL), the m-th second sensing current $I_{SL'}$[m] does not generate.

Thus, the generation of the m-th first sensing current $I_{SL}$[m] is dependent on the first search voltage applied to the m-th first bit-line BL[m] when the threshold voltage V_th1 of the transistor T1 is equivalent to the low threshold voltage VTL (V_th1=VTL). Besides, the generation of the m-th second sensing current $I_{SL'}$[m] is dependent on the second search voltage applied to the m-th second bit-line BL'[m] when the threshold voltage V_th2 of the transistor T2 is equivalent to the low threshold voltage VTL (V_th2=VTL).

Based on the inequality of the high/low search voltages and the threshold voltages (VTH>VH>VTL>VL), the 4 types of the m-th in-memory bit stoBIT(m, n) (stoBIT(m, n)=0, 1, X, or NA) shown in FIGS. 3A~3D, and the 4 types of the m-th search bit srchBIT[m] (srchBIT[m]=0, 1, *, or NA) shown in FIGS. 4A~4D, 16 combinations of the m-th in-memory bit stoBIT(m, n) and the m-th search bit srchBIT[m] are formed. Please refer to FIG. 5 and Tables 3 and 4 for these combinations.

Figure 5:
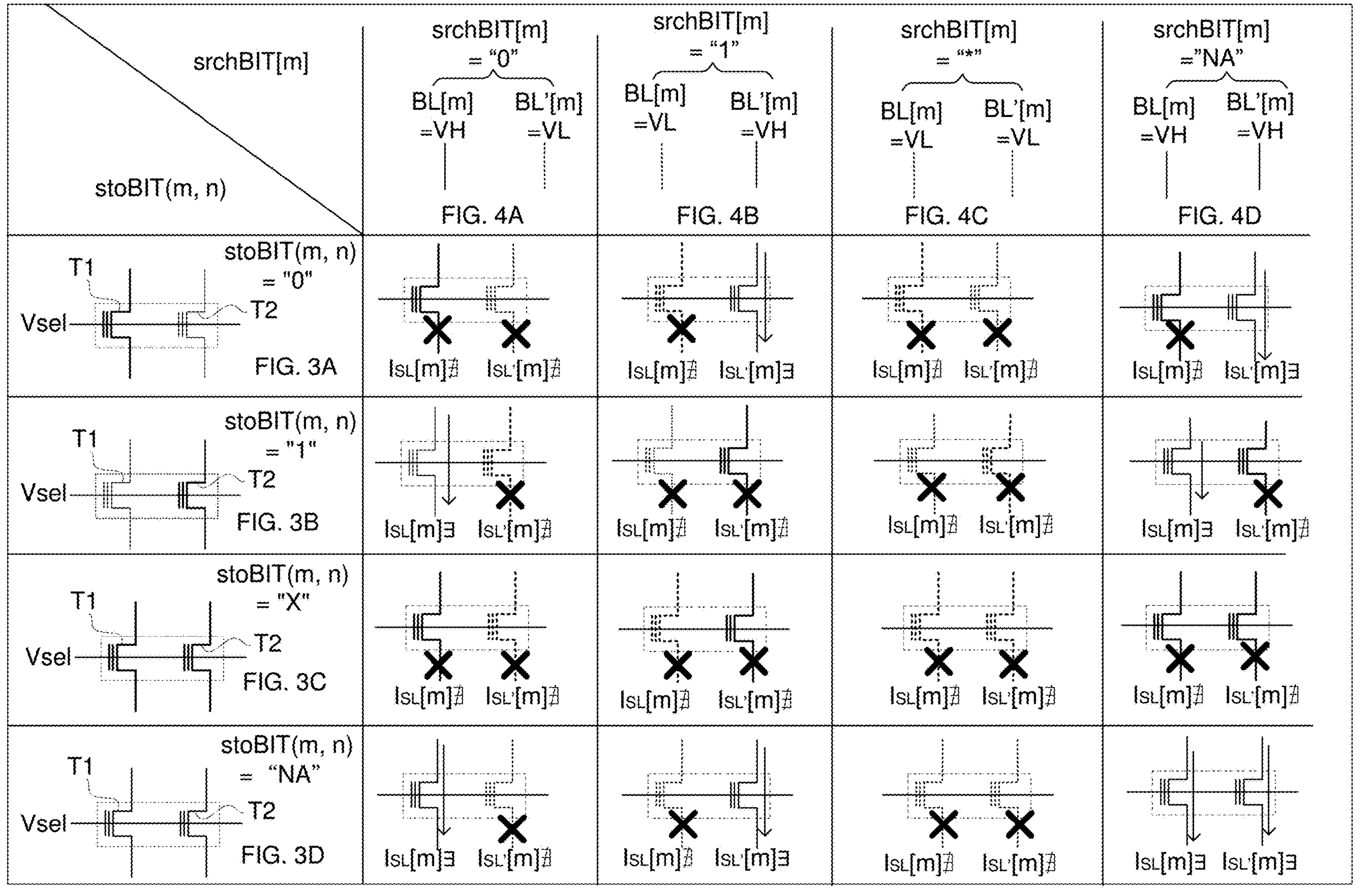
FIG. 5 is a schematic diagram illustrating that the m-th first sensing current $I_{SL}$[m] and the m-th second sensing current $I_{SL'}$[m] are selectively generated according to different combinations of the m-th in-memory bit stoDAT(m, n) and the m-th search bit srchBIT[m].

FIG. 5 is a schematic diagram illustrating that the sensing currents $I_{SL}$[m], $I_{SL'}$[m] are selectively generated according to different combinations of the m-th in-memory bit stoDAT (m, n) and the m-th search bit srchBIT[m]. In FIG. 5, different values of the m-th in-memory bit stoBIT(m, n) are listed in rows, and different values of the m-th search bit srchBIT[m] are listed in columns. Based on the voltage comparison relationship illustrated in Table 3, 16 different 10 data combinations of the m-th in-memory bit stoDAT(m, n) and the m-th search bit srchBIT[m] are formed. The combinations shown in FIG. 5 are summarized in Table 4.

TABLE 4

| drawing | in-memory bit stoBIT(m, n) | threshold voltage V_th1, V_th2 of transistors in MC(m, n) T1 | T2 | drawing | search bit srchBIT(m, n) | are stoBIT(m, n) and srchBIT(m, n) matched/mismatched? | search voltage applied to the bit-line BL[m] | BL'[m] | sensing current $I_{SL}$[m] | $I_{SL'}$[m] | number of sensing current $I_{SL}$[m], $I_{SL'}$[m] actually generated |
|---|---|---|---|---|---|---|---|---|---|---|---|
| FIG. 3A | "0" | VTH | VTL | FIG. 4A | "0" | match | VH | VL | No | No | 0 |
| | | | | FIG. 4B | "1" | mismatch | VL | VH | No | Yes | 1 |
| | | | | FIG. 4C | "*" | match | VL | VL | No | No | 0 |
| | | | | FIG. 4D | "NA" | mismatch | VH | VH | No | Yes | 1 |
| FIG. 3B | "1" | VTL | VTH | FIG. 4A | "0" | mismatch | VH | VL | Yes | No | 1 |
| | | | | FIG. 4B | "1" | match | VL | VH | No | No | 0 |
| | | | | FIG. 4C | "*" | match | VL | VL | No | No | 0 |
| | | | | FIG. 4D | "NA" | mismatch | VH | VH | Yes | No | 1 |

TABLE 4-continued

| drawing | in-memory bit stoBIT(m, n) | threshold voltage V_th1, V_th2 of transistors in MC(m, n) T1 | T2 | drawing | search bit srchBIT(m, n) | are stoBIT(m, n) and srchBIT(m, n) matched/mismatched? | search voltage applied to the bit-line BL[m] | BL'[m] | sensing current $I_{SL}$[m] | $I_{SL'}$[m] | number of sensing current $I_{SL}$[m], $I_{SL'}$[m] actually generated |
|---|---|---|---|---|---|---|---|---|---|---|---|
| FIG. 3C | "X" | VTH | VTH | FIG. 4A | "0" | match | VH | VL | No | No | 0 |
| | | | | FIG. 4B | "1" | match | VL | VH | No | No | 0 |
| | | | | FIG. 4C | "*" | match | VL | VL | No | No | 0 |
| | | | | FIG. 4D | "NA" | match | VH | VH | No | No | 0 |
| FIG. 3D | "NA" | VTL | VTL | FIG. 4A | "0" | mismatch | VH | VL | Yes | No | 1 |
| | | | | FIG. 4B | "1" | mismatch | VL | VH | No | Yes | 1 |
| | | | | FIG. 4C | "*" | mismatch | VL | VL | No | No | 0 |
| | | | | FIG. 4D | "NA" | special case | VH | VH | Yes | Yes | 2 |

According to FIG. 5 and Table 4, it can be concluded that the existences of the m-th first sensing current $I_{SL}[m]$ and the m-th second sensing current $I_{SL'}[m]$ can represent the equality/inequality between the m-th in-memory bit stoBIT(m, n) and the m-th search bit srchBIT[m]. That is, either of the m-th first sensing current $I_{SL}[m]$ and the m-th second sensing current $I_{SL'}[m]$ will generate if the m-th in-memory bit stoBIT(m, n) is not equivalent to the search bit srchBIT[m] (that is, stoBIT(m, n)≠stoBIT(m, n)). On the other hand, none of the m-th first sensing current $I_{SL}[m]$ and the m-th second sensing current $I_{SL'}[m]$ will generate if the m-th in-memory bit stoBIT(m, n) is equivalent to the m-th search bit srchBIT[m] (that is, stoBIT(m, n)=stoBIT(m, n)).

Please note that there is a special case among the 16 sets of data match/mismatch comparisons. The special case is the data match/mismatch comparison when the m-th in-memory bit stoBIT(m, n) represents "not available (NA)", and the m-th search bit srchBIT(m, n) represents "not available (NA)". That is, stoBIT(m, n)="NA", and srchBIT[m]="NA. In most of the data match/mismatch comparison combinations, none or one of the m-th first sensing current $I_{SL}[m]$ and the m-th second sensing current $I_{SL'}[m]$ will generate. However, there is a special data match/mismatch comparison that both the m-th first sensing current $I_{SL}[m]$ and the m-th second sensing current $I_{SL'}[m]$ will generate if the in-memory bit stoBIT(m, n) represents "not available" (stoBIT (m, n)="NA") and the search bit srchBIT[m] represents "not available" (srchBIT[m]="NA"). That is, stoBIT(m, n)="NA" and srchBIT(m, n)="NA".

The data match/mismatch comparison situation when the in-memory bit stoBIT(m, n) represents "not available" (stoBIT(m, n)="NA") and the search bit srchBIT[m] represents "not available" (srchBIT[m]="NA") is very special and rare. Such a data match/mismatch comparison situation is known to the memory controller 101*a* in advance. Thus, such a data match/mismatch comparison situation is not discussed in the present disclosure.

As illustrated above, none of the m-th first sensing current $I_{SL}[m]$ and the m-th second sensing current $I_{SL'}[m]$ will generate if the in-memory bit stoBIT(m, n) is equivalent to the search bit srchBIT[m] (stoBIT(m, n)=srchBIT[m]). To be more specific, the memory controller 101*a* can detect the existence of the m-th first sensing current $I_{SL}[m]$ and the m-th second sensing current $I_{SL'}[m]$ after applying the first search voltage (VL and/or VH) to the m-th first bit-line BL[m] and applying the second search voltage (VL and/or VH) to the m-th second BL[m]', and the memory controller 101*a* determines whether the m-th in-memory bit stoBIT(m, n) and the m-th search bit srchBIT[m] are equivalent based on the current detection result of the m-th first sensing current $I_{SL}[m]$ and the m-th second sensing current $I_{SL'}[m]$.

According to the embodiment of the present disclosure, the M bits of the in-memory data stoDAT[n] (that is, the M in-memory bits stoBIT(1, n)~stoBIT(M, n)) are respectively compared to the M bits of the search input srchINP (that is, the M search bits srchBIT[1]~srchBIT[M]). As the memory controller 101*a* applies the search voltages to the M first bit-lines BL[1]~BL[M] and the M second bit-lines BL'[1] ~BL'M] through the bit-line decoder 101*c* at the same time, the M bits length of comparisons between the data stored at the M in-memory bits stoBIT(1, n)~stoBIT(M, n) and the data represented by the search bits srchBIT[1]~srchBIT[M] are performed simultaneously. Through the sensing circuit 101*g*, the memory controller 101*a* is capable of identifying if any of the M first sensing currents $I_{SL}[1]$~$I_{SL}[M]$ and the M second sensing currents $I_{SL'}[1]$~$I_{SL'}[M]$ occurs and how many of the M first sensing currents $I_{SL}[1]$~$I_{SL}[M]$ and the M second sensing currents $I_{SL'}[1]$~$I_{SL'}[M]$ actually occur. The more the first sensing currents $I_{SL}[1]$~$I_{SL}[M]$ and/or the second sensing currents $I_{SL'}[1]$~$I_{SL'}[M]$ generate, the number of bits that are different in the search input srchINP and the in-memory data stoDAT[n] is more.

FIGS. 6-9 are examples showing how the memory controller 101*a* compares the in-memory data stoDAT[n] stored at the M memory cells MC(1, n)~MC(M, n) located at the n-th row of the memory array 103 and the search input srchINP. It is assumed M=6 in FIGS. 6-9.

Figure 6A:
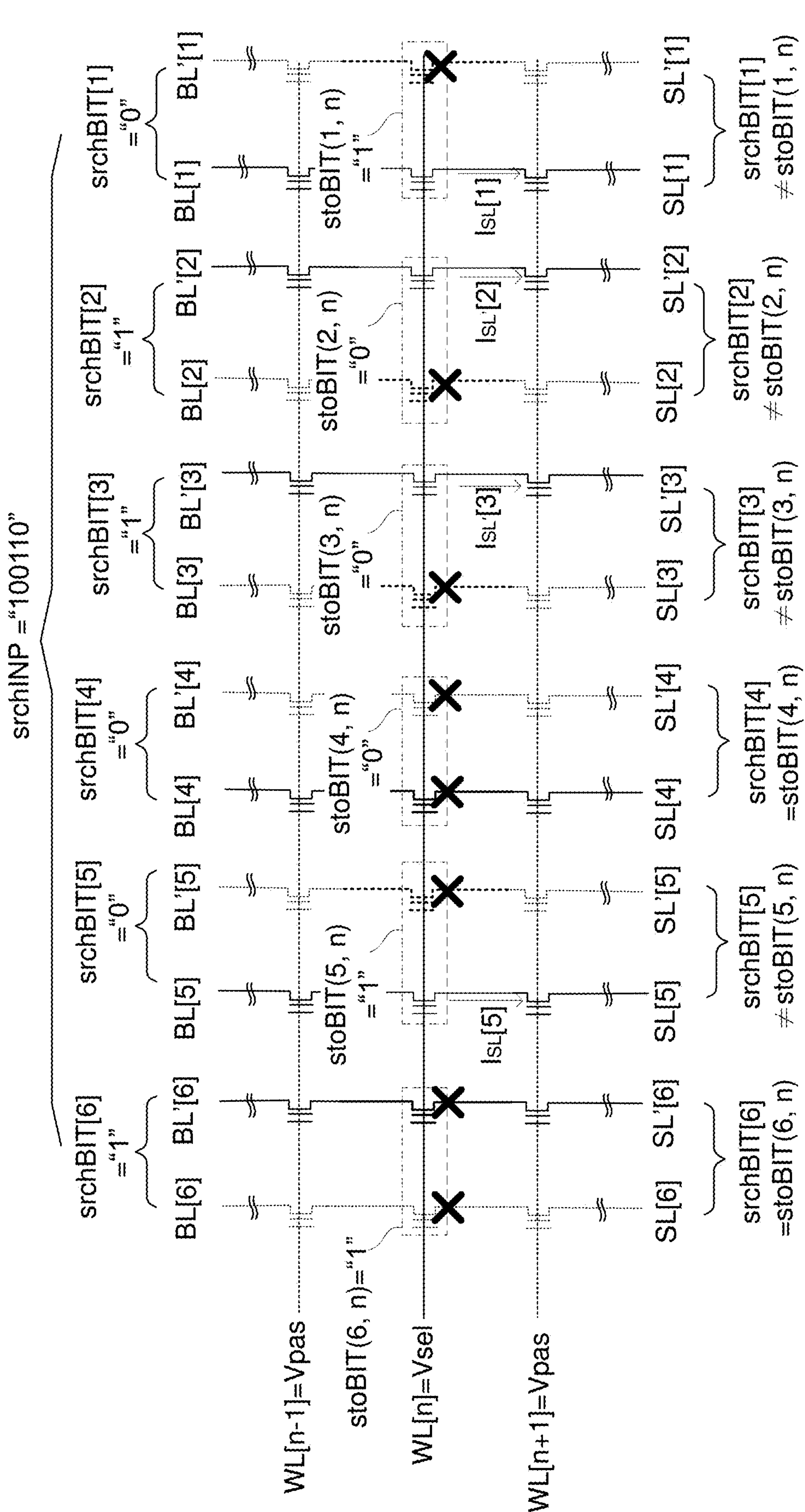
FIGS. 6A~6C are schematic diagrams illustrating the exemplary scenarios when the search input srchINP is determined as being mismatched with the in-memory data stoDAT[n].
Figure 6B:
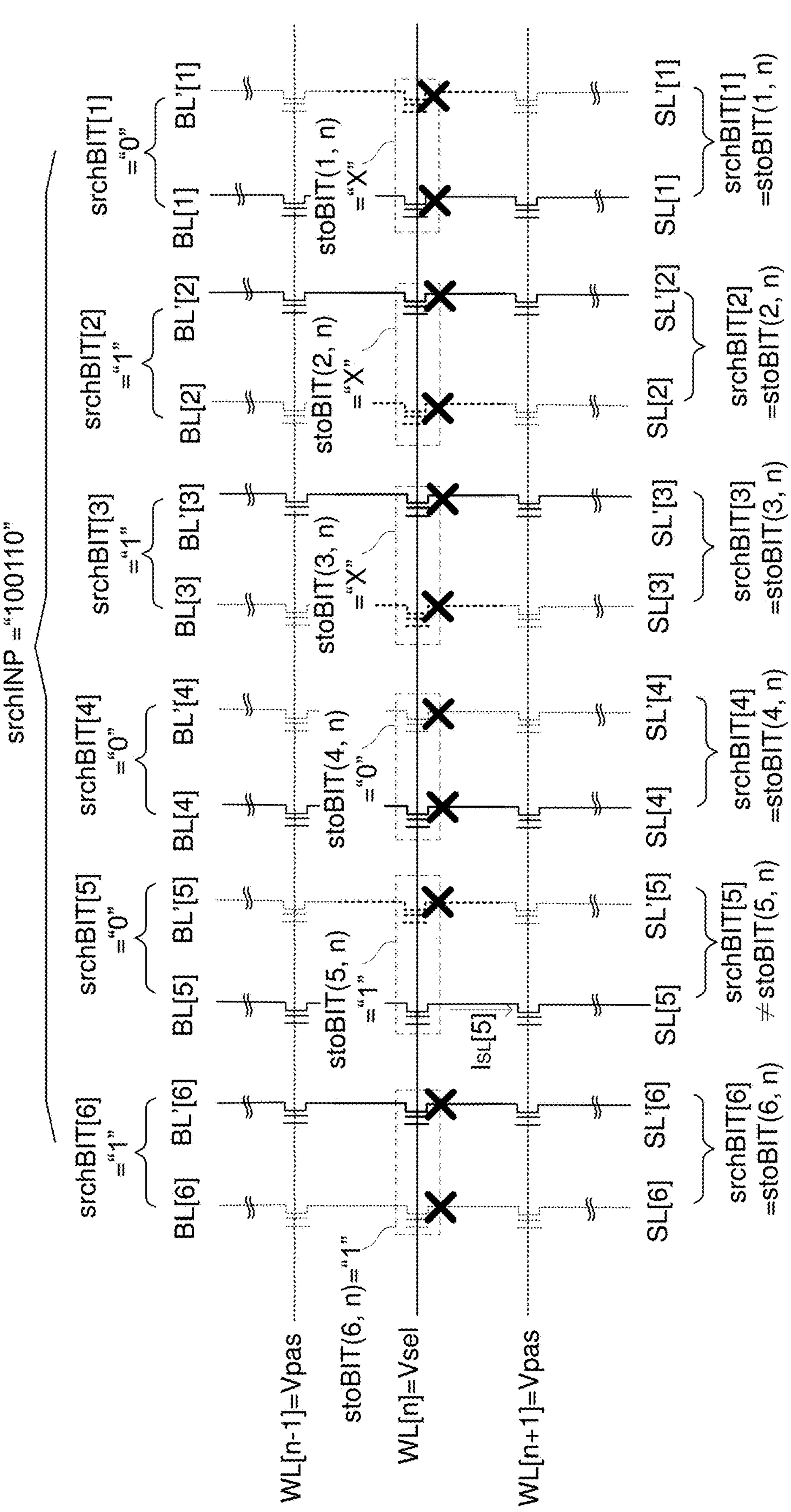
Figure 6C:
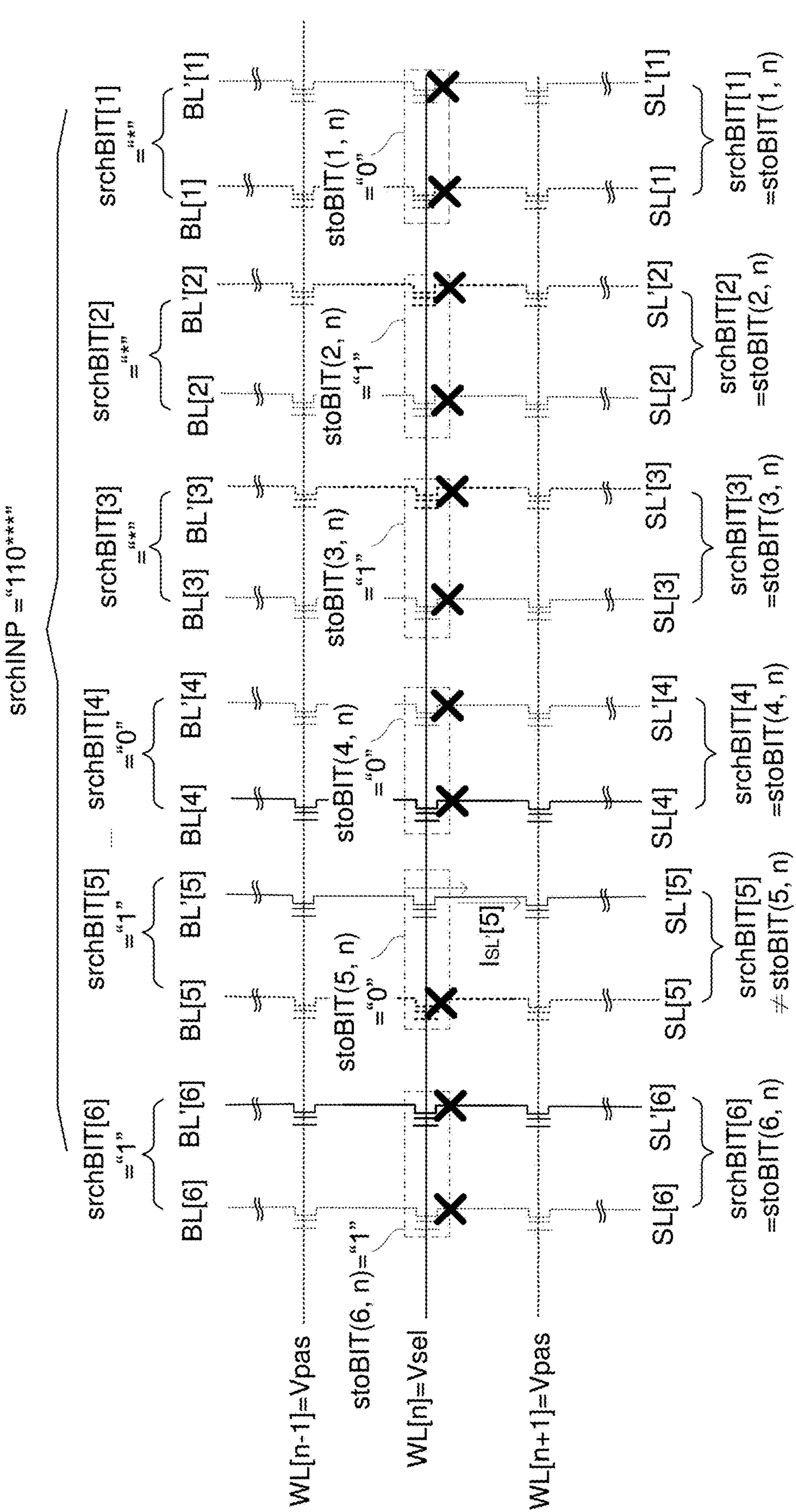

FIGS. 6A~6C are schematic diagrams illustrating the exemplary scenarios when the search input srchINP is determined as being mismatched with the in-memory data stoDAT. In FIGS. 6A~6C, some of the first sensing currents $I_{SL}[1]$~$I_{SL}[6]$ and the second sensing currents $I_{SL'}[1]$~$I_{SL'}[6]$ are generated. The equality/inequality between the search bits srchBIT[1]~srchBIT[6] and the in-memory bits stoBIT [1]~stoBIT[6] are respectively identified based on the generation of the first sensing current $I_{SL}[1]$~$I_{SL}[6]$ and the second sensing currents $I_{SL'}[1]$~$I_{SL'}[6]$.

In FIG. 6A, it is assumed that the search input srchINP is "100110b", and the in-memory data stoDAT[n] is "110001b". That is, srchINP="100110b"=38(D), and stoDAT[n]="110001b"=49(D). The circuit behavior shown in FIG. 6A are listed in Table 5A. Please refer to FIG. 6A and Table 5A together.

In FIG. 6B, it is assumed that the search input srchINP is "100110b", and the in-memory data stoDAT[n] is "110XXXb". That is, srchINP="100110b"=38(D), and stoDAT[n]="110XXXb"=48(D)~55(D). The circuit behavior shown in FIG. 6B are listed in Table 5B. Please refer to FIG. 6B and Table 5B together.

In FIG. 6C, it is assumed that the search input srchINP is "110*b", and the in-memory data stoDAT[n] is "100110b". That is, srchINP="110*b"=48(D)~55(D), and stoDAT[n]="100110b"=38(D). The circuit behavior shown in FIG. 6C is listed in Table 5C. Please refer to FIG. 6C and Table 5C together.

TABLE 5A

FIG. 6A, srchINP = "100110b" = 38(D), and stoDAT[n] = "110001b" = 49(D).

| | bit-position | | | | | |
|---|---|---|---|---|---|---|
| | m = 6 | | m = 5 | | m = 4 | |
| srchBIT[m] | 1 | | 0 | | 0 | |
| search voltages applied to BL[m], BL'[m] | VL | VH | VH | VL | VH | VL |
| stoBIT(m, n) | 1 | | 1 | | 0 | |
| threshold voltages V_th1, V_th2 of transistor T1 and T2 | V_th1 = VTL | V_th2 = VTH | V_th1 = VTL | V_th2 = VTH | V_th1 = VTH | V_th2 = VTL |
| generation of sensing currents $I_{SL}$[m], $I_{SL'}$[m] | VL < VTL, no $I_{SL}$[6] exists | VH < VTH, no $I_{SL'}$[6] exists | VH > VTL, $I_{SL}$[5] exists | VL < VTH, no $I_{SL'}$[5] exists | VH < VTH, no $I_{SL}$[4] exists | VL < VTL, no $I_{SL'}$[4] exists |
| comparison result | None of $I_{SL}$[6] and $I_{SL'}$[6] is generated →srchBIT[6] = stoBIT[6] | | $I_{SL}$[5] is generated →srchBIT[5] ≠ stoBIT[5] | | None of $I_{SL}$[4] and $I_{SL'}$[4] is generated srchBIT[4] = stoBIT(4, n) | |

| | bit-position | | | | | |
|---|---|---|---|---|---|---|
| | m = 3 | | m = 2 | | m = 1 | |
| srchBIT[m] | 1 | | 1 | | 0 | |
| search voltages applied to BL[m], BL'[m] | VL | VH | VL | VH | VH | VL |
| stoBIT(m, n) | 0 | | 0 | | 1 | |
| threshold voltages V_th1, V_th2 of transistor T1 and T2 | V_th1 = VTH | V_th2 = VTL | V_th1 = VTH | V_th2 = VTL | V_th1 = VTL | V_th2 = VTH |
| generation of sensing currents $I_{SL}$[m], $I_{SL'}$[m] | VL < VTH, no $I_{SL}$[3] exists | VH < VTL, no $I_{SL'}$[3] exists | VL > VTH, no $I_{SL}$[2] exists | VH > VTL, $I_{SL'}$[2] exists | VH > VTL, $I_{SL}$[1] exists | VL < VTH, no $I_{SL'}$[1] exists |
| comparison result | $I_{SL'}$[3] is generated →srchBIT[3] ≠ stoBIT(3, n) | | $I_{SL'}$[2] is generated →srchBIT[2] ≠ stoBIT(2, n) | | $I_{SL}$[1] is generated →srchBIT[0] ≠ stoBIT(1, n) | |

TABLE 5B

FIG. 6B, srchINP = "100110b" = 38(D), and stoDAT[n] = "110XXXb" = 48(D)~55(D)

| | bit-position | | | | | |
|---|---|---|---|---|---|---|
| | m = 6 | | m = 5 | | m = 4 | |
| srchBIT[m] | 1 | | 0 | | 0 | |
| search voltages applied to BL[m], BL'[m] | VL | VH | VH | VL | VH | VL |
| stoBIT(m, n) | 1 | | 1 | | 0 | |
| threshold voltages of transistors T1 and T2 | V_th1 = VTL | V_th2 = VTH | V_th1 = VTL | V_th2 = VTH | V_th1 = VTH | V_th2 = VTL |
| generation of sensing currents $I_{SL}$[m], $I_{SL'}$[m] | VL < VTL, no $I_{SL}$[6] exists | VH < VTH, no $I_{SL'}$[6] exists | VH > VTL, $I_{SL}$[5] exists | VL < VTH, no $I_{SL'}$[5] exists | VH < VTH, no $I_{SL}$[4] exists | VL < VTL, no $I_{SL'}$[4] exists |
| comparison result | None of $I_{SL}$[6] and $I_{SL'}$[6] is generated →srchBIT[6] = stoBIT[6] | | $I_{SL}$[5] is generated→ srchBIT[5] ≠ stoBIT(5, n) | | None of $I_{SL}$[4] and $I_{SL'}$[4] is generated →srchBIT[4] = stoBIT(4, n) | |

| | bit-position | | | | | |
|---|---|---|---|---|---|---|
| | m = 3 | | m = 2 | | m = 1 | |
| srchBIT[m] | 1 | | 1 | | 0 | |
| search voltages applied to BL[m], BL'[m] | VL | VH | VL | VH | VH | VL |
| stoBIT(m, n) | X | | X | | X | |
| threshold voltages of transistors T1 and T2 | V_th1 = VTH | V_th2 = VTH | V_th1 = VTH | V_th2 = VTH | V_th1 = VTH | V_th2 = VTH |

TABLE 5B-continued

| FIG. 6B, srchINP = “100110b” = 38(D), and stoDAT[n] = “110XXXb” = 48(D)~55(D) | | | | | | |
|---|---|---|---|---|---|---|
| generation of sensing currents $I_{SL}$[m], $I_{SL'}$[m] | VL < VTH, no $I_{SL}$[3] exists | VH < VTH, no $I_{SL'}$[3] exists | VL < VTH, no $I_{SL}$[2] exists | VH < VTH, no $I_{SL'}$[2] exists | VH < VTH, no $I_{SL}$[1] exists | VL < VTH, no $I_{SL'}$[1] exists |
| comparison result | None of $I_{SL}$[3] and $I_{SL'}$[3] is generated →srchBIT[3] = stoBIT(3, n) | | None of $I_{SL}$[2] and $I_{SL'}$[2] is generated →srchBIT[2] = stoBIT(2, n) | | None of $I_{SL}$[1] and $I_{SL'}$[1] is generated srchBIT[1] = stoBIT(1, n) | |

TABLE 5C

| FIG. 6C, srchINP = “110***b” = 48(D)~55(D), and stoDAT[n] = “100110b” = 38(D) | | | | | | |
|---|---|---|---|---|---|---|
| | bit-position | | | | | |
| | m = 6 | | m = 5 | | m = 4 | |
| srchBIT[m] | 1 | | 1 | | 0 | |
| search voltages applied to BL[m], BL'[m] | VL | VH | VL | VH | VH | VL |
| stoBIT(m, n) | 1 | | 0 | | 0 | |
| threshold voltages of transistors T1 and T2 | V_th1 = VTL | V_th2 = VTH | V_th1 = VTH | V_th2 = VTL | V_th1 = VTH | V_th2 = VTL |
| generation of sensing currents $I_{SL}$[m], $I_{SL'}$[m] | VL < VTL, no $I_{SL}$[6] exists | VH < VTH, no $I_{SL'}$[6] exists | VL < VTH, no $I_{SL}$[5] exists | VH > VTL, $I_{SL'}$[5] exists | VH < VTH, no $I_{SL}$[4] exists | VL < VTL, no $I_{SL'}$[4] exists |
| comparison result | None of $I_{SL}$[6] and $I_{SL'}$[6] is generated →srchBIT[6] = stoBIT[6] | | $I_{SL'}$[5] is generated → srchBIT[5] ≠ stoBIT(5, n) | | None of $I_{SL}$[4] and $I_{SL'}$[4] is generated →srchBIT[4] = stoBIT(4, n) | |
| | bit-position | | | | | |
| | m = 3 | | m = 2 | | m = 1 | |
| srchBIT[m] | * | | * | | * | |
| search voltages applied to BL[m], BL'[m] | VL | VL | VL | VL | VL | VL |
| stoBIT(m, n) | 1 | | 1 | | 0 | |
| threshold voltages of transistors T1 and T2 | V_th1 = VTL | V_th2 = VTH | V_th1 = VTL | V_th2 = VTH | V_th1 = VTH | V_th2 = VTL |
| generation of sensing currents $I_{SL}$[m], $I_{SL'}$[m] | VL < VTL, no $I_{SL}$[3] exists | VL < VTH, no $I_{SL'}$[3] exists | VL < VTL, no $I_{SL}$[2] exists | VL < VTH, no $I_{SL'}$[2] exists | VL < VTH, no $I_{SL}$[1] exists | VL < VTL, no $I_{SL'}$[1] exists |
| comparison result | None of $I_{SL}$[3] and $I_{SL'}$[3] is generated →srchBIT[3] = stoBIT(3, n) | | None of $I_{SL}$[2] and $I_{SL'}$[2] is generated →srchBIT[2] = stoBIT(2, n) | | None of $I_{SL}$[1] and $I_{SL'}$[1] is generated →srchBIT[1] = stoBIT(1, n) | |

Figure 7A:
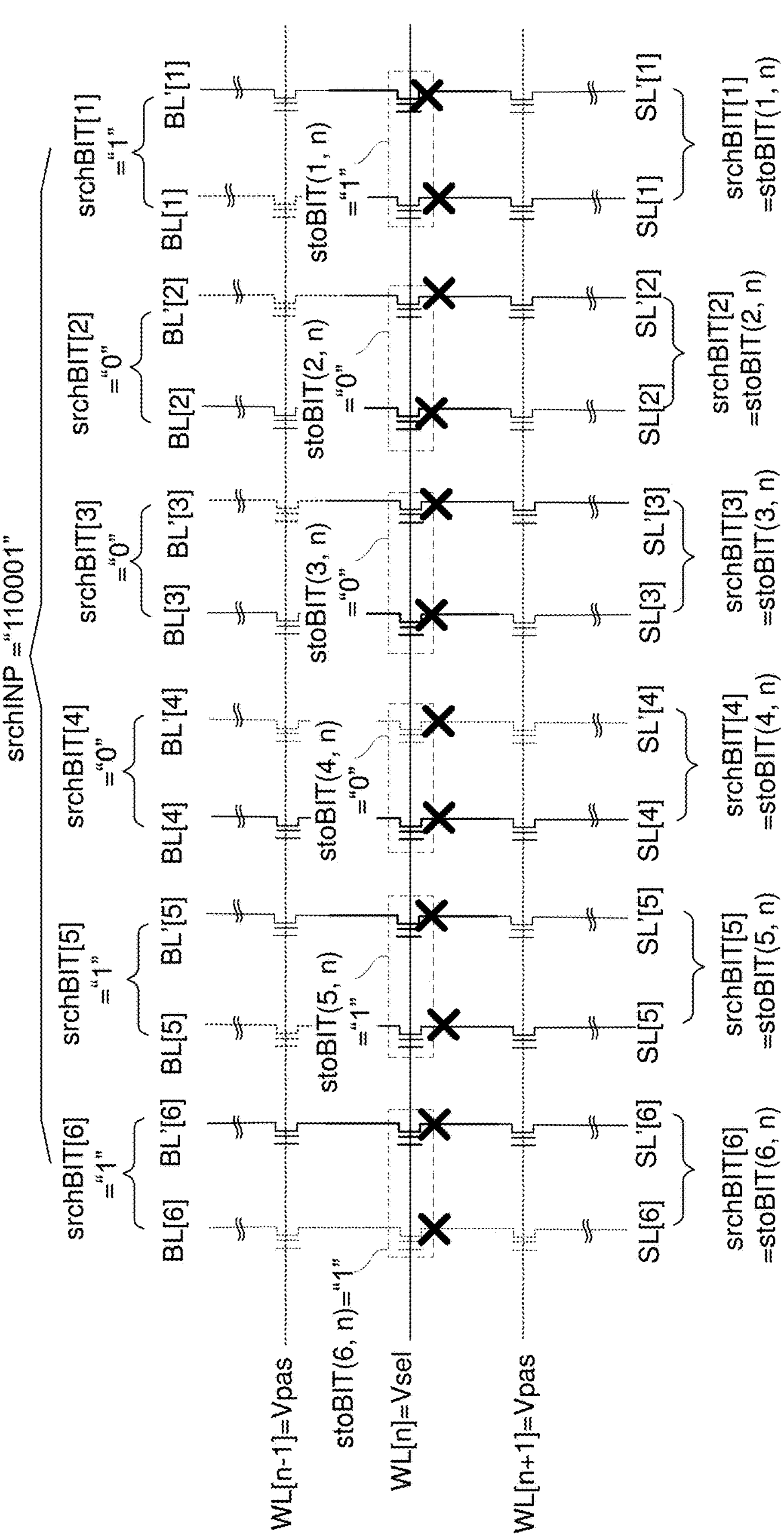
FIGS. 7A~7C are schematic diagrams illustrating the exemplary scenarios when the search input srchINP is determined as being matched with the in-memory data stoDAT[n].
Figure 7B:
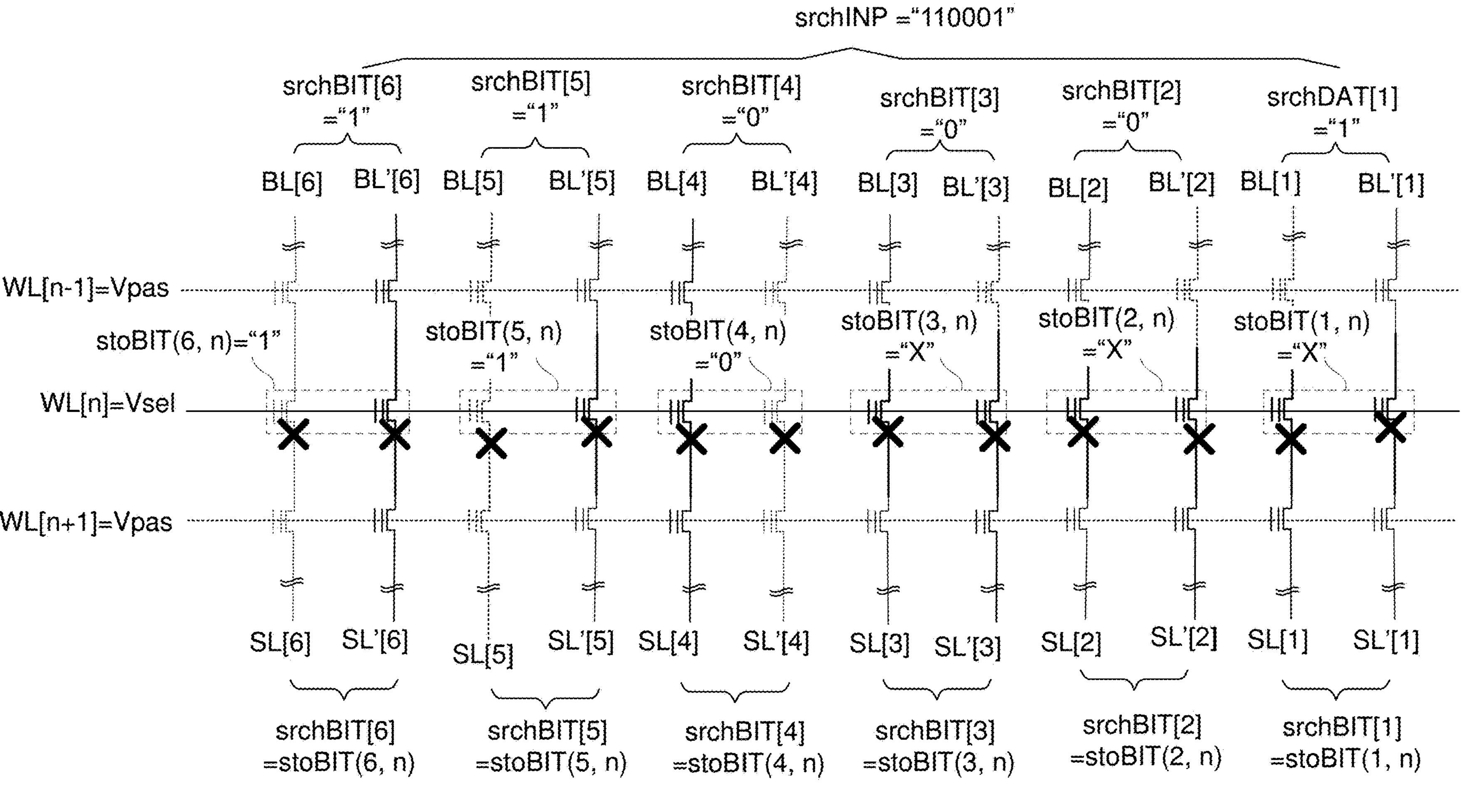
Figure 7C:
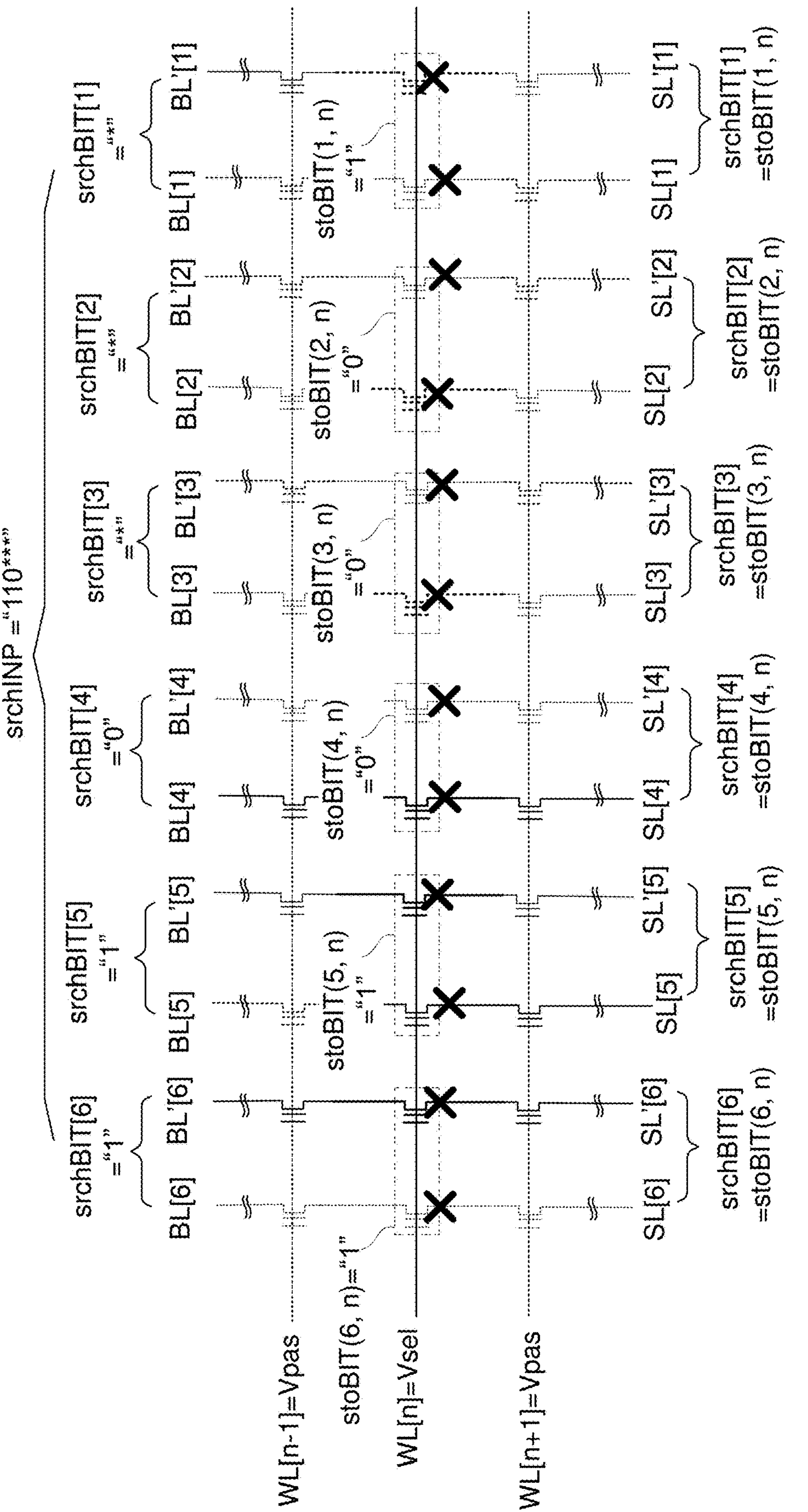

FIGS. 7A~7C are schematic diagrams illustrating the exemplary scenarios when the search input srchINP is determined as being matched with the in-memory data stoDAT. In FIGS. 7A~7C, none of the first sensing currents $I_{SL}$[1]~$I_{SL}$[6] and the second sensing currents $I_{SL'}$[1]~$I_{SL'}$[6] is generated. The equality between the search bits srchBIT [1]~srchBIT[6] and the in-memory bits stoBIT[1]~stoBIT [6] are respectively confirmed because there is no first sensing currents $I_{SL}$[1]~$I_{SL}$[6] nor the second sensing currents $I_{SL'}$[1]~$I_{SL'}$[6].

In FIG. 7A, it is assumed that the search input srchINP is “110001b”, and the in-memory data stoDAT[n] is “110001b”. That is, srchINP=“110001b”=49(D), and stoDAT[n]=“110001b”=49(D). Thus, each of the M search bits srchBIT[1]~srchBIT[6] is identical to each of the M in-memory bits stoBIT[1]~stoBIT[6]. That is, srchBIT[1]=stoBIT(1, n), srchBIT[2]=stoBIT(2, n), srchBIT[3]=stoBIT(3, n), srchBIT[4]=stoBIT(4, n), srchBIT[5]=stoBIT(5, n), and srchBIT[6]=stoBIT(6, n). The circuit behavior shown in FIG. 7A are listed in Table 6A. Please refer to FIG. 7A and Table 6A together.

FIG. 7A is an exemplary scenario showing that all the M bits of the search input srchINP are completely identical to the M bits of the in-memory data stoDAT[n]. According to the embodiment of the present disclosure, such a scenario is defined as an “exact match”.

In FIG. 7B, it is assumed that the search input srchINP is “110001b”, and the in-memory data stoDAT[n] is “110XXXb”. That is, srchINP=“110001b”=49(D), and stoDAT[n]=“110XXXb”=48~55(D). Unlike FIG. 7A that each of the M search bits srchBIT[1]~srchBIT[6] is exactly identical to each of the M in-memory bits stoBIT[1]~stoBIT [6], only the m-th (m=4~6) search bits srchBIT[4]~srchBIT [6] are exactly identical to the m-th (m=1~3) in-memory bits stoBIT[4]~stoBIT[6] in FIG. 7B. Whereas, the m-th (m=1~3) search bits srchBIT[1]~srchBIT[3] are not exactly identical to the m-th (m=1~3) in-memory bits stoBIT[1] ~stoBIT[3].

Although the m-th (m=1~3) search bits srchBIT[1]~srchBIT[3] are not exactly identical to the m-th (m=1~3) in-memory bits stoBIT[1]~stoBIT[3], the search bits srchBIT

[1]~srchBIT[3] are considered as being equivalent to the in-memory bits stoBIT[1]~stoBIT[3]. Thus, srchBIT[1] =stoDAT(1, n), srchBIT[2]=stoDAT(2, n), srchBIT[3]=stoDAT(3, n), srchBIT[4]=stoDAT(4, n), srchBIT[5]=stoDAT (5, n), and srchBIT[6]=stoDAT(6, n). The circuit behavior shown in FIG. 7B are listed in Table 6B. Please refer to FIG. 7B and Table 6B together.

FIG. 7B is an exemplary scenario showing that some of the in-memory bits stoBIT[1]~stoBIT[3] are set as "don't care" bits so that the M bits of the search input srchINP are still considered as being equivalent to the M bits of in-memory data stoDAT[n]. According to the embodiment of the present disclosure, such a scenario is defined as a "range match".

In FIG. 7C, it is assumed that the search input srchINP is "110XXXb", and the in-memory data stoDAT[n] is "110001b". That is, srchINP="110XXXb"=48~55(D), and stoDAT[n]="110001b"=49(D). Unlike FIG. 7A that each of the M=6 search bits srchBIT[1]~srchBIT[6] is exactly identical to each of the M=6 in-memory bits stoBIT[1]~stoBIT [6], only the m-th (m=4~6) search bits srchBIT[4]~srchBIT [6] are exactly identical to the m-th (m=4~6) in-memory bits stoBIT[4]~stoBIT[6] in FIG. 7C. Whereas the m-th (m=1~3) search bits srchBIT[1]~srchBIT[3] are not exactly identical to the m-th (m=1~3) in-memory bits stoBIT[1] ~stoBIT[3].

Although the m-th (m=1~3) srchBIT[1]~srchBIT[3] are not exactly identical to the m-th (m=1~3) in-memory bits stoBIT[1]~stoBIT[3], the search bits srchBIT[1]~srchBIT [3] are still considered as being equivalent to the in-memory y bits stoBIT[1]~stoBIT[3]. Thus, srchBIT[1]=stoBIT(1, n), srchBIT[2]=stoBIT(2, n), srchBIT[3]=stoBIT(3, n), srchBIT [4]=stoBIT(4, n), srchBIT[5]=stoBIT(5, n), and srchBIT[6] =stoBIT(6, n). The circuit behavior shown in FIG. 7C is listed in Table 6C. Please refer to FIG. 7C and Table 6C together.

FIG. 7C is an exemplary scenario showing that some of the search bits srchBIT[1]~srchBIT[3] are set as wildcard ("*") bits so that the M bits of the search input srchINP are still considered equivalent to the in-memory data stoDAT [n]. According to the embodiment of the present disclosure, such a scenario is defined as a "range search".

TABLE 6A

FIG. 7A, srchINP = "110001b" = 49(D), and stoDAT[n] = "110001b" = 49(D).

| | bit-position | | | | | |
|---|---|---|---|---|---|---|
| | m = 6 | | m = 5 | | m = 4 | |
| srchBIT[m] | 1 | | 1 | | 0 | |
| search voltages applied to BL[m], BL'[m] | VL | VH | VL | VH | VH | VL |
| stoBIT(m, n) | 1 | | 1 | | 0 | |
| threshold voltages of transistors T1 and T2 | V_th1 = VTL | V_th2 = VTH | V_th1 = VTL | V_th2 = VTH | V_th1 = VTH | V_th2 = VTL |
| generation of sensing currents $I_{SL}$[m], $I_{SL'}$[m] | VL < VTL, no $I_{SL}$[6] exists | VH < VTH, no $I_{SL'}$[6] exists | VL < VTL, no $I_{SL}$[5] exits | VH < VTH, no $I_{SL'}$[5] exits | VH < VTH, no $I_{SL}$[4] exits | VL < VTL, no $I_{SL'}$[4] exits |
| comparison result | None of $I_{SL}$[6] and $I_{SL'}$[6] is generated →srchBIT[6] = stoBIT[6] | | None of $I_{SL}$[5] and $I_{SL'}$[5] is generated →srchBIT[5] = stoBIT[5] | | None of $I_{SL}$[4] and $I_{SL'}$[4] is generated srchBIT[4] = stoBIT(4, n) | |

| | bit-position | | | | | |
|---|---|---|---|---|---|---|
| | m = 3 | | m = 2 | | m = 1 | |
| srchBIT[m] | 0 | | 0 | | 1 | |
| search voltages applied to BL[m], BL'[m] | VH | VL | VH | VL | VL | VH |
| stoBIT(m, n) | 0 | | 0 | | 1 | |
| threshold voltages of transistors T1 and T2 | V_th1 = VTH | V_th2 = VTL | V_th1 = VTH | V_th2 = VTL | V_th1 = VTL | V_th2 = VTH |
| generation of sensing currents $I_{SL}$[m], $I_{SL'}$[m] | VH < VTH, no $I_{SL}$[3] exists | VL < VTL, no $I_{SL'}$[3] exits | VH < VTH, no $I_{SL}$[2] exits | VL < VT, $I_{SL'}$[2] exits | VL < VTL, no $I_{SL}$[1] exits | VH < VTH, no $I_{SL'}$[1] exits |
| comparison result | None of $I_{SL}$[3] and $I_{SL'}$[3] is generated →srchBIT[3] ≠ stoBIT(3, n) | | None of $I_{SL}$[2] and $I_{SL'}$[2] is generated →srchBIT[2] ≠ stoBIT(2, n) | | None of $I_{SL}$[1] and $I_{SL'}$[1] is generated →srchBIT[1] ≠ stoBIT(1, n) | |

TABLE 6B

| FIG. 7B, srchINP = "110001b" = 49(D), and stoDAT[n] = "110XXXb" = 48~55(D) | | | | | | |
|---|---|---|---|---|---|---|
| | bit-position | | | | | |
| | m = 6 | | m = 5 | | m = 4 | |
| srchBIT[m] | 1 | | 1 | | 0 | |
| search voltages applied to BL[m], BL'[m] | VL | VH | VL | VH | VH | VL |
| stoBIT(m, n) | 1 | | 1 | | 0 | |
| threshold voltages of transistors T1 and T2 | V_th1 = VTL | V_th2 = VTH | V_th1 = VTL | V_th2 = VTH | V_th1 = VTH | V_th2 = VTL |
| generation of sensing currents $I_{SL}$[m], $I_{SL'}$[m] | VL < VTL, no $I_{SL}$[6] exists | VH < VTH, no $I_{SL'}$[6] exists | VL < VTL, no $I_{SL}$[5] exits | VH < VTH, no $I_{SL'}$[5] exists | VH < VTH, no $I_{SL}$[4] exists | VL < VTL, no $I_{SL'}$[4] exists |
| comparison result | None of $I_{SL}$[6] and $I_{SL'}$[6] is generated →srchBIT[6] = stoBIT[6] | | None of $I_{SL}$[5] and $I_{SL'}$[5] is generated → srchBIT[5] = stoBIT(5, n) | | None of $I_{SL}$[4] and $I_{SL'}$[4] is generated →srchBIT[4] = stoBIT(4, n) | |
| | bit-position | | | | | |
| | m = 3 | | m = 2 | | m = 1 | |
| srchBIT[m] | 0 | | 0 | | 1 | |
| search voltages applied to BL[m], BL'[m] | VL | VH | VL | VH | VH | VL |
| stoBIT(m, n) | X | | X | | X | |
| threshold voltages of transistors T1 and T2 | V_th1 = VTH | V_th2 = VTH | V_th1 = VTH | V_th2 = VTH | V_th1 = VTH | V_th2 = VTH |
| generation of sensing currents $I_{SL}$[m], $I_{SL'}$[m] | VL < VTH, no $I_{SL}$[3] exists | VH < VTH, no $I_{SL'}$[3] exists | VL < VTH, no $I_{SL'}$[2] exists | VH < VTH, no $I_{SL'}$[2] exists | VH < VTH, no $I_{SL}$[1] exists | VL < VTH, no $I_{SL'}$[1] exists |
| comparison result | None of $I_{SL}$[3] and $I_{SL'}$[3] is generated →srchBIT[3] = stoBIT(3, n) | | None of $I_{SL}$[2] and $I_{SL'}$[2] is generated →srchBIT[2] = stoBIT(2, n) | | None of $I_{SL}$[1] and $I_{SL'}$[1] is generated →srchBIT[1] = stoBIT(1, n) | |

TABLE 6C

| FIG. 7C, srchINP = "110XXXb" = 48~55(D), and stoDAT[n] = "110001b" = 49(D) | | | | | | |
|---|---|---|---|---|---|---|
| | bit-position | | | | | |
| | m = 6 | | m = 5 | | m = 4 | |
| srchBIT[m] | 1 | | 1 | | 0 | |
| search voltages applied to BL[m], BL'[m] | VL | VH | VL | VH | VH | VL |
| stoBIT(m, n) | 1 | | 1 | | 0 | |
| threshold voltages of transistors T1 and T2 | V_th1 = VTL | V_th2 = VTH | V_th1 = VTL | V_th2 = VTH | V_th1 = VTH | V_th2 = VTL |
| generation of sensing currents $I_{SL}$[m], $I_{SL'}$[m] | VL < VTL, no $I_{SL}$[6] exists | VH < VTH, no $I_{SL'}$[6] exists | VL < VTL, no $I_{SL}$[5] exits | VH < VTH, no $I_{SL'}$[5] exists | VH < VTH, no $I_{SL}$[4] exists | VL < VTL, no $I_{SL'}$[4] exists |
| comparison result | None of $I_{SL}$[6] and $I_{SL'}$[6] is generated →srchBIT[6] = stoBIT[6] | | None of $I_{SL}$[5] and $I_{SL'}$[5] is generated → srchBIT[5] = stoBIT(5, n) | | None of $I_{SL}$[4] and $I_{SL'}$[4] is generated →srchBIT[4] = stoBIT(4, n) | |
| | bit-position | | | | | |
| | m = 3 | | m = 2 | | m = 1 | |
| srchBIT[m] | * | | * | | * | |
| search voltages applied to BL[m], BL'[m] | VL | VL | VL | VL | VL | VL |
| stoBIT(m, n) | 0 | | 0 | | 1 | |
| threshold voltages of transistors T1 and T2 | V_th1 = VTH | V_th2 = VTL | V_th1 = VTH | V_th2 = VTL | V_th1 = VTL | V_th2 = VTH |

TABLE 6C-continued

| FIG. 7C, srchINP = "110XXXb" = 48~55(D), and stoDAT[n] = "110001b" = 49(D) | | | | | | |
|---|---|---|---|---|---|---|
| generation of sensing currents $I_{SL}$[m], $I_{SL'}$[m] | VL < VTH, no $I_{SL}$[3] exists | VL < VTL, no $I_{SL'}$[3] exists | VL < VTH, no $I_{SL'}$[2] exists | VL < VTL, no $I_{SL}$[2] exists | VL < VTL, no $I_{SL}$[1] exists | VL < VTH, no $I_{SL'}$[1] exists |
| comparison result | None of $I_{SL}$[3] and $I_{SL'}$[3] is generated →srchBIT[3] = stoBIT(3, n) | | None of $I_{SL}$[2] and $I_{SL'}$[2] is generated →srchBIT[2] = stoBIT(2, n) | | None of $I_{SL}$[1] and $I_{SL'}$[1] is generated →srchBIT[1] = stoBIT(1, n) | |

The examples shown in FIGS. 7A~7C demonstrates various scenarios when the search input srchINP is considered as being equivalent to the in-memory data stoDAT[n]. Please note that the equivalence between the search input srchINP and the in-memory data stoDAT[n] does not require that all the M bits of the search input srchINP are completely identical to the M bits of the in-memory data stoDAT[n] because the search input srchINP may include one or more wildcard ("*") bits, and the in-memory data stoDAT[n] may include one or more don't care ("X") bits.

Figure 8A:
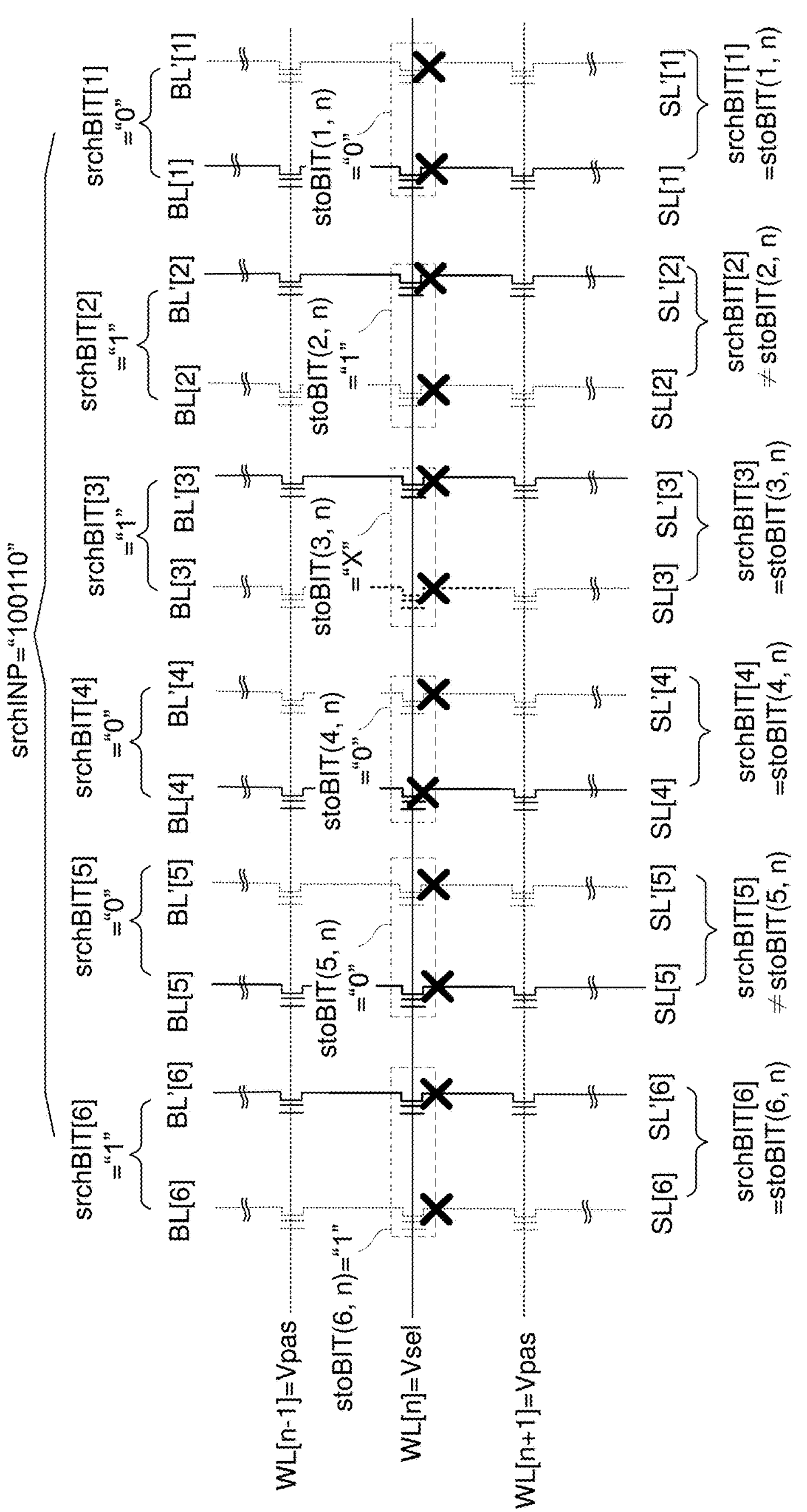
FIGS. 8A and 8B are schematic diagrams illustrating how the data match/mismatch comparisons between the in-memory data stoDAT[n] and the search input srchINP are performed when one or more in-memory bits stoBIT(m, n) are don't care ("X") bits.
Figure 8B:
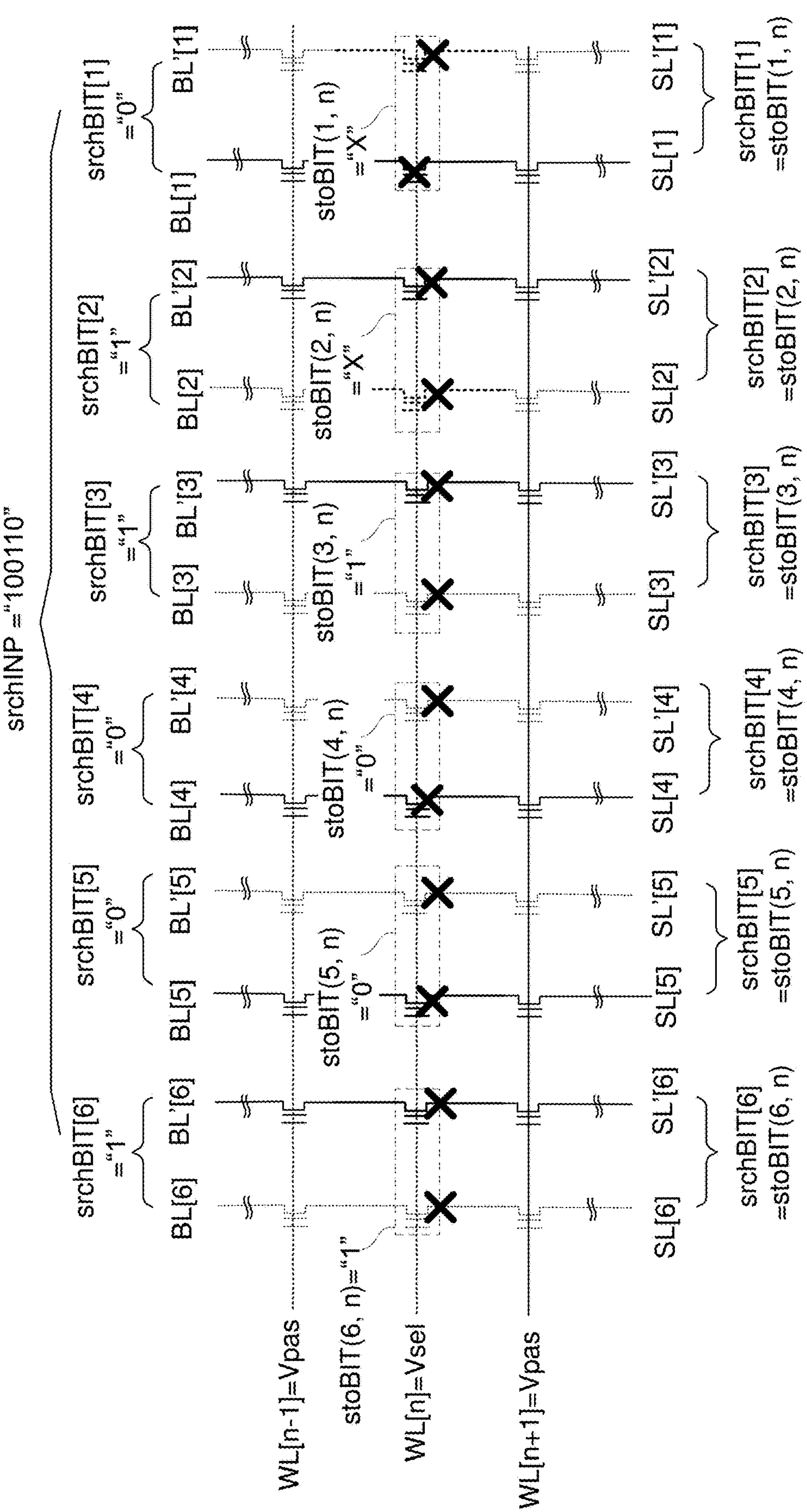

According to the embodiment of the present disclosure, any of the M in-memory bits stoBIT(1, n)~stoBIT(M, n) can be a don't care ("X") bit. The number of in-memory bits stoBIT(1, n)~stoBIT(M, n) being set as don't care ("X") bits is not limited. FIGS. 8A and 8B are schematic diagrams illustrating how the comparisons between the in-memory data stoDAT[n] and the search input srchINP are performed when one or more in-memory bit stoBIT(m, n) are don't care ("X") bits. FIGS. 8A and 8B demonstrate that the in-memory data stoDAT[n] can represent multiple stored values by setting one or more in-memory bits stoBIT(m, n) as don't care ("X") bits.

In FIG. 8A, the search input srchINP is "100110b"=34 (D), and the in-memory data stoDAT[n] is "100X10b". Then, the search input srchINP="100110b"=38(D) and the in-memory data stoDAT[n]="100X10b" are compared. Please note that the in-memory data stoDAT[n] is not a specific value.

As the in-memory bit stoBIT[3] is a "don't care ("X") bit", it implies that the stored value can be "100010b"=34 (D) or "100110b"=38(D). When the in-memory data stoDAT [n] represents the stored value as "100010b"=34(D), it is identical to the search input srchINP="100110b"=34(D). Thus, the search input srchINP="100110b" is considered as being equivalent to the in-memory data stoDAT[n]= "100X10b".

In FIG. 8B, the search input srchINP is "100110b"=38(D), and the in-memory data stoDAT[n] is "1001XXb". That is, srchINP="100110b"=38(D), and stoDAT[n]="1001XXb". Then, the search input srchINP="100110b"=38(D) and the in-memory data stoDAT[n]="1001XXb" are compared. As the in-memory bits stoBIT[1], stoBIT[2] are don't care ("X") bits, the in-memory data stoDAT[n] can be "100100b"=36(D), "100101b"=37(D), "100110b"=38(D), or "100111b"=39(D). In other words, the in-memory data stoDAT[n] is not a specific stored value but a range of stored values between 36~39 in decimal.

When the in-memory bits stoBIT[1], stoBIT[2] are "don't care (X)" bits, the in-memory data stoDAT[n] can represent stored values 36(D)~39(D). As long as one of the possible stored values (36(D)~39(D)) is equivalent to the search value "100110b"=38(D), the search input srchINP="100110b" is considered as being equivalent to the in-memory data stoDAT[n]="1001XXb".

Figure 9A:
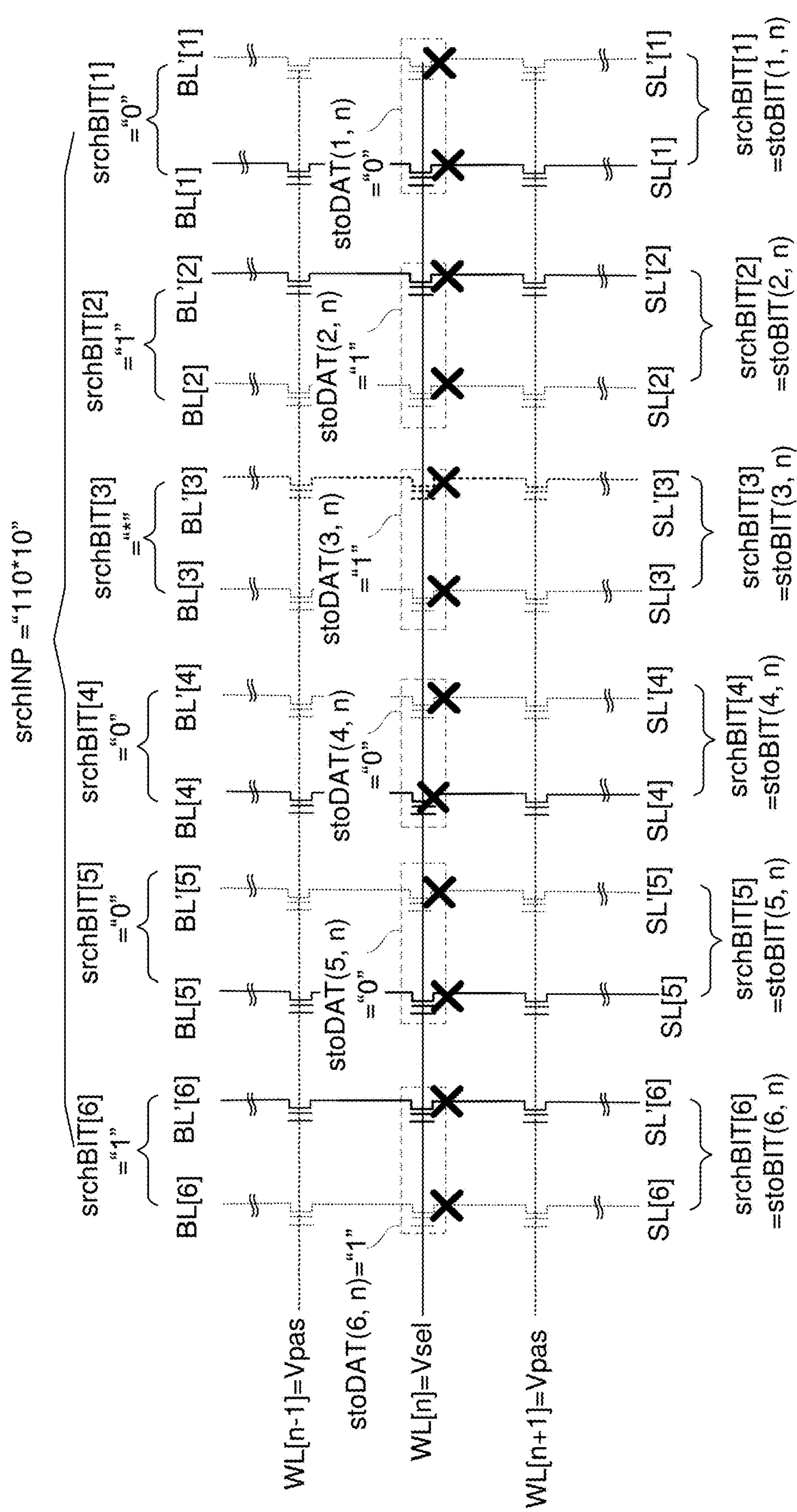
FIGS. 9A and 9B are schematic diagrams illustrating how the data match/mismatch comparisons between the in-memory data stoDAT[n] and the search input srchINP are performed when one or more search bits srchBIT[1]~srchBIT[M] are wildcard ("*") bits.
Figure 9B:
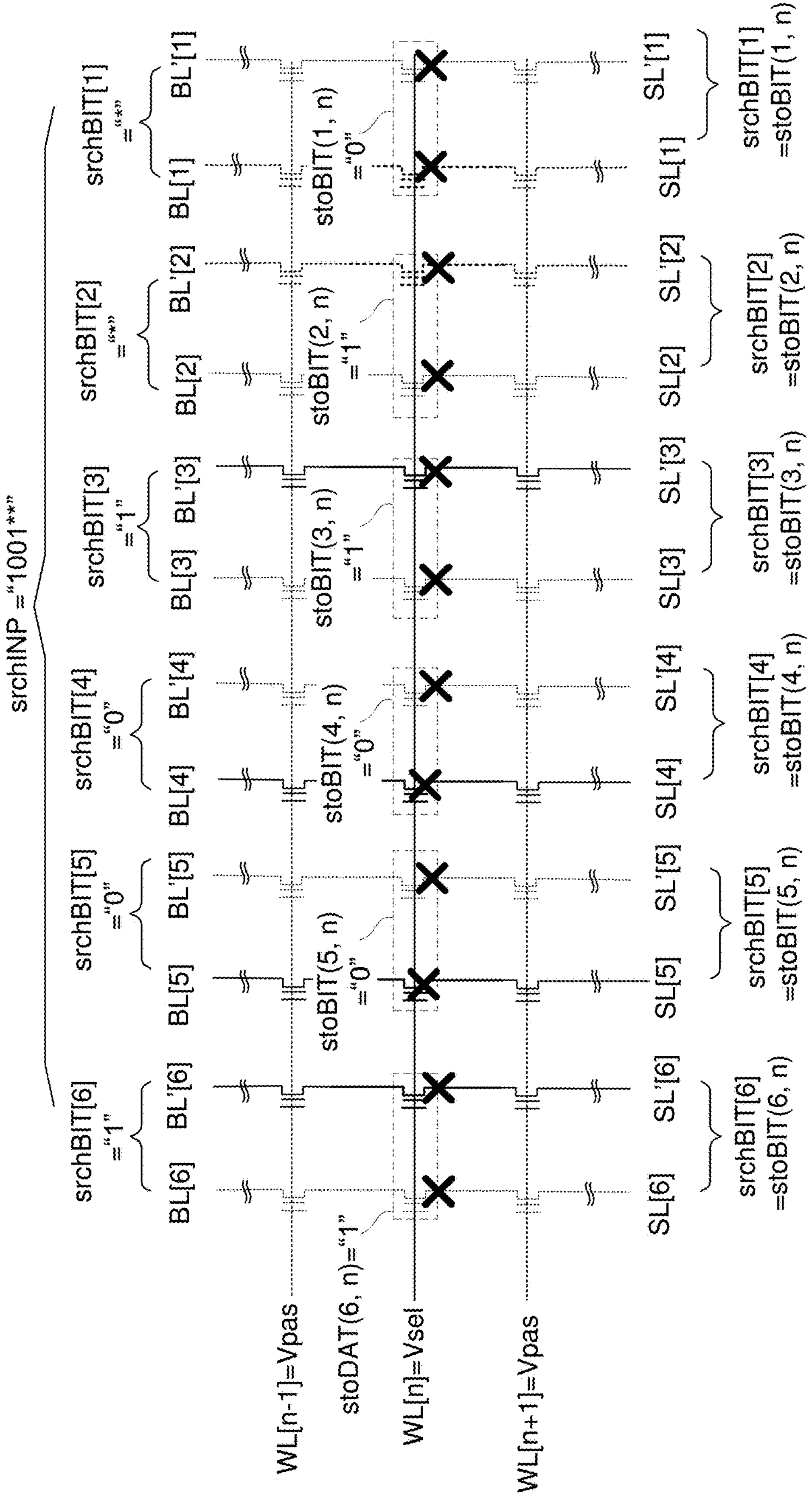

According to FIG. 9B, when the in-memory data stoDAT [n] includes one or more don't care ("X") bits, the in-memory data stoDAT[n] corresponds to multiple stored values. Furthermore, if the one or more in-memory bits inBIT(m, n) being set as don't care ("X") bits include the least significant bit (hereinafter, LSB), the multiple stored values are continuous. That is, the in-memory data stoDAT [n] covers a range of stored values if its LSB is a wildcard ("*") bit. Then, the comparison between the search input srchINP and the in-memory data stoDAT[n] becomes a range match.

According to the embodiment of the present disclosure, any of the M search bits srchBIT[1]~srchBIT[M] can be a wildcard ("*") bit, regardless of its bit-position. Moreover, the number of search bits srchBIT[m] being set as wildcard ("*") bits is not limited. FIGS. 9A and 9B are schematic diagrams illustrating how the comparisons between the in-memory data stoDAT[n] and the search input srchINP are performed when one or more search bits srchBIT[1]~srchBIT[M] are wildcard ("*") bits. FIGS. 9A and 9B demonstrate that the search input srchINP can represent multiple search values by setting one or more search bits srchBIT[m] as wildcard ("*") bits.

In FIG. 9A, the search input srchINP is "100*10b", and the in-memory data stoDAT[n] is "100110b". Then, the search input srchINP="100*10b" and the in-memory data stoDAT[n]="100110b"=38(D) are compared. Please note that the search input srchINP is not a specific value.

As the search bit srchBIT[3] is a wildcard ("*") bit, it implies that the search value can be "100010b"=34(D) or "100110b"=38(D). When the search input srchINP represents the search value as "100010b"=34(D), it is identical to the in-memory data stoDAT[n]="100110b". Thus, the search input srchINP=100*10b" is considered as being equivalent to the in-memory data stoDAT[n]="100110b".

In FIG. 9B, the search input srchINP is "1001b", and the in-memory data stoDAT[n] is "100110b". Then, the search input srchINP="1001" and the in-memory data stoDAT[n]="100110b"=38(D) are compared. As the search bits srchBIT[1], srchBIT[2] are wildcard ("*") bits, the search value can be "100100b"=36(D), "100101b"=37(D), "100110b"=38(D), or "100111b"=39(D). In other words, the search input srchINP is not a specific search value but a range of search values between 36~39 in decimal.

When the search bits srchBIT[1], srchBIT[2] are "wildcard (*)" bits, the search input srchINP can represent search values 36(D)~39(D). As long as one of the possible search values (38(D) in 36(D)~39(D)) is equivalent to the in-memory data stoDAT[n]="100110b"=38(D), the search input srchINP="1001**b" is considered as being equivalent to the in-memory data stoDAT[n]="100110b".

According to FIG. 9B, when the search input srchINP includes one or more wildcard ("*") bits, the search input srchINP corresponds to multiple search values. Furthermore, if one or more search bits srchBIT[m] being set as wildcard ("*") bits include the least significant bit (hereinafter, LSB), the multiple search values are continuous. That is, the search input srchINP covers a range of search values if its LSB is a wildcard ("*") bit. Then, the comparison between the search input srchINP and the in-memory data stoDAT[n] becomes a range search.

The examples shown in FIGS. 8-9 demonstrate that the comparisons between the search input srchINP and the in-memory data stoDAT[n] can be performed flexibly. In FIGS. 8A and 8B, the search input srchINP="100110b"=38 (D) are compared with the in-memory data stoDAT[n] having one or more in-memory bits bit stoBIT(m, n) being set as don't care "X". In FIGS. 9A and 9B, the search input srchINP having one or more search bits srchBIT[m] being set as wildcard ("*") bit are compared with the in-memory data stoDAT[n]="100110b"=38(D).

Consequentially, the search input srchINP is not required to be a fixed value, nor is the in-memory data stoDAT[n]. In other words, the comparisons between the search input srchINP and the in-memory data stoDAT[n] have a certain range of flexibility. In practical applications, such flexibility can be freely adapted to suit the features of the search input srchINP and the in-memory data stoDAT[n].

In short, according to the amount of the sensing currents $I_{SL}[1]$~$I_{SL}[M]$, $I_{SL'}[1]$~$I_{SL'}[M]$, the sensing circuit 101*g* could report the data match/mismatch between the search input srchINP and the in-memory data stoDAT[n] stored at the memory cells MC(1, n)~MC(M, n) located at the n-th row to the memory controller 101*a*. Please note that the data match/mismatch comparison does not require reading out the in-memory data stoDAT[n] nor gradually comparing each of the M bits. Instead, the data match/mismatch comparison is performed by a row-based read operation. With the row-based read operation, the equalities/inequalities between the M search bits srchBIT[1]~srchBIT[m] and the M in-memory bits stoDAT(1, n)~stoDAT(M, n) are identified in parallel.

Based on the illustrations above, in a case where the sensing circuit 101*g* reports to the memory controller 101*a* that none of the sensing current $I_{SL}[1]$~$I_{SL}[M]$, $I_{SL'}[1]$~$I_{SL'}[M]$ is generated, the memory controller 101*a* can conclude that the in-memory data stoDAT[n] is equivalent to the search input srchINP. That is, stoDAT[n]=srchINP.

In a case that the sensing circuit 101*g* reports to the memory controller 101*a* that one of the sensing current $I_{SL}[1]$~$I_{SL}[M]$, $I_{SL'}[1]$~$I_{SL'}[M]$ is generated, the memory controller 101*a* can conclude that one of the in-memory bits stoBIT(1, n)~stoBIT(M, n) is different from it corresponding bit in the search input srchINP. For example, if the sensing circuit 101*g* reports to the memory controller 101*a* that the sensing current $I_{SL}[m]$ is generated, the memory controller 101*a* is aware that the in-memory bit stoBIT(m, n) of the memory cell MC(m, n) is different from the m-th search bit srchBIT[m] of the search input srchINP [m]. Accordingly, the search input srchINP is different from the in-memory data stoDAT[n]. That is, stoDAT[n]#srchINP.

In practical applications, the sensing circuit 101*g* can be considered as an interface circuit that transforms the current detecting results of the sensing currents $I_{SL}[1]$~$I_{SL}[M]$, $I_{SL'}[1]$~$I_{SL'}[M]$ to the sensing circuit output senOUT. Then, the memory controller 101*a*. FIGS. 10-17 are examples showing some exemplary implementations of the sensing circuit 101*g*. As shown in these drawings, the implementation and usage of the sensing circuit 101*g* are flexible.

According to the embodiments of the present disclosure, after collecting all the statuses of the M*2 sensing currents $I_{SL}[1]$~$I_{SL}[M]$, $I_{SL'}[1]$~$I_{SL'}[M]$, the sensing circuit output senOUT can be represented as a single value (see FIGS. 10, 11A, 11B, 13, 15, and 17). Alternately, the sensing circuit output senOUT can be represented as M*2 bits (see FIG. 12) or a binary number with M bit-length (see FIGS. 16A, and 16B). Furthermore, in a case that the search input srchINP is divided into P partitioned search inputs, the sensing circuit output senOUT can be used to indicate one of the P partitioned search inputs srchPTN_1~srchPTN_P (see FIG. 14). Please note that the descriptions in FIGS. 3~9 regarding the data match/mismatch comparisons can be freely applied to the sensing circuits described in FIGS. 10~17.

Figure 10:
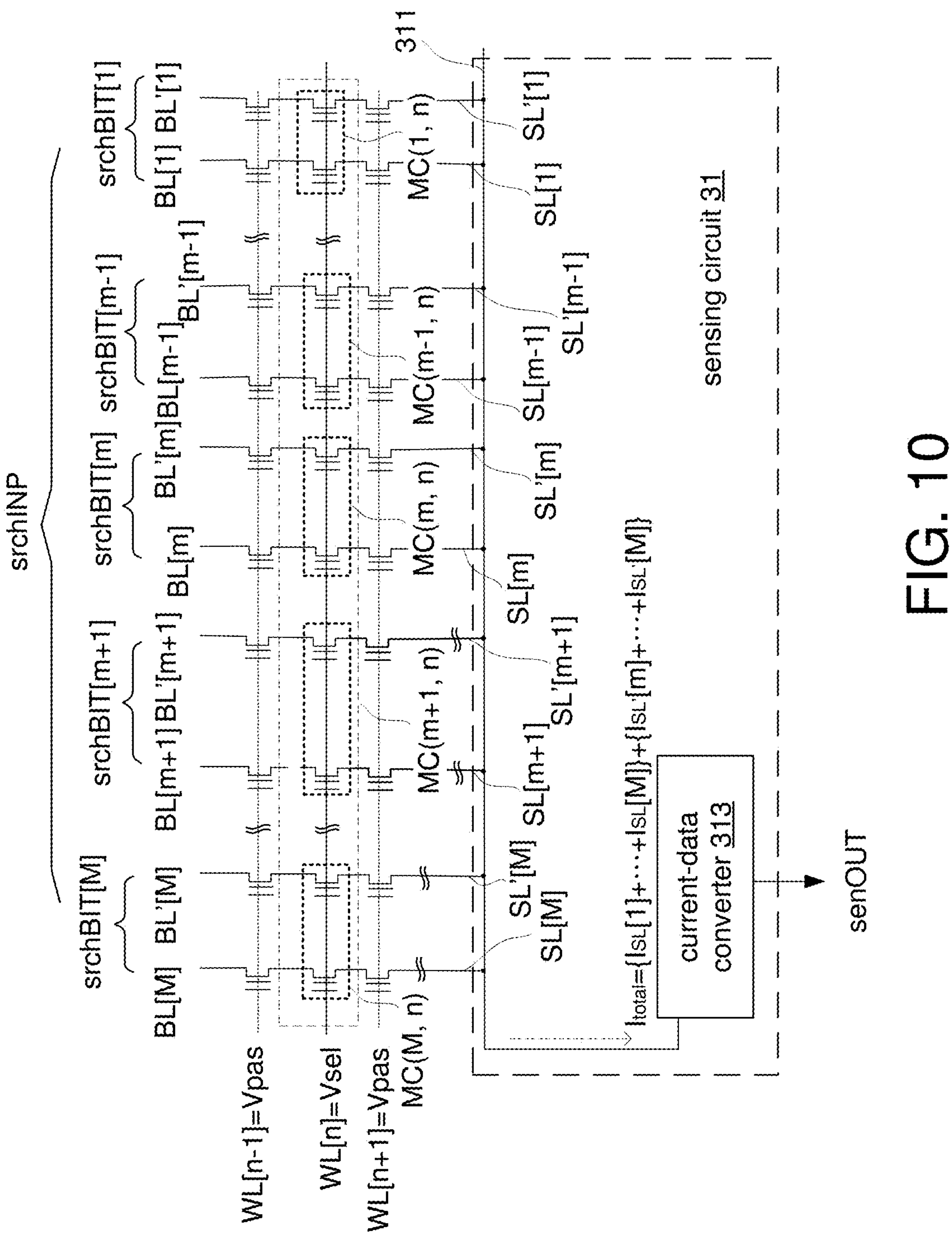
FIG. 10 is a schematic diagram illustrating the sensing circuit according to an embodiment of the present disclosure that includes a current collector for collecting the M first sensing currents $I_{SL}$[1]~$I_{SL}$[M] and the M second sensing currents $I_{SL'}$[1]~$I_{SL'}$[m], and a current-data converter for converting the collected total current $I_{total}$ to the counted comparison result cmpRlt_CNT.

FIG. 10 is a schematic diagram illustrating the sensing circuit according to an embodiment of the present disclosure that includes a current collector for collecting the sensing current(s) $I_{SL}[1]$~$I_{SL}[M]$, $I_{SL'}[1]$~$I_{SL'}[m]$ and a current-data converter for converting the collected total current $I_{total}$ to the counted comparison result cmpRlt_CNT. In FIG. 10, the sensing circuit 31 includes a current collector 311 and a current-data converter 313. The current collector 311 can be, for example, a conductive wire that jointly collects the sensing current(s) $I_{SL}[1]$~$I_{SL}[M]$, $I_{SL'}[1]$~$I_{SL'}[m]$. The summation of the sensing currents $I_{SL}[1]$~$I_{SL}[M]$, $I_{SL'}[1]$~$I_{SL'}[m]$ actually generated and collected by the current collector 311 is defined as a total current $I_{total}$. The current collector 311 passes the total current $I_{total}$ to the current-data converter 313.

Then, the current-data converter 313 converts the total current $I_{total}$ to the sensing circuit output senOUT. In FIG. 10, the sensing circuit output senOUT represents a digitalized number representing the total current $I_{total}$. The current-data converter 313 can be, for example, an analog-to-digital converter (ADC). Consequentially, the value of the sensing circuit output senOUT is greater if more sensing currents are generated. Through the sensing circuit output senOUT, the memory controller 101*a* learns the amount of sensing currents $I_{SL}[1]$~$I_{SL}[M]$, $I_{SL'}[1]$~$I_{SL'}[m]$ generated.

None of the m-th first sensing currents $I_{SL}[m]$ and the m-th second $I_{SL'}[m]$ will generate if the comparison between the in-memory bit stoBIT(m, n) and the search bit srchBIT [m] shows that the in-memory bit stoBIT(m, n) and the search bit srchBIT[m] are equivalent (stoBIT(m, n)=srchBIT[m]). Only one of the m-th first sensing current $I_{SL}[m]$ and the m-th second sensing current $I_{SL'}[m]$ will generate if the comparison between the in-memory bit stoBIT(m, n) and the search bit srchBIT[m] shows that the in-memory bit stoBIT(m, n) and the search bit srchBIT[m] are not equivalent (stoBIT(m, n)/srchBIT[m]).

The number of the generated first/second sensing currents $I_{SL}[m]$, $I_{SL'}[m]$ (m=1~M) reflects the number of bits different in the search input srchINP and the in-memory data stoDAT [n]. Therefore, more first/second sensing currents $I_{SL}[m]$, $I_{SL'}[m]$ (m=1~M) are generated if there are more bit differences between the search input srchINP and the in-memory data stoDAT[n].

For the sake of illustration, it is assumed that the current value of any of the generated sensing currents $I_{SL}[1]$~$I_{SL}$ [M], $I_{SL'}[1]$~$I_{SL}[M]$ is equivalent to a preset sensed current value Isen. Then, in the case that all the M in-memory bits stoBIT(1, n)~stoBIT(M, n) are different from all the M search bits srchBIT[1]~srchBIT[M], the total current $I_{total}$ will be equivalent to M times of the preset sensed current value (M*Isen). That is, $I_{total}$=M*Isen. Therefore, it can be concluded that the maximum current value of the total current $I_{total}$_max is equivalent to M times of the preset sensed current value (M*Isen). That is, $I_{total\_max}$=M*Isen.

Figure 11A:
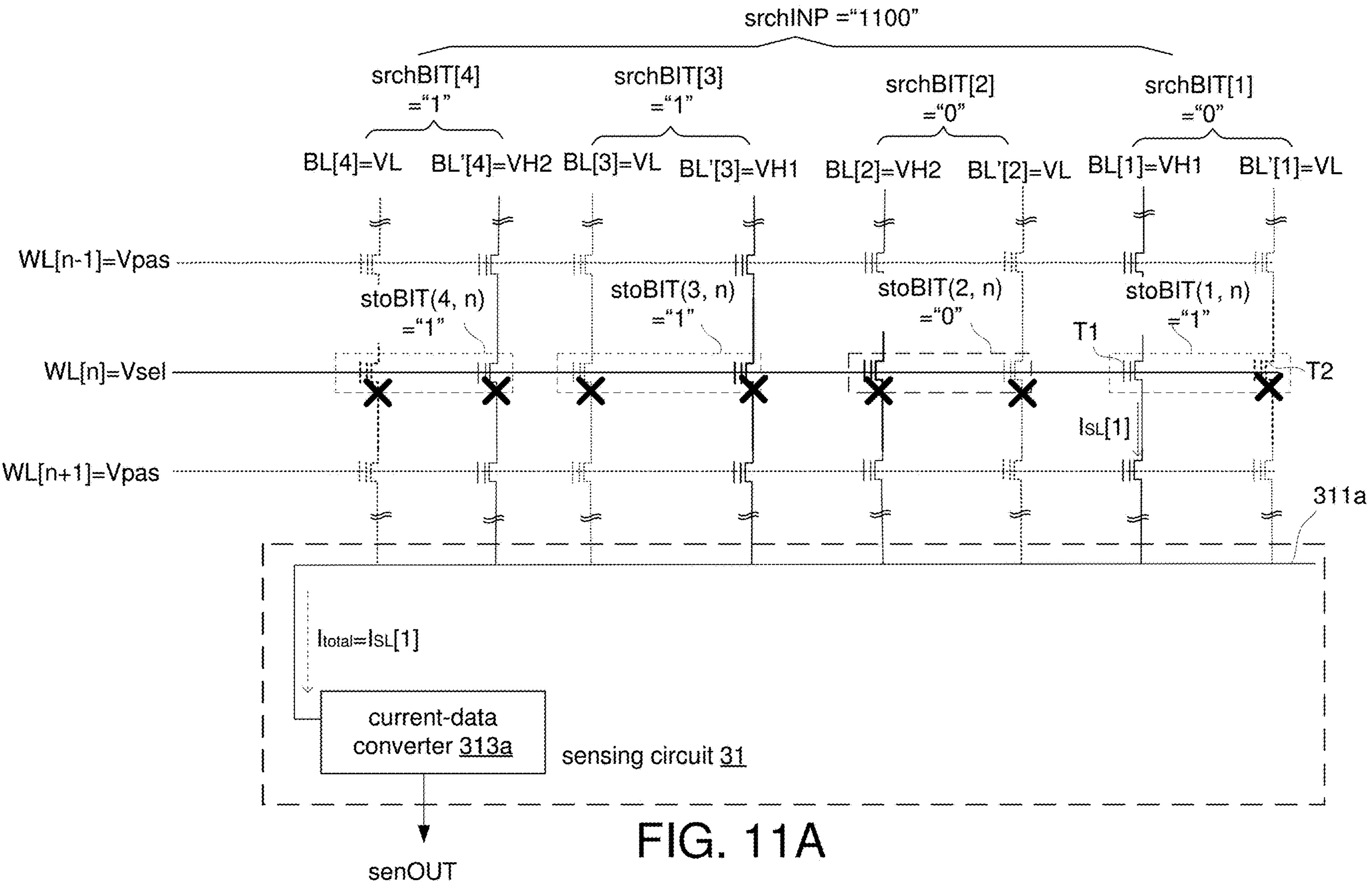
FIGS. 11A and 11B are schematic diagrams illustrating that different high search voltages VH=VH1 and VH=VH2 are assigned to the first/second bit-lines BL[m], BL'[m] at different bit-positions (m=1~M).
Figure 11B:
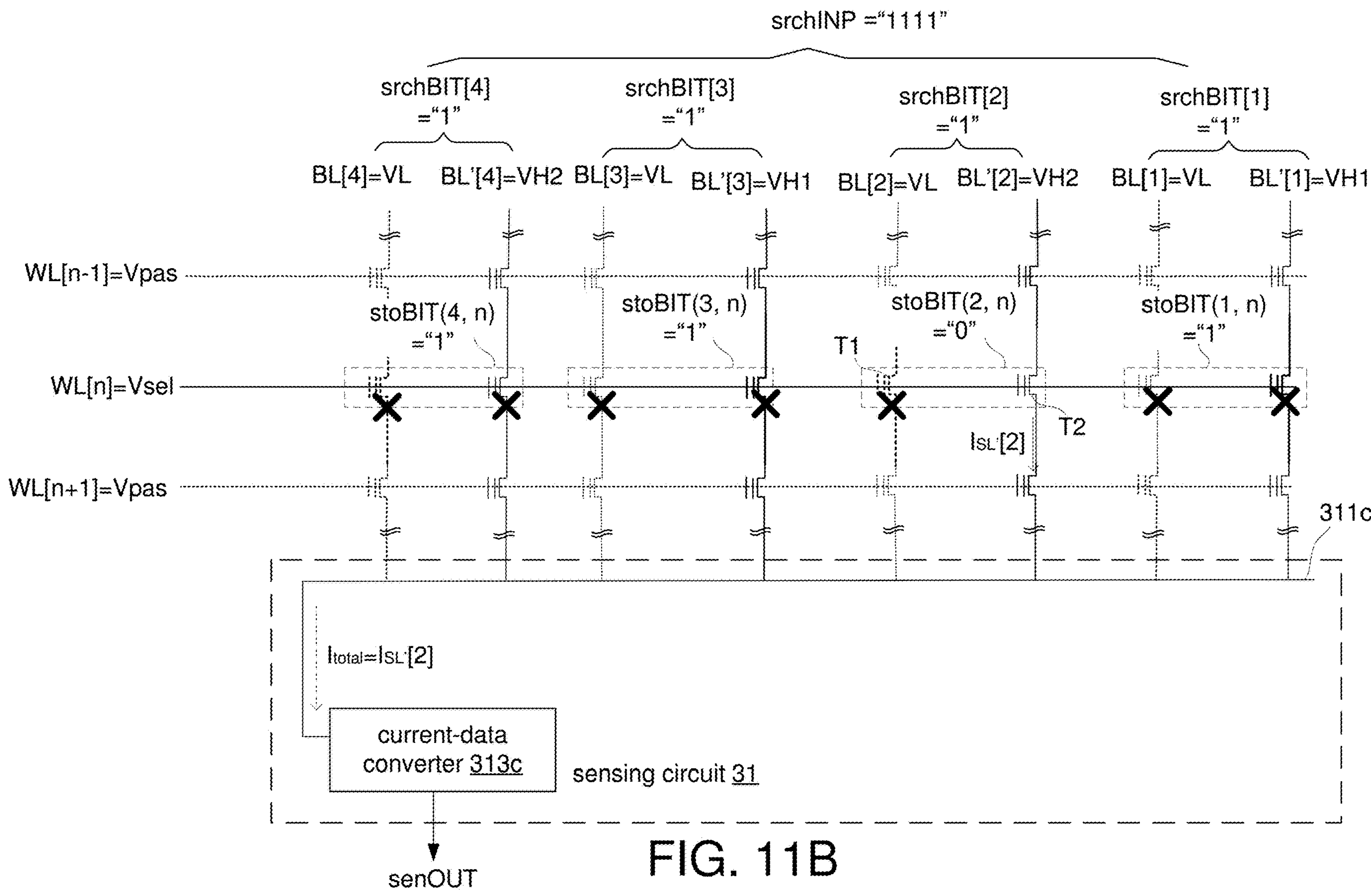

FIGS. 11A and 11B are schematic diagrams illustrating that different high search voltages VH=VH1 and VH=VH2 are assigned to the first/second bit-lines at different bit-positions. As shown in FIGS. 11A and 11B, the search input srchINP [n] in both drawings have a single bit different from the in-memory data stoDAT[n], but the bit-positions of the bit being different from the in-memory data stoDAT[n] are not the same.

In FIGS. 11A and 11B, it is assumed that two sets of voltage values are assigned to the high search voltage VH. The high search voltages VH of the first/second bit-lines BL[2], BL'[2], BL[4], BL'[4] at even bit-positions (m=2 or 4) are assigned with a relatively higher voltage value (VH=VH2), in comparison with the voltage values (VH=VH1) assigned to the high search voltages VH of the first/second bit-lines BL[1], BL'[1], BL[3], BL'[3] at odd bit-positions (m=1 or 3). That is, VH2>VH1. The combinations of the first bit-lines BL[1]~BL[4] and second bit-lines BL'[1]~BL'[4] in FIGS. 11A and 11B are set to represent the search bits srchBIT[1]~srchBIT[4] are list in Table 7.

TABLE 7

| VH2 > VH1 > VL | | srchBIT[m] "0" | "1" | "*" | "NA" |
|---|---|---|---|---|---|
| search voltages applied to bit-lines for representing srchBIT[1] | BL[1] | VH1 | VL | VL | VH1 |
| | BL'[1] | VL | VH1 | VL | VH1 |
| search voltages applied to bit-lines for representing srchBIT[2] | BL[2] | VH2 | VL | VL | VH2 |
| | BL'[2] | VL | VH2 | VL | VH2 |
| search voltages applied to bit-lines for representing srchBIT[3] | BL[3] | VH1 | VL | VL | VH1 |
| | BL'[3] | VL | VH1 | VL | VH1 |
| search voltages applied to bit-lines for representing srchBIT[4] | BL[4] | VH2 | VL | VL | VH2 |
| | BL'[4] | VL | VH2 | VL | VH2 |

In both FIGS. 11A and 11B, it is assumed that the in-memory data stoDAT[n] is "1101b". The search input srchINP is "1100b" in FIG. 11A (srchINP="1100b"), and the search input srchINP is "1111b" in FIG. 11B (srchINP="1111b"). The detailed illustrations about the data match/mismatch comparisons and the generations of the first/second sensing currents are omitted. Table 8 lists the data match/mismatch comparison results in FIGS. 11A and 11B.

TABLE 8

| | FIG. 11A | FIG. 11B |
|---|---|---|
| search input srchINP | "1100b" | "1111b" |
| in-memory data stoDAT[n] | "1101b" | |
| data match/mismatch comparison results between srchBIT[m] and stoBIT[m], m = 1~4 | srchBIT[1] ≠ stoBIT(1, n) srchBIT[2] = stoBIT(2, n) srchBIT[3] = stoBIT(3, n) srchBIT[4] = stoBIT(4, n) | srchBIT[1] = stoBIT(1, n) srchBIT[2] ≠ stoBIT(2, n) srchBIT[3] = stoBIT(3, n) srchBIT[4] = stoBIT(4, n) |
| sensing current $I_{SL}[m]$, $I_{SL'}[m]$, m = 1~4 | only first sensing current $I_{SL}[1]$ at the first bit-position (m = 1) is generated; other sensing currents are not generated | only second sensing current $I_{SL'}[2]$ at the second bit-position (m = 2) is generated; other sensing currents are not generated |
| $I_{total}$ | $I_{total} = I_{SL}[1]$, $I_{SL}[1]$ and VH1 are positively correlated | $I_{total} = I_{SL'}[2]$, $I_{SL'}[2]$ and VH2 are positively correlated |

In short, there is a one-bit difference between the search input srchINP and the in-memory data stoDAT[n] in both FIGS. 11A and 11B. In FIG. 11A, the one-bit difference corresponds to the m=1$^{st}$ bit-position. In FIG. 11B, the one-bit difference corresponds to the m=2$^{nd}$ bit-position.

In FIG. 11A, the LSB (m=1) of the search input srchINP and the LSB (m=1) of the in-memory data stoDAT[n] are different. That is, srchBIT[1]≠stoBIT(1, n). Thus, the first sensing current $I_{SL}[1]$ at the first bit-position (m=1) flows from the first bit-line BL[1] at the first bit-position (m=1) to the current collector 311*a* through the transistor T1 in the memory cell MC(1, n). Accordingly, the total current $I_{total}$ in FIG. 11A is equivalent to the sensing current $I_{SL}[1]$ ($I_{total}=I_{SL}[1]$).

In FIG. 11B, the second LSB (m=2) of the search input srchINP and the second LSB (m=2) of the in-memory data stoDAT[n] are different. That is, srchBIT[2]≠stoBIT(2, n). Thus, the second sensing current $I_{SL'}[2]$ at the second bit-position (m=2) flows from the second bit-line BL'[2] at the second bit-position (m=2) to the current collector 311*c* through the transistor T2 in the memory cell MC(2, n). Accordingly, the total current $I_{total}$ in FIG. 11B is equivalent to the sensing current $I_{SL'}[2]$ ($I_{total}=I_{SL'}[2]$).

Based on the inequality VH2>VH1>VL, it can be concluded that the sensing current $I_{SL'}[2]$ is greater than the sensing current $I_{SL}[1]$. This implies that the total current $I_{total}$ in FIG. 11A is lower than the total current $I_{total}$ in FIG. 11B.

Please refer to FIGS. 11A and 11B together. Although both the bit-lines BL[1], BL'[2] are set to the high search voltage VH, their high search voltages VH are different (VH1, VH2). The high search voltage VH of the bit-line BL[1] is equivalent to VH1 (VH=VH1 in FIG. 11A), and the high search voltage VH of the bit-line BL'[2] is equivalent to VH2 (VH=VH2 in FIG. 11B). With such voltage arrangement, the sensing circuit output senOUT in FIG. 11A is greater than the sensing circuit output senOUT in FIG. 11B. The examples shown in FIGS. 11A and 11B demonstrate that different bit-positions can be assigned with different importances by setting various high search voltages VH to the bit-lines BL[1]~BL[M], BL'[1]~BL'[M] at the bit-positions (1~M).

The selection of the bits corresponding to higher importance is not limited. The number of bits corresponding to higher importance is not limited. In practical applications, the high search voltage values that memory controller 101*a* may assign to the bit-lines can be more than "2". The variations of the practical application are not limited.

FIG. 12 is a schematic diagram illustrating the sensing circuit according to another embodiment of the present disclosure. The sensing circuit 33 includes M first sensing-units SA[1]~SA[M] and M second sensing-units SA'[1]~SA'[M]. Each of the M first sensing-units SA[1]~SA[M] and M second sensing-units SA'[1]~SA'[M] may include a sense amplifier, a latch, a current mirror, and so forth. The internal designs of the M first sensing-units SA[1]~SA[M] and M second sensing-units SA'[1]~SA'[M] are omitted in the specification and not limited to practical applications.

The input terminals of the M first sensing-units SA[1]~SA[M] are respectively electrically connected to the M first source lines SL [1]~SL [M], and the input terminals of the M second sensing-units SA'[1]~SA'[M] are respectively electrically connected to the M second source lines SL'[1]~SL'[M].

The M first sensing-units SA[1]~SA[M] respectively convert the M first sensing current(s) $I_{SL}[1]$~$I_{SL}[M]$ to M first sensing-unit outputs sOUT[1]~sOUT[M], and the M second sensing-units SA'[1]~SA'[M] respectively convert the M second sensing current(s) $I_{SL'}[1]$~$I_{SL'}[M]$ to M second sensing-unit outputs sOUT'[1]~sOUT'[M]. The M first sensing-unit outputs sOUT[1]~sOUT[M], and the M second sensing-unit outputs sOUT'[1]~sOUT'[M] are logic signals.

Each of the M first sensing-unit outputs sOUT[1]~sOUT[M] and the M second sensing-unit outputs sOUT'[1]~sOUT'[M] might be equivalent to logic "1" or logic "0". If the m-th first sensing current $I_{SL}$[m] is generated, the m-th first sensing-unit output sOUT[m] is equivalent to logic "1". Otherwise, the m-th first sensing-unit output sOUT[m] is equivalent to logic "0". If the m-th second sensing current $I_{SL'}$[m] is generated, the m-th second sensing-unit output sOUT'[m] is equivalent to logic "1". Otherwise, the m-th second sensing-unit output sOUT'[m] is equivalent to logic "0".

In general cases, the m-th first sensing current $I_{SL}$[m] and the m-th second sensing current $I_{SL'}$[m] do not generate at the same time. Therefore, either none of the m-th first sensing-unit output sOUT[m] and the m-th second sensing-unit output sOUT'[m] is equivalent to "1", or only one of the m-th first sensing-unit output sOUT[m] and the m-th second sensing-unit output sOUT'[m] is equivalent to "1". In other words, the m-th first sensing-unit output sOUT[m] and the m-th second sensing-unit output sOUT'[m] are complement. Then, the M first sensing-unit outputs sOUT[1]~sOUT[M] and the M second sensing-unit outputs sOUT'[1]~sOUT'[M] are directly/indirectly conducted to the memory controller 101*a*.

FIG. 13 is a schematic diagram illustrating the sensing circuit according to another embodiment of the present disclosure. Please refer to FIGS. 12 and 13 together. In comparison with FIG. 12, the sensing circuit 35 in FIG. 13 further includes a total current counter 351, in addition to the M first sensing-units SA[1]~SA[M] and the M second sensing-units SA'[1]~SA'[M].

After the M first sensing-units SA[1]~SA[M] generate the M first sensing-unit outputs sOUT[1]~sOUT[M] and the M second sensing-units SA'[1]~SA'[M] generate the M second-unit outputs sOUT'[1]~sOUT'[M], the total current counter 351 counts the number of the first sensing-unit outputs sOUT[1]~sOUT[M] and the second sensing-unit outputs sOUT'[1]~sOUT'[M] which are equivalent to "1". As the counted result of the total current counter 351 represents how many of the first sensing currents $I_{SL}$[1]~$I_{SL}$[M] and the second sensing currents $I_{SL'}$[1]~$I_{SL'}$[M] are generated, it is defined as a total current count.

If each of the M search bits srchBIT[1]~srchBIT[M] is identical to each of the M in-memory bits stoBIT[1]~stoBIT[M], none of the first/second sensing currents $I_{SL}$[1]~$I_{SL}$[M], $I_{SL'}$[1]~$I_{SL'}$[M] will generate. Then, all of the first sensing-unit outputs sOUT[1]~sOUT[M] and the second sensing-unit outputs sOUT'[1]~sOUT'[M] are equivalent to "0", and the total current count is equivalent to "0".

If an m-th search bit srchBIT[m] is different from the m-th in-memory bit stoBIT[m], either the m-th first sensing current ISL[m] or the m-th second sensing current ISL'[m] will generate. Thus, one of the m-th first sensing-unit output sOUT[m] and the m-th second sensing-unit output sOUT'[m] is equivalent to "1", and the total current count counts up for the result of the m-th bit data match/mismatch comparison.

Accordingly, if all the 1~M search bits srchBIT[1]~srchBIT[M] are different from the 1~M in-memory bits stoBIT[1]~stoBIT[M], the total current count will be equivalent to "M". Therefore, the total current count is between 0~M. In FIG. 13, the total current count is utilized as the sensing circuit output senOUT to represent the number of bits different in the search input srchINP and the in-memory data inDAT[n]. Through the total current count, the memory controller 101*a* could efficiently learn about the data match/mismatch comparison results.

FIGS. 14 and 15 are schematic diagrams illustrating scenarios when the parallel data match/mismatch comparison is performed. Some of the components utilized in the sensing circuits 37, 39 in FIGS. 14 and 15 are similar, and these components are introduced first. Please refer to FIGS. 14 and 15 together.

In FIGS. 14 and 15, the M bits memory cells MC(1, n)~MC(M, n) are divided into P memory partitions, and each of the P memory partitions corresponds to Q bit-positions. That is, M=P*Q. For example, P=1024, Q=8 bits, and M=8K bits. The variable "M" can be a great number, and M can represent a page size, for example, 32 kbits, 64 kbits, or 128 kbits. In practical applications, the values of P and Q are not limited. Then, the memory array 103 can be considered to include P memory partitions memGP[1]~memGP[P].

For example, the p=1$^{st}$ memory partition memGP[1] includes memory cells MC(1, 1)~MC(8, N), and the p=P=1024-th memory partition memGP[P] includes memory cells MC(8K−7, 1)~MC(8K, N). Each of the P memory partitions corresponds to Q=8 bit-positions among the M=8K bit-positions. The p-th memory partition memGP[p] includes memory cells MC(Q*(p−1)+1, 1)~MC(Q*p, N). The variables P and p are positive integers, and the variable "p" is smaller than or equivalent to the variable "P".

In FIGS. 14 and 15, the in-memory data inDAT[n] is divided into P in-memory data partitions stoDAT_PTN[1]~stoDAT_PTN[P], and each of the P in-memory data partitions stoDAT_PTN[1]~stoDAT_PTN[P] represents an identical partitioned in-memory value. The P in-memory data partitions stoDAT_PTN[1]~stoDAT_PTN[P] are respectively stored at the memory cells located at the n-th row of the P memory partitions.

For example, based on the assumption that P=1024, Q=8 bits, and M=8K bits, the p=1$^{st}$ in-memory data partition stoDAT_PTN[1] stored at the memory cells MC(1, n)~MC(8, n) represents a partitioned in-memory value with 8-bit-length (for example, "11001010"). Moreover, the p-th in-memory data partition stoDAT_PTN[p] stored at the memory cells MC((p−1)*8+1, n)~MC(p*8, n) represents the same partitioned in-memory value "11001010".

In practical applications, the lengths and bit-format of the partitioned in-memory value are not limited. For example, the partitioned in-memory value may include one or more don't care ("X") bits. Or, Q is set to be 16 bits (Q=16).

In FIGS. 14 and 15, the search input srchINP is divided into P partitioned search inputs (srchPTN_1~srchPTN_P, or srchDAT_cp[1]~srchDAT_cp[P]), and each of the P partitioned search inputs corresponds to Q bit-positions. M=P*Q. In both FIGS. 14 and 15, P sets of data match/mismatch comparison are simultaneously performed in parallel.

In FIG. 14, the P partitioned search values, respectively corresponding to the P partitioned search inputs in FIG. 14 are also represented as srchPTN_1~srchPTN_P. The partitioned search values represented by the P partitioned search inputs srchPTN_1~srchPTN_P are different. That is, srchPTN_1 #srchPTN_2≠ . . . ≠srchPTN_P.

Assuming that a reference figure refFIG is provided, and each of the P in-memory data partitions stoDAT_PTN[1]~stoDAT_PTN[P] represents a copy of the reference figure refFIG_cp[1]~refFIG_cp[P]. Moreover, the P partitioned search inputs srchPTN_1~srchPTN_P represent P candidate figures canFIG[1]~canFIG[P]. The comparisons between the P candidate figures canFIG[1]~canFIG[P] and the P copies refFIG_cp[1]~refFIG_cp[P] of the reference figure refFIG can be performed at the same time with an IMS operation. That is, every Q of the first sensing-units SA[1]~SA[M] and every Q of the second sensing-units SA'[1]

~SA'[M] are utilized to compare a candidate figure canFIG [p] with a copy refFIG_cp[p] of the reference figure refFIG. Then, based on the P sets of comparison results, one of the P candidate figures canFIG[1]~canFIG[P] is selected as the sensing circuit output senOUT.

In FIG. 15, the P partitioned search values respectively corresponding to the P partitioned search inputs in FIG. 15 are represented as srchDAT_cp[1]~srchDAT_cp[P]. The partitioned search values represented by the P partitioned search inputs are identical. That is, srchDAT_cp[1]=srchDAT_cp[2]= . . . =srchDAT_cp[P]. In FIG. 15, P sets of comparisons are performed by a single IMS operation. That is, the P partitioned in-memory values are respectively compared with the P partitioned search inputs srchDAT_cp [1]~srchDAT_cp[P] simultaneously. Theoretically speaking, the P sets of comparisons are expected to generate the same results as the P partitioned in-memory values are identical to each other, and the P partitioned search inputs srchDAT_cp [1]~srchDAT_cp[P] are identical to each other. FIG. 15 is utilized to confirm the comparison results and designed for repeated confirmation effect. With FIG. 15, the P sets comparison results are cross-compared, and the chance of generating incorrect comparison results can be prevented dramatically.

In FIGS. 14 and 15, the sensing circuits 37, 39 include M first sensing-units SA[1]~SA[M], M second sensing-units SA'[1]~SA'[M], and P group current counters gcCNT[1] ~gcCNT[P]. Each of the group current counters gcCNT[1] ~gcCNT[P] is electrically connected to Q of the M first sensing-units SA[1]~SA[M] and Q of the M second sensing-units SA'[1]~SA'[M]. For example, the group current counter gcCNT[1] is electrically connected to the first sensing-units SA[1]~SA[Q] and second sensing-units SA'[1]~SA' [Q], the group current counter gcCNT[P] is electrically connected to the first sensing-units SA[M−Q+1]~SA[M] and second sensing-units SA'[M−Q+1]~SA'[M], and so forth. Then, each of the P group current counters gcCNT[1] ~gcCNT[P] outputs a group current counting result contRLT [1]~ccntRLT[P].

As illustrated above, the partitioned search values represented by the P partitioned search inputs srchPTN_1~srchPTN_P in FIG. 14 are different from each other, and those in FIG. 15 are identical to each other. Due to this fundamental difference, the sensing circuits 37, 38 process and analyze the group current counting results contRLT[1]~ccntRLT[P] differently.

In FIG. 14, the sensing circuit 37 further includes a current result comparator critCMP for comparing the P group current counting results ccntRLT[1]~ccntRLT[P]. Then, one of the partitioned search inputs srchPTN_1~srchPTN_P is selected based on the comparisons between the group current counting results contRLT [1]~contRLT[P].

For example, the current result comparator critCMP may select one of the P partitioned search inputs srchPTN_1~srchPTN_P whose group current counting result contRLT[1]~contRLT[P] is the smallest. The memory controller 101*a* knows that the partitioned search input srchPTN_p corresponding to the smallest group current counting result contRLT[p] is the one that is like the in-memory data partition stoDAT_PTN[p] the most. Alternatively speaking, the candidate figure canFIG[p] represented by the partitioned search input srchPTN_p is the one most similar to the reference figure refFIG.

For another example, the current result comparator critCMP may select one of the P partitioned search inputs srchPTN_1~srchPTN_P whose corresponding group current counting result contRLT[1]~contRLT[P] is the greatest. The memory controller 101*a* knows that the partitioned search input srchPTN_p corresponding to the greatest group current counting result ccntRLT[p] is the one that is unlike the in-memory data partition stoDAT_PTN[p] the most. Alternatively speaking, the candidate figure canFIG[p] represented by the partitioned search input srchPTN_p is the one most distinguished from the reference figure refFIG.

In FIG. 15, the sensing circuit 39 further includes an output analysis circuit 391. The output analysis circuit 391 further includes (Q+1) counting result accumulators crACCUM[1]~crACCUM[Q+1] and a counting value comparator cvCMP. Each of the (Q+1) counting result accumulators crACCUM[1]~crACCUM[Q+1] is electrically connected to the P group current counters gcCNT[1]~gcCNT[P] and the counting value comparator cvCMP. The counting value comparator cvCMP is electrically connected to the memory controller 101*a*.

Each of the Q counting result accumulators crACCUM [1]~crACCUM[Q+1] represents a counted value between 0~Q and each of the Q counting result accumulators crACCUM[1]~crACCUM[Q+1] generates an accumulated value accVAL[1]~accVAL[Q+1]. The accumulated values accVAL[1]~accVAL[Q+1] are initialized with "0", and the accumulated values accVAL[1]~accVAL[Q+1] are counted up if any of the group current counting results ccntRLT[1] ~contRLT[P] is equivalent to the counted value corresponding to the counting result accumulator crACCUM[1]~crACCUM[Q+1].

For example, assuming that the counting result accumulator crACCUM[1] corresponds to the counted value "0", then the counting result accumulator crACCUM[1] adds the accumulated value accVAL[1] with "1" if any of the group current counting results contRLT[1]~contRLT[P] is equivalent to 0. For another example, assuming that the counting result accumulator crACCUM[Q+1] corresponds to the counted value "Q", then the counting result accumulator crACCUM[Q+1] adds the accumulated value accVAL[Q+1] with "1" any of the group current counting results contRLT [1]~contRLT[P] is equivalent to Q.

As each of the group current counter gcCNT[P] corresponds to one and only one group current counting result contRLT[p], each of the accumulated values accVAL[1] ~accVAL[Q+1] might range between 0 and P. Besides, the summation of the accumulated values accVAL[1]~accVAL [Q+1] is equivalent to P.

The counting value comparator cvCMP respectively receives the accumulated values accVAL[1]~accVAL[Q+1] from the counting result accumulators crACCUM[1]~crACCUM[Q+1]. Then, the counting value comparator cvCMP compares the accumulated values accVAL[1]~accVAL[Q+1] to select the counting result accumulator crACCUM[sel] with the maximum accumulated value accVAL[sel] (sel is between 1~(Q+1)). The group current counting result contRLT[sel] corresponding to the counting result accumulator crACCUM[sel] is then considered as the standardized group current counting result ccntRLT[sel] representing the data match/mismatch comparison result between the partitioned in-memory value and the partitioned search input.

In short, the data match/mismatch between the partitioned in-memory value and the partitioned search input is repetitively performed for P times in a parallel manner. Although the comparisons between the partitioned in-memory value and the partitioned search input need only Q bits, the practical comparison is multiplied, and the memory cells used for data match/mismatch comparison are augmented.

The output analysis circuit 391 utilizes the counting result accumulators crACCUM[1]~crACCUM[Q+1] and the counting value comparator cvCMP to provide a voting scheme to confirm the correctness of the data match/mismatch result. In practical applications, the output analysis circuit 391 might set a threshold value and use the threshold value to identify the data match/mismatch comparison result. Details about these variations of circuit implementations are omitted.

In some applications, the digital outputs of the first sensing-units SA[1]~SA[M] and the second sensing-units SA'[1]~SA'[M] can be combined with logic gates. FIGS. 16~17 are examples showing that the sensing circuit adopts some logic gates to transform the digital outputs of the first sensing-units SA[1]~SA[M] and the second sensing-units SA'[1]~SA'[M]. The adoption of the logic gates can ease the operation loading of the memory controller 101*a*.

FIGS. 16A and 16B are schematic diagrams illustrating the sensing circuits according to still another embodiment of the present disclosure that includes M first sensing-units SA[1]~SA[M], M second sensing-units SA'[1]~SA'[M], and M logic gates (OR logic gates OR[1]~OR[M], NOR logic gates NOR[1]~NOR[M]) for converting the selectively generated M first sensing currents $I_{SL}$[1]~$I_{SL}$[M] and/or the selectively generated M second sensing currents $I_{SL'}$[1]~$I_{SL'}$[M] to the comparison result data cpRlt_DAT. In FIGS. 16A and 16B, the output terminal of the m-th first sensing-unit SA[m] and the output terminal of the m-th second sensing-unit SA'[m] are electrically connected to the input terminals of the m-th logic gate (OR logic gate OR[m] in FIG. 16A, NOR logic gate NOR[m] in FIG. 16B).

In FIG. 16A, if one of the m-th first sensing current $I_{SL}$[m] and the m-th second sensing current $I_{SL'}$[m] is generated, one of the m-th first sensing-unit SA[m] and the m-th second sensing-unit SA'[m] will output a logic "1", which results in the m-th OR logic gate OR[m] to output logic "1" as the m-th logic gate output gOUT[m]. On the other hand, if none of the m-th first sensing current $I_{SL}$[m] and the m-th second sensing current $I_{SL'}$[m] is generated, both the m-th first sensing-unit SA[m] and the m-th second sensing-unit SA'[m] output a logic "0", which results in the OR logic gate OR[m] to output logic "0" as the m-th logic gate output gOUT[m].

Thus, the m-th logic gate output gOUT[m] of the m-th OR logic gate OR[m] is set to logic "1" to represent that the m-th in-memory bit stoBIT[m] is inequivalent to the m-th search bit srchBIT[m]. Or, the m-th logic gate output gOUT[m] of the m-th OR logic gate OR[m] is set to logic "0" to represent that the m-th in-memory bit stoBIT[m] is equivalent to the m-th search bit srchBIT[m].

In FIG. 16B, if one of the m-th first sensing current $I_{SL}$[m] and the m-th second sensing current $I_{SL'}$[m] is generated, one of the m-th first sensing-unit SA[m] and the m-th second sensing-unit SA'[m] will output a logic "1", which results in the NOR logic gate OR[m] to output logic "0" as the m-th logic gate output gOUT[m]. On the other hand, if none of the m-th first sensing current $I_{SL}$[m] and the m-th second sensing current $I_{SL'}$[m] is generated, both the m-th first sensing-unit SA[m] and the m-th second sensing-unit SA'[m] output a logic "0", which results in the m-th NOR logic gate OR[m] to output logic "1" as the m-th logic gate output gOUT[m].

Thus, the m-th logic gate output gOUT[m] of the m-th NOR logic gate NOR[m] is set to logic "0" to represent that the m-th in-memory bit stoBIT[m] is inequivalent to the m-th search bit srchBIT[m]. Or, the m-th logic gate output gOUT[m] of the m-th NOR logic gate NOR[m] is set to logic "1" to represent that the m-th in-memory bit stoBIT[m] is equivalent to the m-th search bit srchBIT[m].

In Table 9, the logic relationships described in FIGS. 16A and 16B are summarized.

TABLE 9

| | | FIG. 16A | FIG. 16B |
|---|---|---|---|
| srchBIT[m] = inBIT(m, n), | $I_{SL}$[m], $I_{SL'}$[m] | m-th first sensing current $I_{SL}$[m] is not generated | m-th second sensing current $I_{SL'}$[m] is not generated |
| | SA[m], SA'[m] | m-th first sensing-unit SA[m] outputs logic "0" | m-th second sensing-unit SA'[m] outputs logic "0" |
| | gOUT[m] of m-th logic gate | m-th OR logic gate OR[m] outputs logic "0" | m-th NOR logic gate NOR[m] outputs logic "1" |
| srchBIT[m] ≠ inBIT(m, n) | $I_{SL}$[m], $I_{SL'}$[m] | one of m-th first sensing current $I_{SL}$[m] and m-th second sensing current $I_{SL'}$[m] is generated | |
| | SA[m], SA'[m] | One of m-th first sensing-unit SA[m] and m-th second sensing-unit SA'[m] outputs logic "0", and the other of m-th first sensing-unit SA[m] and m-th second sensing-unit SA'[m] outputs logic "1". | |
| | gOUT[m] of m-th logic gate | m-th OR logic gate OR[m] outputs logic "1" | m-th NOR logic gate NOR[m] outputs logic "0" |

In FIGS. 10-16, different implementations of the sensing circuits are shown. These sensing circuits may or may not be appropriate for FIGS. 6A~6C and FIGS. 7A~7C. The outputs of the sensing circuits in FIGS. 10-16 are summarized in Table 10. As the bit-positions of the exemplary search input and the in-memory data in FIGS. 6A~6C and 7A~7C are not specified with various importance, the sensing circuits in FIGS. 11A, 11B, and 15 are 10 inappropriate for FIGS. 6 and 7. As the bit-positions of the exemplary search input and the in-memory data in FIGS. 6A~6C and 7A~7C are not separated into groups, the sensing circuits in FIGS. 14 and 15 are not appropriate to be applied to FIGS. 6 and 7 either.

TABLE 10

| sensing circuit outputs senOUT | | example of data match/mismatch comparison | | | | | |
|---|---|---|---|---|---|---|---|
| | | FIG. 6A | FIG. 6B | FIG. 6C | FIG. 7A | FIG. 7B | FIG. 7C |
| search input srchINP = srchBIT[1]~srchBIT[6] | | "100110b" | "100110b" | "110***b" | "110001b" | "100001b" | "110***b" |
| in-memory data stoDAT[n] = stoBIT[1]~stoBIT[6] | | "110001b" | "110***b" | "100110b" | "110001b" | "110***b" | "100001b" |
| sensing circuit output senOUT | FIG. 10 | 4 | 1 | 1 | 0 | 0 | 0 |
| | FIGS. 11A and 11B | Not applicable | | | | | |
| | FIG. 12 | 001000010110 | 001000000000 | 000100000000 | 000000000000 | 000000000000 | 000000000000 |
| | FIG. 13 | 4 | 1 | 1 | 0 | 0 | 0 |
| | FIGS. 14 and 15 | not applicable | | | | | |
| | FIG. 16A | 010111 | 010000 | 010000 | 000000 | 000000 | 000000 |
| | FIG. 16B | 101000 | 101111 | 101111 | 111111 | 111111 | 111111 |
| | FIG. 17 | Not applicable | | | | | |

FIG. 17 is a schematic diagram illustrating the sensing circuits according to still another embodiment of the present disclosure. Please refer to FIGS. 16A and 17 together. In comparison with the sensing circuit 51 in FIG. 16A, the sensing circuit 53 further includes M gain units GU[1]~GU[M] and an adder 811. The M gain units GU[1]~GU[M] respectively correspond to the M OR logic gates OR[1]~OR[M], and the M gain units GU[1]~GU[M] are utilized to respectively adjust the importance of the M bit-positions.

The input terminals of the M gain units GU[1]~GU[M] are respectively electrically connected to the output terminals of the OR logic gates OR[1]~OR[M], and the output terminals of the M gain units GU[1]~GU[M] are electrically connected to the input terminals of the adder 811. The gain units GU[1]~GU[M] can be, for example, digital multipliers.

Each of the M gain units GU[1]~GU[M] provides a gain value W[1]~W[M], and the gain values W[1]~W[M] can be freely set by the memory controller 101*a*. The gain units GU[1]~GU[M] respectively multiply the logic gate outputs gOUT[1]~gOUT[M] with the gain values W[1]~W[M] to generate M weighted outputs wOUT[1]~wOUT[M].

For example, the m-th weighted output wOUT[m] is equivalent to the product of the m-th logic gate output gOUT[m] and the m-th gain value W[m]. That is, wOUT[m]=gOUT[m]*W[m]. Accordingly, M weighted outputs wOUT[1]~wOUT[M] are respectively generated by the gain units GU[1]~GU[M]. After receiving the M weighted outputs wOUT[1]~wOUT[M], the adder M 81 sums up the weighted outputs wOUT[1]~wOUT[M]. In FIG. 17, the sensing circuit output senOUT represents the summation of the M weighted outputs WOUT[1]~wOUT[M].

In FIG. 17, settings of the M gain values W[1]~W[M] represent the importance of the M bit-positions. The greater the gain value W[m] is, the more important the m-th bit-position is. The number of gain values W[1]~W[M] provided in the sensing circuit is not limited in practical applications. In other words, not all M bit-positions may have a corresponding gain unit GU[1]~GU[M].

Please note that the design of the logic circuits adopted in the sensing circuit is not limited. For example, placing the M gain units GU[1]~GU[M] and the adder 811 suits the sensing circuit 53 in FIG. 16B as well.

Please refer to FIGS. 11A, 11B, and 17 together. Gain values in FIGS. 11A and 11B are adjusted by assigning different high search voltage values to the M first bit-lines BL[1]~BL[M] and the M second bit-lines BL'[1]~BL'[m]. Considering the precisions of the various search voltage values, the number of gain values is relatively limited in FIGS. 11A and 11B, compared with the digital multipliers adopted in FIG. 17.

FIGS. 10-17 are exemplary designs of the sensing circuits that can be adopted for determining whether the first sensing currents $I_{SL}[1]$~$I_{SL}[M]$ and the second sensing currents $I_{SL'}[1]$~$I_{SL'}[M]$ are generated, and the amount of the generated first sensing currents $I_{SL}[1]$~$I_{SL}[M]$ and the generated second sensing currents $I_{SL'}[1]$~$I_{SL'}[M]$. In practical applications, the implementation of the sensing circuit may vary.

The M memory cells MC(1, n)~MC(M, n) located at the n-th row jointly store the in-memory data stoDAT[n]. The in-memory data stoDAT[n] includes M in-memory bits stoBIT(1, n)~stoBIT(M, n). The data match/mismatch comparison procedure regarding whether the in-memory data stoDAT[n] is equivalent to the search data srchDAT[m] is shown in FIG. 18.

FIG. 18 is a flow diagram illustrating the operation method performed on the memory device according to the embodiment of the present disclosure. It is assumed that the threshold voltages of the transistors T1, T2 of the memory cells MC(1, n)~MC(M, n) have been programmed according to the in-memory data stoDAT[n] before the flow in FIG. 18 proceeds.

Through the word line decoder 101*e*, the memory controller 101*a* applies the select voltage Vsel to the n-th word line WL[n] and applies the pass-through voltage Vpas to the 1st~(n−1)-th and (n+1)-th~M-th word lines WL[1]~WL[n−1], WL[n+1]~WL[N] (step S901). The pass-through voltage Vpas is much greater than the select voltage Vsel (Vpas>>Vsel).

The memory controller 101*a* receives the search input srchINP from the host device 11 (step S903). The search input srchINP includes M search bits srchBIT[1]~srchBIT[M]. According to the m-th search bit srchBIT[m], the memory controller 101*a* determines the first search voltage (VH or VL) to be applied to the m-th first-bit-line BL[m] and the second search voltage (VH or VL) to be applied to the m-th second bit-line BL'[m]. Details about how the first/second search voltages (VH or VL) are set according to the m-th search bit srchBIT[m] can be referred to FIGS. 4A~4C.

The comparison between the m-th in-memory bit stoBIT[m] and the m-th search bit srchBIT[m] is performed by identifying whether one of the m-th first sensing current $I_{SL}$[m] and the m-th second sensing current $I_{SL'}$[m] is generated (step S97). If any of the m-th first sensing current $I_{SL}$[m] and the m-th second sensing current $I_{SL'}$[m] is generated, it can be concluded that the m-th in-memory bit stoBIT[m] and the m-th search bit srchBIT[m] are not equivalent. If none of the m-th first sensing current $I_{SL}$[m] and the m-th second sensing current $I_{SL'}$[m] is generated, it can be concluded that the m-th in-memory bit stoBIT[m] and the m-th search bit srchBIT[m] are equivalent.

Step S97 further includes following steps: the m-th first sensing current $I_{SL}$[m] is selectively generated in response to the comparison between the first search voltage (VH or VL) applied to the m-th first bit-line BL[m] and the threshold voltage V_th1 of the transistor T1 (step S971), and the m-th second sensing current $I_{SL'}$[m] is selectively generated in response to the comparison between the second search voltage (VH or VL) applied to the m-th second bit-line BL'[m] and the threshold voltage V_th2 of the transistor T2 (step S973). Steps S971 and S973 are simultaneously performed.

In step S971, the first search voltage (VH or VL) is applied to the m-th first bit-line BL[m] (step S971*a*), and the first search voltage (VH or VL) is compared with the threshold voltage V_th1 of the transistor T1 of memory cell MC(m, n) (step S971*c*). Please refer to Tables 3 and 4 and FIG. 5 for the comparison logic of step S971*c*.

If the first search voltage (VH or VL) applied to the m-th first bit-line BL[m] is greater than or equivalent to the threshold voltage V_th1 of the memory cell MC(m, n) (BL[m]≥V_th1), the first search voltage (VH or VL) drives the m-th first sensing current $I_{SL}$[m] flowing through the transistor T1 of the memory cell MC(m, n), and the m-th first source line SL [m] (step S971*g*). If the m-th first search voltage (VH or VL) applied to the m-th first bit-line BL[m] is lower than the threshold voltage V_th1 of the transistor T1 of the memory cell MC(m, n) (BL[m]<V_th1), the first search voltage (VH or VL) is incapable of driving the m-th first sensing current $I_{SL}$[m] (step S971*e*).

In step S973, the second search voltage (VH or VL) is applied to the m-th second bit-line BL'[m] (step S973*a*), and the second search voltage (VH or VL) is compared with the threshold voltage V_th2 of the transistor T2 of the memory cell MC(m, n) (step S973*c*). Please refer to Tables 3 and 4 and FIG. 5 for the comparison logic of step S973*c*.

If the second search voltage (VH or VL) applied to the m-th first bit-line BL'[m] is greater than or equivalent to the threshold voltage V_th2 of the transistor T2 of the memory cell MC(m, n) (BL'[m]≥V_th2), the second search voltage (VH or VL) drives the m-th second sensing current $I_{SL'}$[m] flowing through the transistor T2 of the memory cell MC(m, n) and the m-th second source line SL'[m] (step S973*g*). If the second search voltage (VH or VL) applied to the m-th second bit-line BL'[m] is lower than the threshold voltage V_th2 of the transistor T2 of the memory cell MC(m, n) (BL'[m]<V_th2), the second search voltage (VH or VL) is incapable of driving the m-th second sensing current $I_{SL'}$[m] (step S973*e*).

For illustration purposes, steps S95 and S97 use the variable "m" to represent the general concept of the data match/mismatch comparison between the m-th search bit srchBIT[m] and the m-th in-memory bit stoBIT(m, n). Please note that steps S95 and S97 are simultaneously performed for all m=1~M bit-positions.

Thus, after step S97 is complete, The sensing circuit 101*g* generates the sensing circuit output senOUT to represent whether and how many of the M first sensing current $I_{SL}$[1]~$I_{SL}$[M] and the M second sensing current $I_{SL'}$[1]~$I_{SL'}$[M] are generated (step S99). The sensing circuit output senOUT is transmitted to the memory controller 101*a* for upper-layer applications.

The TCAM device and the operation method of the present invention could allow data with longer lengths by applying searching voltage on the bit-lines. Therefore, the present invention could be applied to search images with high resolution and float point values with high precision. Moreover, weighting the first/second sensing currents according to the importance of the corresponding bit-position could emphasize the importance of the bit-position in the data match/mismatch comparison.

A novel operation method applied to the memory device having an in-memory-searching (IMS) function is proposed. Instead of gradually performing the data match/mismatch comparison one by one, the IMS procedure can be completed in one read cycle. The page size (M bits) is very large, so the IMS procedure can be proceeded efficiently. The IMS architecture can be used in various fields such as big-data searching/indexing/ranking, range searching, floating point searching, high-resolution graphics searching, and so forth.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory device, comprising:

a memory array, comprising:

M*N memory cells, wherein a memory cell among the M*N memory cells is located at an m-th column and n-th row, and the memory cell comprises a first transistor and a second transistor, wherein M memory cells among the M*N memory cells located at the n-th row are programmed to store an in-memory data comprising M in-memory bits, wherein a threshold voltage of the first transistor and a threshold voltage of the second transistor are programmed according to an m-th in-memory bit among the M in-memory bits;

M first bit-lines, wherein an m-th first bit-line among the M first bit-lines is electrically connected to a first terminal of the first transistor, and a first search voltage is applied to the m-th first bit-line;

M second bit-lines, wherein an m-th second bit-line among the M second bit-lines is electrically connected to a first terminal of the second transistor, and a second search voltage is applied to the m-th second bit-line;

M first source lines, wherein an m-th first source line among the M first source lines is electrically connected to a second terminal of the first transistor, and an m-th first sensing current is selectively generated in response to the first search voltage and the threshold voltage of the first transistor;

M second source lines, wherein an m-th second source line among the M second source lines is electrically connected to a second terminal of the second transistor, and an m-th second sensing current is selectively generated in response to the second search voltage and the threshold voltage of the second transistor; and N word lines, wherein control terminals of the first transistor and the second transistor are electrically connected to an n-th word line among the N word lines, a select voltage is applied to the n-th word line, and a pass-through voltage is applied to other (N−1) word lines among the N word lines; and a control circuit, electrically connected to the memory array through the M first bit-lines, the M second bit-lines, the M first source lines, the M second source lines, and the N word lines, wherein the control circuit comprises:

a sensing circuit, configured to receive the m-th first sensing current through the m-th first source line, receive the m-th second sensing current through the m-th second source line, and generate a sensing circuit output representing whether the m-th first sensing current and the m-th second sensing current are generated; and a memory controller, electrically connected to the memory array, the sensing circuit, and a host device, configured to receive a search input comprising M search bits from the host device, set the first search voltage and the second search voltage according to an m-th search bit among the M search bits, and receive the sensing circuit output, wherein the M memory cells are divided into P memory partitions, and each of the P memory partitions corresponds to Q bit-positions, wherein the in-memory data comprises P in-memory data partitions, the P in-memory data partitions are identical, and each of the P in-memory data partitions is stored at one of the P memory partitions, wherein P, Q, M, N, m, and n are positive integers, m is smaller than or equivalent to M, n is smaller than or equivalent to N, and M is equivalent to a product of P and Q.

2. The memory device according to claim 1, wherein the memory controller determines whether the in-memory data is equivalent to the search input based on the sensing circuit output.

3. The memory device according to claim 1, wherein the memory controller determines that the m-th in-memory bit is inequivalent to the m-th search bit if the sensing circuit output represents that one of the m-th first sensing current and the m-th second sensing current is generated, and the memory controller determines that the m-th in-memory bit is equivalent to the m-th search bit if the sensing circuit output represents that none of the m-th first sensing current and the m-th second sensing current is generated.

4. The memory device according to claim 1, wherein the threshold voltage of the first transistor is programmed to a high threshold voltage, and the threshold voltage of the second transistor is programmed to a low threshold voltage if the m-th in-memory bit represents a binary "0";

the threshold voltage of the first transistor is programmed to the low threshold voltage, and the threshold voltage of the second transistor is programmed to the high threshold voltage if the m-th in-memory bit represents a binary "1";

the threshold voltage of the first transistor is programmed to the high threshold voltage, and the threshold voltage of the second transistor is programmed to the high threshold voltage if the m-th in-memory bit represents a "don't care" bit; and the threshold voltage of the first transistor is programmed to the low threshold voltage, and the threshold voltage of the second transistor is programmed to the low threshold voltage if the m-th in-memory bit represents an "invalid" bit.

5. The memory device according to claim 1, wherein the search input corresponds to a range of search values if a least significant bit (LSB) of the search input is a "wildcard" bit, and the in-memory data corresponds to a range of in-memory values if a least significant bit (LSB) of the in-memory data is a "don't care" bit.

6. The memory device according to claim 1, wherein the first search voltage and the second search voltage are set according to the m-th search bit among the M search bits.

7. The memory device according to claim 6, wherein the first search voltage is a high search voltage, and the second search voltage is a low search voltage if the m-th search bit represents a binary "0";

the first search voltage is the low search voltage, and the second search voltage is the high search voltage if the m-th search bit represents a binary "1";

the first search voltage is the low search voltage, and the second search voltage is the low search voltage if the m-th search bit represents a "wildcard" bit; and the first search voltage is the high search voltage, and the second search voltage is the high search voltage if the m-th search bit represents an "invalid" bit.

8. The memory device according to claim 7, wherein a high threshold voltage is greater than the high search voltage, the high search voltage is greater than a low threshold voltage, and the low threshold voltage is greater than the low search voltage, wherein the threshold voltage of the first transistor is programmed to one of the high threshold voltage and the low threshold voltage according to the m-th in-memory bit and the threshold voltage of the second transistor is programmed to one of the high threshold voltage and the low threshold voltage according to the m-th in-memory bit.

9. The memory device according to claim 1, wherein the sensing circuit comprises:

M first sensing-units, respectively electrically connected to the M first source lines, wherein an m-th first sensing-unit among the M first sensing-units converts the m-th first sensing current to an m-th first sensing-unit output; and M second sensing-units, respectively electrically connected to the M second source lines, wherein an m-th second sensing-unit among the M second sensing-units converts the m-th second sensing current to an m-th second sensing-unit output, wherein the m-th first sensing-unit output and the m-th second sensing-unit output are logic signals.

10. The memory device according to claim 9, wherein the sensing circuit further comprises:

a total current counter, electrically connected to the M first sensing-units and the M second sensing-units, configured to generate the sensing circuit output based on the m-th first sensing-unit output and the m-th second sensing-unit output, wherein the sensing circuit output represents a number between 0 and M.

11. The memory device according to claim 9, wherein the search input comprises P partitioned search inputs, and a p-th partitioned search input among the P partitioned search inputs is compared with Q in-memory bits among the M in-memory bits, wherein p, P, and Q are positive integers, and M is equivalent to a product of P and Q.

12. The memory device according to claim 11, wherein the sensing circuit further comprises:

P group current counters, configured to generate P group current counting results, wherein each of the P group current counting results represents a number between 0 and Q, wherein a p-th group current counter among the P group current counters is electrically connected to Q memory cells among the M memory cells where the Q in-memory bits are stored.

13. The memory device according to claim 11, wherein the P partitioned search inputs are different from each other or the P partitioned search inputs are identical to each other.

14. The memory device according to claim 9, wherein the sensing circuit further comprises:

M logic gates, wherein an m-th logic gate among the M logic gates is electrically connected to the m-th first sensing-unit and the m-th second sensing-unit, and the m-th logic gate generates an m-th logic gate output based on the m-th first sensing-unit output and the m-th second sensing-unit output.

15. The memory device according to claim 14, wherein the sensing circuit further comprises:

at least one gain unit, electrically connected to at least one of the M logic gates, configured to provide at least one gain value to multiply with a logic gate output of the at least one of the M logic gates.

16. The memory device according to claim 1, wherein a third search voltage is applied to a k-th first bit-line among the M first bit-lines and a fourth search voltage is applied to a k-th second bit-line among the M second bit-lines, wherein the first search voltage is equivalent to one of a first high search voltage and a low search voltage, the second search voltage is equivalent to one of the first high search voltage and the low search voltage, the third search voltage is equivalent to one of a second high search voltage and the low search voltage, and the fourth search voltage is equivalent to one of the second high search voltage and the low search voltage, wherein k is a positive integer, k is different from m, and k is smaller than or equivalent to M.

17. An operation method applied to a memory device comprising a memory array and a control circuit, wherein the memory array comprises M*N memory cells, wherein the memory array is electrically connected to the control circuit through M first bit-lines, M second bit-lines, M first source lines, M second source lines, and N word lines, and a memory cell among the M*N memory cells comprises a first transistor and a second transistor, wherein the operation method comprises steps of:

the control circuit programming M memory cells among the M*N memory cells, located at the n-th row, to store an in-memory data, wherein the in-memory data comprises M in-memory bits, and a threshold voltage of the first transistor and a threshold voltage of the second transistor are programmed according to an m-th in-memory bit among the M in-memory bits;

receiving, by the control circuit, a search input comprising M search bits from a host device;

the control circuit setting a first search voltage and a second search voltage according to an m-th search bit among the M search bits;

applying a select voltage to an n-th word line among the N word lines, wherein control terminals of the first transistor and a second transistor are electrically connected to the n-th word line;

applying a pass-through voltage to other (N−1) word lines among the N word lines;

applying the first search voltage to an m-th first bit-line, wherein an m-th first sensing current is selectively generated in response to the first search voltage and the threshold voltage of the first transistor;

applying the second search voltage to an m-th second bit-line, wherein an m-th second sensing current is selectively generated in response to the second search voltage and the threshold voltage of the second transistor;

receiving the m-th first sensing current through an m-th first source line;

receiving the m-th second sensing current through an m-th second source line;

generating a sensing circuit output based on the m-th first sensing current and the m-th second sensing current; and the control circuit receiving the sensing circuit output, wherein the M memory cells are divided into P memory partitions, the P in-memory data partitions are identical, and each of the P memory partitions corresponds to Q bit-positions, wherein the in-memory data comprises P in-memory data partitions, and each of the P in-memory data partitions is stored at one of the P memory partitions, wherein P, Q, M, N, m, and n are positive integers, m is smaller than or equivalent to M, n is smaller than or equivalent to N, and M is equivalent to a product of P and Q.

18. A memory device, comprising:

a memory array, comprising:

M*N memory cells, wherein a memory cell among the M*N memory cells is located at an m-th column and n-th row, and the memory cell comprises a first transistor and a second transistor;

M first bit-lines, wherein an m-th first bit-line among the M first bit-lines is electrically connected to a first terminal of the first transistor, and a first search voltage is applied to the m-th first bit-line;

M second bit-lines, wherein an m-th second bit-line among the M second bit-lines is electrically connected to a first terminal of the second transistor, and a second search voltage is applied to the m-th second bit-line;

M first source lines, wherein an m-th first source line among the M first source lines is electrically connected to a second terminal of the first transistor, and an m-th first sensing current is selectively generated in response to the first search voltage and a threshold voltage of the first transistor;

M second source lines, wherein an m-th second source line among the M second source lines is electrically connected to a second terminal of the second transistor, and an m-th second sensing current is selectively generated in response to the second search voltage and a threshold voltage of the second transistor, wherein M memory cells among the M*N memory cells located at the n-th row are programmed to store an in-memory data, and the in-memory data comprises M in-memory bits, wherein the threshold voltage of the first transistor and the threshold voltage of the second transistor are programmed according to an m-th in-memory bit among the M in-memory bits; and N word lines, wherein control terminals of the first transistor and the second transistor are electrically connected to an n-th word line among the N word lines, a select voltage is applied to the n-th word line, and a pass-through voltage is applied to other (N−1) word lines among the N word lines; and a control circuit, electrically connected to the memory array through the M first bit-lines, the M second bit-lines, the M first source lines, the M second source lines, and the N word lines, wherein the control circuit comprises:

a sensing circuit, configured to receive the m-th first sensing current through the m-th first source line, receive the m-th second sensing current through the m-th second source line, and generate a sensing circuit output representing whether the m-th first sensing current and the m-th second sensing current are generated, wherein the sensing circuit comprises:

M first sensing-units, respectively electrically connected to the M first source lines, wherein an m-th first sensing-unit among the M first sensing-units converts the m-th first sensing current to an m-th first sensing-unit output;

M second sensing-units, respectively electrically connected to the M second source lines, wherein an m-th second sensing-unit among the M second sensing-units converts the m-th second sensing current to an m-th second sensing-unit output, wherein the m-th first sensing-unit output and the m-th second sensing-unit output are logic signals; and a total current counter, electrically connected to the M first sensing-units and the M second sensing-units, configured to generate the sensing circuit output based on the m-th first sensing-unit output and the m-th second sensing-unit output, wherein the sensing circuit output represents a number between 0 and M; and a memory controller, electrically connected to the memory array, the sensing circuit, and a host device, configured to receive a search input comprising M search bits from the host device, set the first search voltage and the second search voltage according to an m-th search bit among the M search bits, and receive the sensing circuit output, wherein M, N, m, and n are positive integers, m is smaller than or equivalent to M, and n is smaller than or equivalent to N.

19. The memory device according to claim 18, wherein the memory controller determines whether the in-memory data is equivalent to the search input based on the sensing circuit output.

20. The memory device according to claim 18, wherein the memory controller determines that the m-th in-memory bit is inequivalent to the m-th search bit if the sensing circuit output represents that one of the m-th first sensing current and the m-th second sensing current is generated, and the memory controller determines that the m-th in-memory bit is equivalent to the m-th search bit if the sensing circuit output represents that none of the m-th first sensing current and the m-th second sensing current is generated.

* * * * *